United States Patent
Hironaga et al.

(10) Patent No.: US 9,589,923 B2
(45) Date of Patent: Mar. 7, 2017

(54) METHOD OF MANUFACTURING SEMICONDUCTOR DEVICE

(71) Applicant: RENESAS ELECTRONICS CORPORATION, Tokyo (JP)

(72) Inventors: Kenya Hironaga, Tokyo (JP); Masatoshi Yasunaga, Tokyo (JP); Tatsuya Hirai, Tokyo (JP); Soshi Kuroda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/841,409

(22) Filed: Aug. 31, 2015

(65) Prior Publication Data

US 2015/0371967 A1 Dec. 24, 2015

Related U.S. Application Data

(63) Continuation of application No. 14/024,896, filed on Sep. 12, 2013, now Pat. No. 9,130,062.

(30) Foreign Application Priority Data

Sep. 13, 2012 (JP) .................................. 2012-201566

(51) Int. Cl.
*H01L 23/48* (2006.01)
*H01L 23/00* (2006.01)
(Continued)

(52) U.S. Cl.
CPC .............. *H01L 24/49* (2013.01); *H01L 21/50* (2013.01); *H01L 23/3107* (2013.01);
(Continued)

(58) Field of Classification Search
CPC ... H01L 24/49; H01L 24/09; H01L 23/49838; H01L 23/3107;
(Continued)

(56) References Cited

U.S. PATENT DOCUMENTS

| 5,346,748 A | 9/1994 | Yokono |
| 6,424,032 B1 | 7/2002 | Ikemoto et al. |
| 2011/0201155 A1* | 8/2011 | Kuroda ............... H01L 21/4853 438/113 |

FOREIGN PATENT DOCUMENTS

| JP | 05-190586 A | 7/1993 |
| JP | 06-089676 A | 3/1994 |

(Continued)

OTHER PUBLICATIONS

Notification of Reasons for Refusal Japanese Patent Application No. 2012-201566 dated Nov. 17, 2015 with full English translation.

(Continued)

*Primary Examiner* — Reema Patel
*Assistant Examiner* — Syed Gheyas
(74) *Attorney, Agent, or Firm* — McDermott Will & Emery LLP

(57) ABSTRACT

Provided is a semiconductor device having improved reliability. In the semiconductor device in an embodiment, a mark is provided correspondingly to the bonding area of a belt-like wiring exposed from an opening provided in a solder resist. As a result, in an alignment step for the wire bonding area, the coordinate position of the wire bonding area can be adjusted using not the end portion of the opening formed in the solder resist, but the mark formed correspondingly to the wire bonding area as a reference. Also, in the semiconductor device in the embodiment, the mark serving as a characteristic pattern is formed. This allows the wire bonding area to be adjusted based on camera recognition.

18 Claims, 55 Drawing Sheets

(51) Int. Cl.
*H01L 21/50* (2006.01)
*H01L 23/31* (2006.01)
*H01L 23/498* (2006.01)

(52) U.S. Cl.
CPC ........ *H01L 23/49838* (2013.01); *H01L 24/09* (2013.01); *H01L 24/85* (2013.01); *H01L 24/45* (2013.01); *H01L 24/73* (2013.01); *H01L 24/78* (2013.01); *H01L 2224/05553* (2013.01); *H01L 2224/32225* (2013.01); *H01L 2224/451* (2013.01); *H01L 2224/45144* (2013.01); *H01L 2224/45147* (2013.01); *H01L 2224/48095* (2013.01); *H01L 2224/48227* (2013.01); *H01L 2224/73265* (2013.01); *H01L 2224/78301* (2013.01); *H01L 2224/83192* (2013.01); *H01L 2224/8512* (2013.01); *H01L 2224/85181* (2013.01); *H01L 2224/92247* (2013.01); *H01L 2924/07802* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01)

(58) Field of Classification Search
CPC . H01L 2224/48227; H01L 2224/73265; H01L 2224/32225
See application file for complete search history.

(56) References Cited

FOREIGN PATENT DOCUMENTS

| | | |
|---|---|---|
| JP | 2001-168223 A | 6/2001 |
| JP | 2004-103720 A | 4/2004 |
| JP | 2006-216725 A | 8/2006 |
| JP | 2007-214217 A | 8/2007 |
| JP | 2007214217 A * | 8/2007 |
| JP | 2007-324496 A | 12/2007 |

OTHER PUBLICATIONS

Non-Final Office Action U.S. Appl. No. 14/024,896 dated Oct. 16, 2014.

Notice of Allowance U.S. Appl. No. 14/024,896 dated Apr. 30, 2015.

\* cited by examiner

X1 ≧ 50μm     Y1 ≧ 25μm
X2 ≧ 50μm     Y2 ≧ 25μm

METHOD OF MANUFACTURING SEMICONDUCTOR DEVICE

CROSS-REFERENCE TO RELATED APPLICATIONS

This Application is a Continuation Application of U.S. Ser. No. 14/024,896 filed Sep. 12, 2013, which claims priority to Japanese Patent Application No. 2012-201566 filed on Sep. 13, 2012. The subject matter of each is incorporated herein by reference in entirety.

BACKGROUND

The present invention relates to a semiconductor device manufacturing technology, and particularly to a technique which is effective when applied to a semiconductor device manufacturing technology including the step of, e.g., coupling a semiconductor chip to a base material with metal wires.

Japanese Unexamined Patent Publication No. 2007-214217 (Patent Document 1) discloses a technique which places a belt-like wiring for applying a power source potential or a reference potential (GND potential) around the semiconductor chip mounting region of a wiring board and forms the belt-like wiring with projecting/depressed shapes. According to the technique, the projecting/depressed shapes used in the belt-like wiring are used for positional recognition during wire bonding.

Japanese Unexamined Patent Publication No. 2001-168223 (Patent Document 2) discloses a technique which provides a power source ring with a projecting portion, while providing a GND ring with a depressed portion, and places the power source ring and the GND ring such that the projecting portion and the depressed portion mesh with each other. According to the technique, by configuring the power source ring and the GND ring as described above, a coupling capacitance is increased to allow a reduction in the influence of switching noise.

Japanese Unexamined Patent Publication No. 2004-103720 (Patent Document 3) discloses a structure in which, e.g., wires to be coupled to a GND ring and a power source ring disposed externally of the GND ring are provided within a wiring board, as shown in FIG. 7 of Patent 3.

RELATED ART DOCUMENTS

Patent Documents

[Patent Document 1]
Japanese Unexamined Patent Publication No. 2007-214217
[Patent Document 2]
Japanese Unexamined Patent Publication No. 2001-168223
[Patent Document 3]
Japanese Unexamined Patent Publication No. 2004-103720

SUMMARY

For example, in a semiconductor device, pads formed in a semiconductor chip mounted over a wiring board are coupled to terminals formed over the wiring board with metal wires. Particularly in terms of stabilizing a power source potential and a reference potential (ground potential or GND potential), in some semiconductor devices, belt-like wirings may be provided over the wiring boards besides the terminals (bonding fingers) mentioned above. That is, a belt-like wiring to which the power source potential and the reference potential are applied may be provided over the wiring board and coupled to the semiconductor chip with the plurality of metal wires to stabilize the power source potential and the reference potential which are supplied to the semiconductor chip.

Normally, a configuration is used in which the belt-like wiring described above is not entirely exposed but the major part thereof is covered with an insulating film called a solder resist, and the metal wires are coupled to the exposed area of the belt-like wiring exposed from the opening provided in the solder resist.

At this time, the accuracy of forming the openings in the solder resist is mostly lower than the accuracy of forming the belt-like wiring, and the openings formed in the solder resist may be displaced from the design positions thereof. The prevent inventors have newly found that, in this case, a situation is encountered in which the exposed area of the belt-like wiring to which the metal wires are coupled is covered with the solder resist to result in the problem that wire bonding cannot be normally performed.

Other problems and novel features of the present invention will become apparent from a statement in the present specification and the accompanying drawings.

According to an embodiment, in planar view, a belt-like wiring is placed over a first main surface of a wiring board along an outer edge of a semiconductor chip, and an insulating film is formed so as to cover a part of the belt-like wiring. In the insulating film, an opening is formed and, from the opening, a first area of the belt-like wiring and a mark area provided correspondingly to the first area are exposed.

Here, the step of coupling the semiconductor chip to the wiring board with a metal wire includes detecting the mark area to specify a position of the first area, and then electrically coupling the metal wire to the first area based on the specified position of the first area.

The embodiment allows an improvement in the reliability of the semiconductor device.

DETAILED DESCRIPTION

Figure 1:
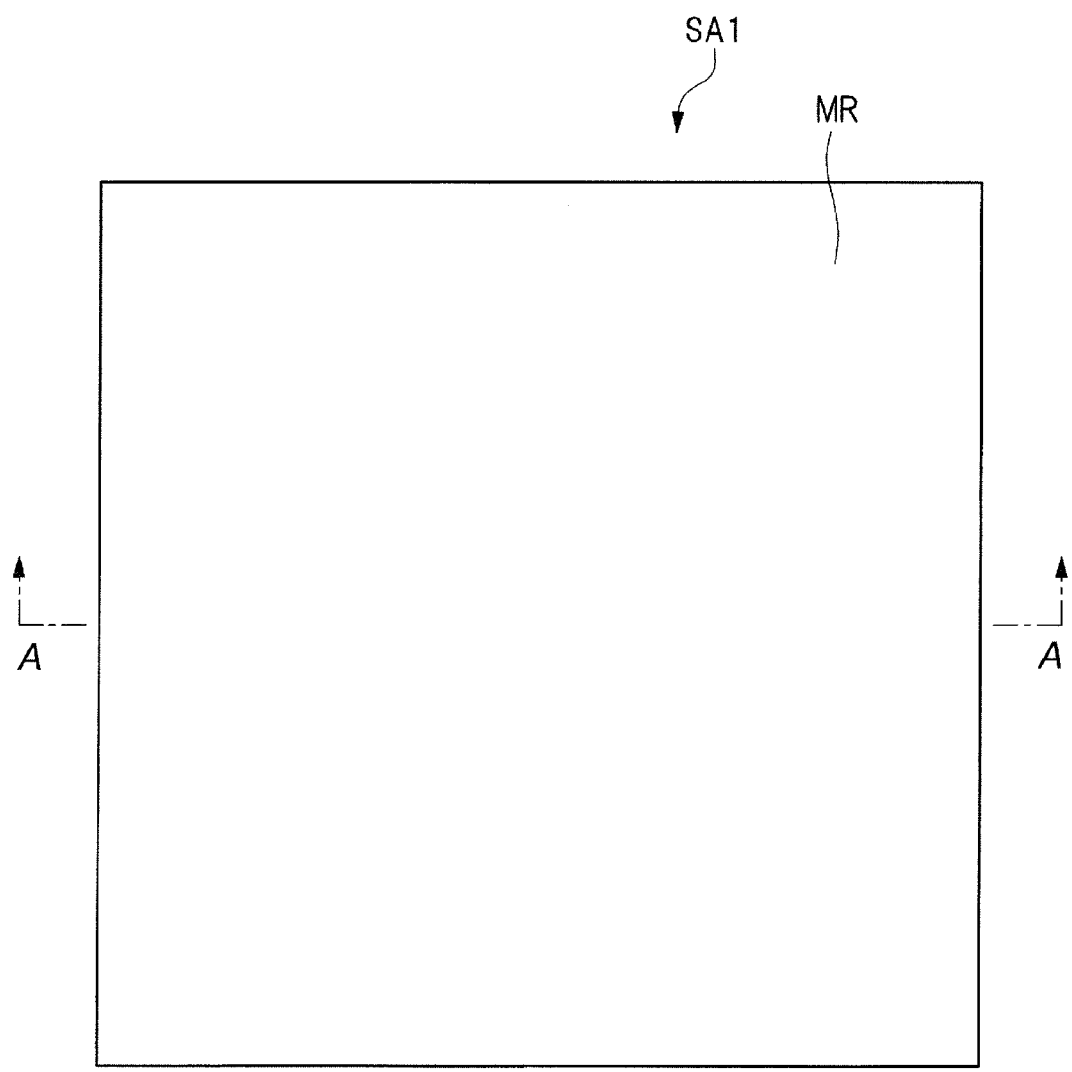
FIG. 1 is a plan view in which a semiconductor device formed of a BGA package is viewed from over the upper surface thereof.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others.

Also in the following embodiments, when the number and the like (including the number, numerical value, amount, range, and the like) of elements are referred to in the following embodiments, they are not limited to specific numbers unless particularly explicitly described otherwise or unless they are obviously limited to specific numbers in principle. The number and the like of the elements may be not less than or not more than specific numbers.

Also in the following embodiments, it goes without saying that the components thereof (including also elements, steps, and the like) are not necessarily indispensable unless particularly explicitly described otherwise or unless the components are considered to be obviously indispensable in principle.

Likewise, if the shapes, positional relationships, and the like of the components and the like are referred to in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Throughout all the drawings for illustrating the embodiments, like members are designated by like reference numerals, and a repeated description thereof is omitted. Note that, for improved clarity of illustration, even a plan view may be hatched.

Embodiment 1

Example of Configuration of Semiconductor Device (BGA Package)

A semiconductor device is formed of a semiconductor chip in which a semiconductor element such as a MOSFET (Metal Oxide Semiconductor Field Effect Transistor) and multilayer interconnect wirings are formed, and a package formed so as to cover the semiconductor chip. The package has: (1) the function of electrically coupling the semiconductor element formed in the semiconductor chip to an external circuit; and (2) the function of protecting the semiconductor chip from external environments such as humidity and temperature and preventing the breakage of the semiconductor chip due to vibration or impact as well as the degradation of the characteristics of the semiconductor chip. In addition, the package also has: (3) the function of facilitating handling of the semiconductor chip; (4) the function of radiating heat during the operation of the semiconductor chip to allow the function of the semiconductor element to be maximized; and the like.

The structure of the package of a semiconductor device comes in various types such as, e.g., a BGA (Ball Grid Array) package and a QFP (Quad Flat Package) package. The technical idea of the present invention is applicable to, e.g., a semiconductor device formed of the BGA package shown below. Therefore, a description will be given of an example of a configuration of a typical semiconductor device formed of a BGA package.

Referring to the drawings, the description will be given first of the example of the configuration of the semiconductor device formed of the BGA package. FIG. 1 is a plan view in which a semiconductor device SA1 formed of a BGA package is viewed from over the upper surface thereof. As shown in FIG. 1, the semiconductor device SA1 has a rectangular shape, and the upper surface of the semiconductor device SA1 is covered with a resin (sealing body) MR.

Figure 2:
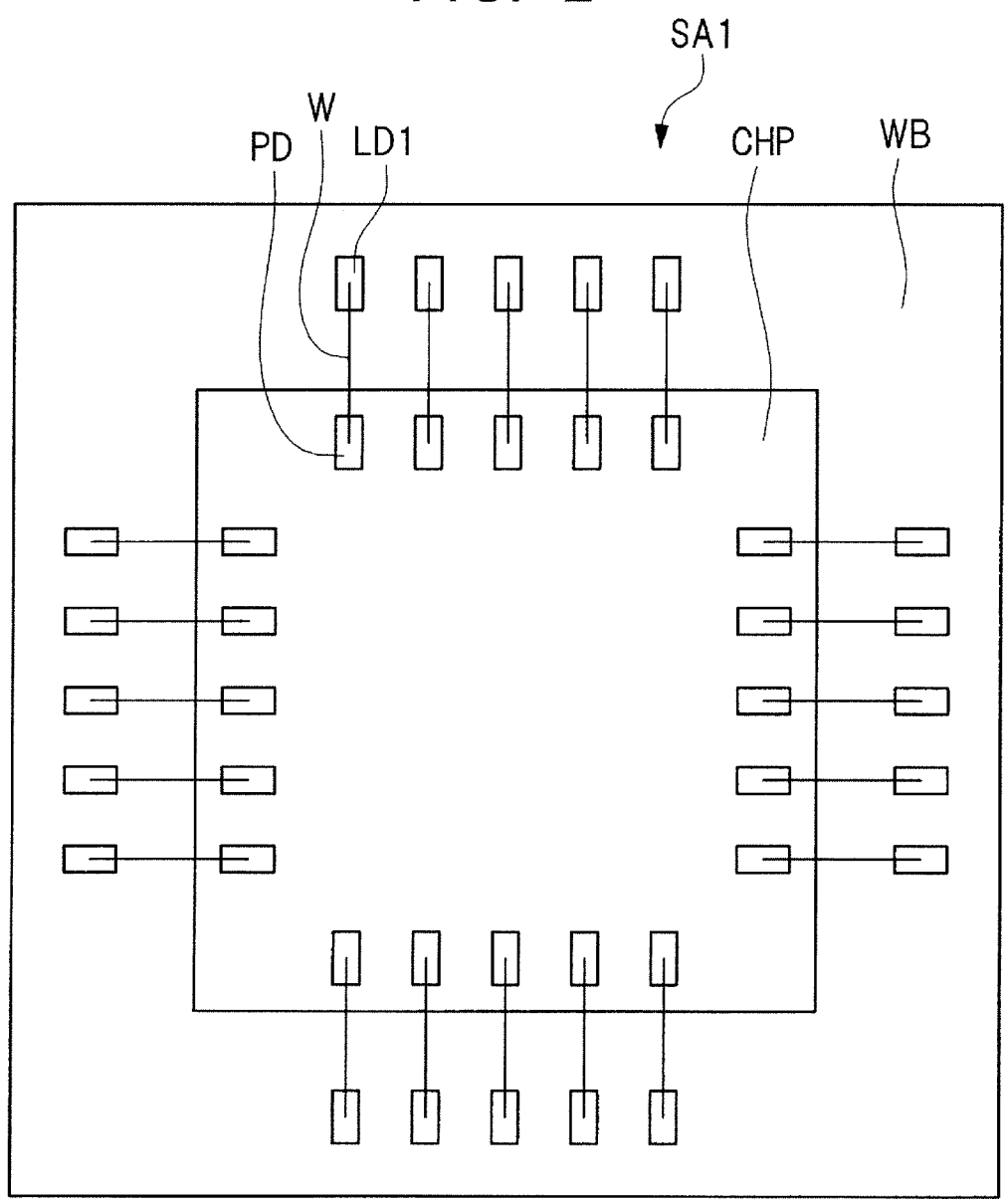
FIG. 2 is a view in which the semiconductor device is viewed from over the upper surface thereof and shown through a resin.

Subsequently to FIG. 1, FIG. 2 is a view in which the semiconductor device SA1 is viewed from over the upper surface thereof and shown through the resin MR. As shown in FIG. 2, in the semiconductor device SA1 viewed through the resin MR, a wiring board WB having a rectangular shape exists and, over the wiring board WB, a semiconductor chip CHP is placed. The semiconductor chip CHP also has a rectangular shape. The size of the semiconductor chip CHP is smaller than the size of the wiring board WB, and the semiconductor chip CHP is placed so as to be included in the wiring board WB in two dimensions. In particular, the semiconductor chip CHP is placed such that the four sides thereof are parallel with the individual four sides of the wiring board WB.

In the semiconductor chip CHP described above, an integrated circuit is formed. Specifically, in the semiconductor substrate forming the semiconductor chip CHP, a plurality of semiconductor elements such as MOSFETs are formed. In the layers located over the semiconductor substrate, the multilayer interconnect wirings are formed via interlayer insulating films and electrically coupled to the plurality of MOSFETs formed in the semiconductor substrate to form the integrated circuit. Briefly, the semiconductor chip CHP has the semiconductor substrate in which the plurality of MOSFETs are formed, and the multilayer interconnect wirings formed over the semiconductor substrate. Thus, in the semiconductor chip CHP, the integrated circuit is formed of the plurality of MOSFETs and the multilayer interconnect wirings and, to provide an interface between the integrated circuit and an external circuit, pads PD are formed in the semiconductor chip CHP. The pads PD are formed by exposing parts of an uppermost layer wire formed in the uppermost layer of the multilayer interconnect wirings.

As shown in FIG. 2, in the main surface (top surface or upper surface) of the semiconductor chip CHP, the plurality of pads PD are formed. Specifically, the plurality of pads PD are formed along each of the four sides of the semiconductor chip CHP having the rectangular shape. On the other hand, along each of the four sides of the wiring board WB, a plurality of land terminals LD1 are formed so as to oppose the plurality of pads PD formed in the semiconductor chip CHP. The pads PD formed in the semiconductor chip CHP are electrically coupled to the land terminals LD1 formed over the wiring board WB via conductive members. Examples of the conductive members which can be used include wires W made of gold (Au) or copper (Cu).

Figure 3:
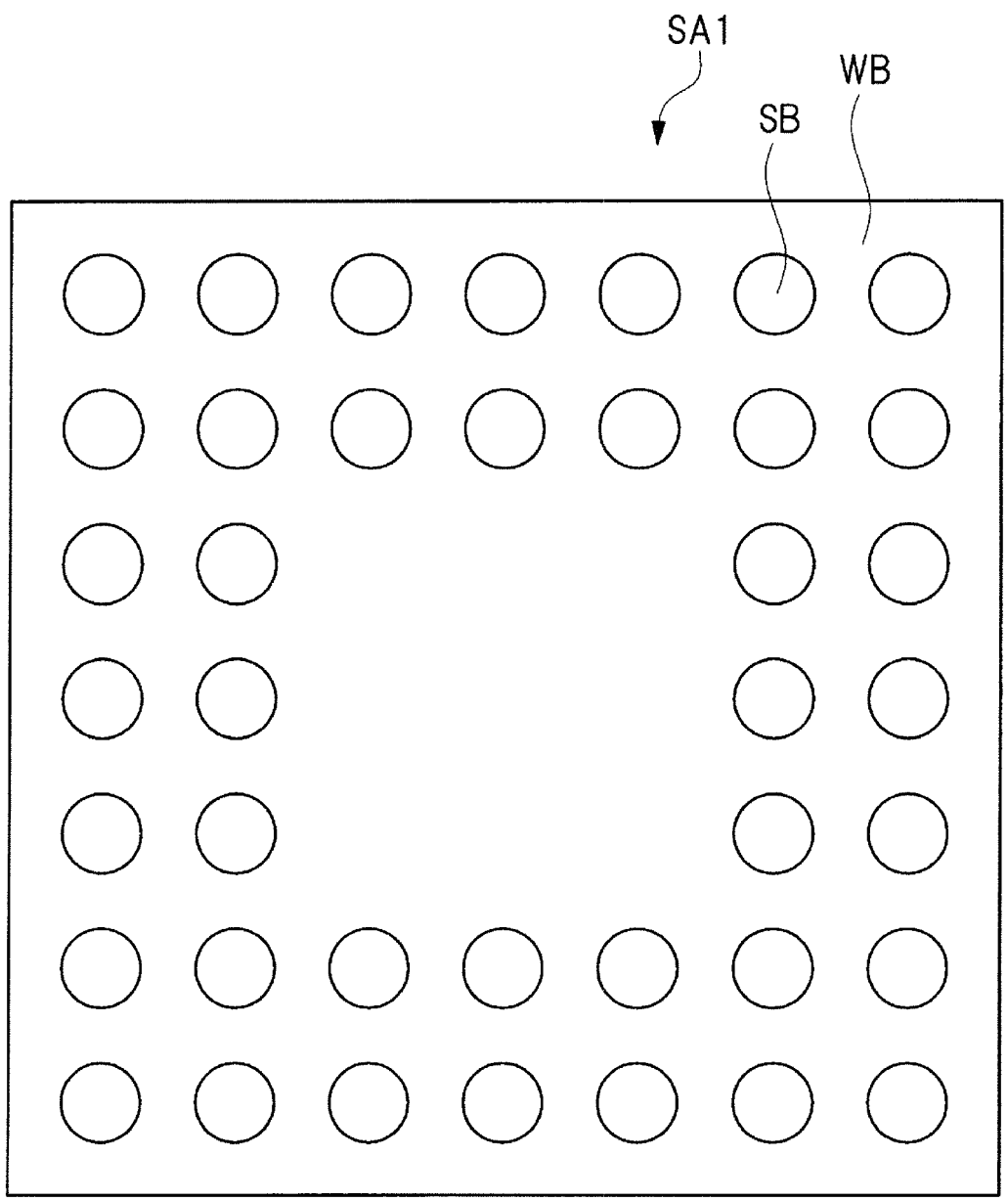
FIG. 3 is a view in which the semiconductor device is shown from under the back surface thereof.

Subsequently to FIG. 2, FIG. 3 is a view in which the semiconductor device SA1 is viewed from under the back surface thereof. As shown in FIG. 3, over the back surface of the semiconductor device SA1, a plurality of solder balls SB are arranged in an array pattern (in rows and columns). The solder balls SB function as the external coupling terminals of the semiconductor device SA1.

Figure 4:
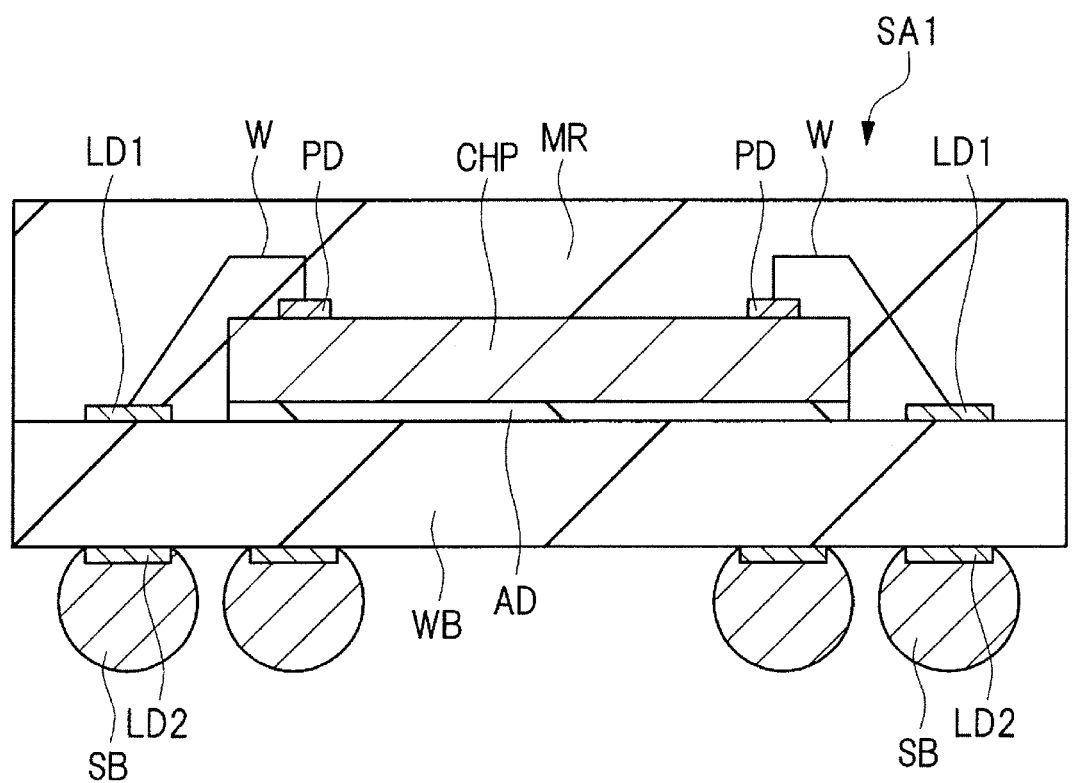
FIG. 4 is a cross-sectional view taken along the line A-A of FIG. 1.

FIG. 4 is a cross-sectional view taken along the line A-A of FIG. 1. In FIG. 4, over the upper surface of the wiring board WB, the land terminals LD1 are formed while, over the lower surface of the wiring board WB, terminals (bump lands or electrodes) LD2 are formed. In the wiring board WB, multilayer interconnect wirings and vias are formed. The land terminals LD1 formed over the upper surface of the wiring board WB are electrically coupled to the terminals LD2 formed over the lower surface of the wiring board WB with the multilayer interconnect wirings formed in the wiring board WB and via wirings formed in the vias. The terminals LD2 formed over the lower surface of the wiring board WB are arranged in an array pattern and, over the terminals LD2, the solder balls SB are mounted. As a result, over the back surface (lower surface) of the wiring board WB, the solder balls SB coupled to the terminals LD2 are arranged in an array pattern.

Over the upper surface (top surface or main surface) of the wiring board WB, the semiconductor chip CHP is mounted. The semiconductor chip CHP is bonded to the wiring board WB with an insulating adhesive material AD. The pads PD formed in the main surface of the semiconductor chip CHP are coupled to the land terminals LD1 formed over the upper surface of the wiring board WB with the wires W. In addition, over the upper surface of the wiring board WB, the resin (sealing body) MR is formed so as to cover the semiconductor chip CHP and the wires W.

In the semiconductor device SA1 thus configured, the pads PD formed in the semiconductor chip CHP are coupled to the land terminals LD1 formed over the wiring board WB via the wires W. The land terminals LD1 are electrically coupled to the terminals LD2 formed over the back surface of the wiring board WB with the wirings and the via wirings each formed in the wiring board WB. Accordingly, it will be understood that the integrated circuit formed in the semiconductor chip CHP is eventually coupled to the solder balls SB in a path extending from the pads PD to the solder balls SB successively through the wires W, the land terminals LD1, and the terminals LD2. Consequently, it will be understood that, by electrically coupling the external circuit to the solder balls SB formed in the semiconductor device SA1, the external circuit can be coupled to the integrated circuit formed in the semiconductor chip CHP.

<Manufacturing Method of Semiconductor Device (BGA Package)>

Figure 5:
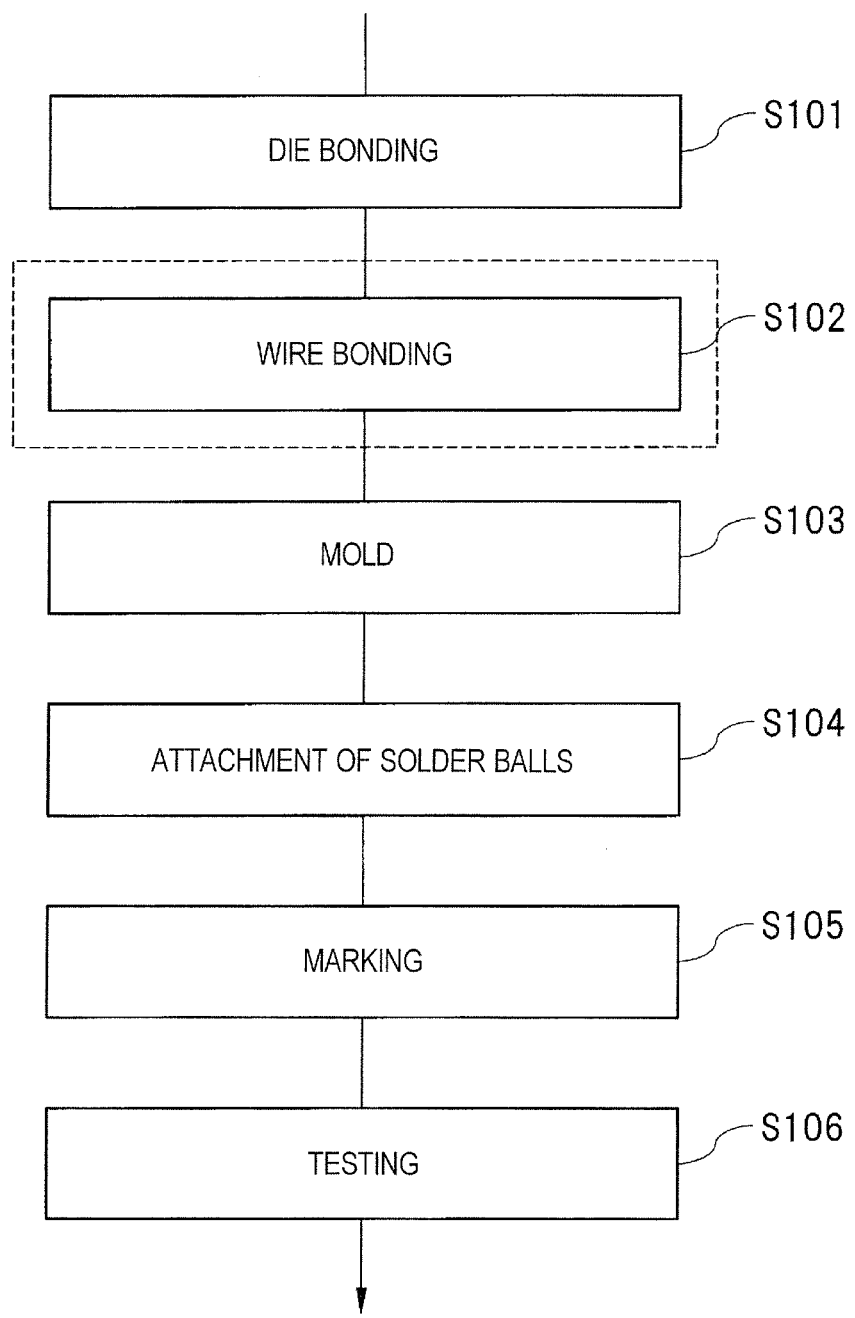
FIG. 5 is a flow chart showing the flow of the manufacturing steps of the semiconductor device formed of the BGA package.

The semiconductor device SA1 formed of the BGA package is configured as described above. A brief description will be given below to a manufacturing method thereof. FIG. 5 is a flow chart showing the flow of the manufacturing steps of the semiconductor device SA1 formed of the BGA package.

First, over each of the chip regions of a semiconductor substrate (semiconductor wafer), the semiconductor elements (MOSFETs), the multilayer interconnect wirings, and the pads are formed. Then, the back-side grinding of the semiconductor substrate is performed to reduce the thickness of the semiconductor substrate. Thereafter, by dicing the semiconductor substrate into the individual chip regions formed therein, the plurality of semiconductor chips are formed.

Next, the wiring board is provided which has the plurality of land terminals formed over the top surface thereof, and the plurality of terminals formed over the back surface thereof opposite to the top surface. Then, to a chip mounting portion (chip mounting region) present in the top surface of the wiring board, the adhesive material is applied. Thereafter, the semiconductor chip is mounted over the chip mounting portion of the wiring board via the applied adhesive material (die bonding step) (S101).

Subsequently, the pads formed in the semiconductor chip are coupled to the land terminals formed over the wiring board with the wires (wire bonding step) (S102). Specifically, a capillary is pressed first against each of the pads formed in the semiconductor chip (first bonding). Then, the capillary is moved to bond the wire to the corresponding land terminal formed over the wiring board (second bonding). In this manner, the pads formed in the semiconductor chip can be coupled to the land terminals formed over the wiring board with the wires.

Next, the sealing body made of, e.g., a resin is formed so as to cover the semiconductor chip, the wires, and the top surface of the wiring board (molding step) (S103). Thereafter, to the terminals formed over the back surface of the wiring board, the solder balls (external coupling terminals) made of a solder are attached (solder ball attaching step) (S104). Then, in the surface of a sealing body, a mark formed of a production number or the like is impressed using, e.g., a laser (marking step) (S105). The semiconductor devices SA1 thus manufactured are each subjected to a final inspection (testing step) (S106) to be sorted into acceptable products and defective products, and the semiconductor devices SA1 determined to be the acceptable products are shipped.

<Configuration of Semiconductor Device in Related Art Technology>

As described above, in the semiconductor device SA1, it has been performed to couple the pads PD formed in the semiconductor chip CHP mounted over the wiring board WB to the land terminals LD1 formed over the wiring board WB with the wires W.

With regard thereto, in terms of achieving the stabilization of a power source potential or a reference potential (ground potential or GND potential), in some semiconductor devices, belt-like wirings may be provided over the wiring boards besides the land terminals LD1 (which may be referred to also as bonding fingers) described above. That is, a belt-like wiring to which the power source potential and the reference potential are applied may be provided over the wiring board and coupled to the semiconductor chip with a plurality of metal wires to stabilize the power source potential and the reference potential which are supplied to the semiconductor chip.

Figure 6:
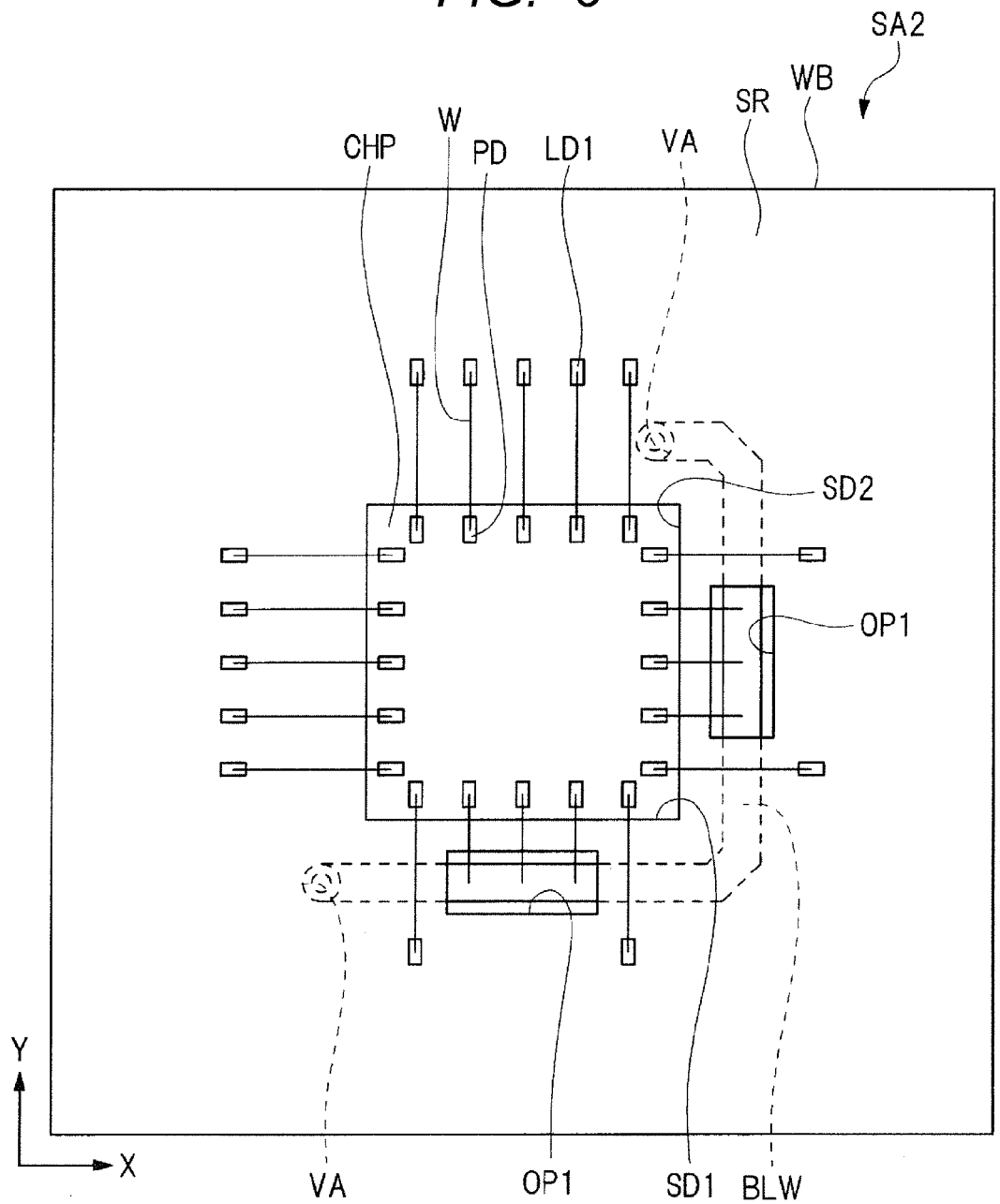
FIG. 6 is a schematic diagram showing an example of a configuration of a semiconductor device in a related art technology.

FIG. 6 is a schematic diagram showing an example of a configuration of such a semiconductor device SA2 in the related art technology. As shown in FIG. 6, in the semiconductor device SA2 in the related art technology, the semiconductor chip CHP is mounted over the wiring board WB having the rectangular shape. The pads PD formed in the semiconductor chip CHP are electrically coupled to the land terminals LD1 formed over the wiring board WB with the wires W. At this time, in the semiconductor device SA2 in the related art technology, as shown in FIG. 6, a belt-like wiring BLW is formed around the semiconductor chip CHP.

The belt-like wiring BLW is coupled to vias VA (through electrodes) formed in the wiring board WB and electrically coupled to the solder balls formed over the back surface of the wiring board WB. The belt-like wiring BLW is configured such that the reference potential (GND potential) and the power source potential are supplied from the solder balls formed over the back surface of the wiring board WB to the belt-like wiring BLW through the vias VA.

The belt-like wiring BLW thus configured is covered with a solder resist SR (insulating film) formed over the top surface of the wiring board WB, and a partial area of the belt-like wiring BLW is exposed from an opening OP1 formed in the solder resist SR.

As shown in FIG. 6, to the partial area of the belt-like wiring BLW exposed from the opening OP1, the plurality of wires W are electrically coupled. That is, in the semiconductor device SA2 in the related art technology, the partial area of the belt-like wiring BLW exposed from the opening OP1 is electrically coupled to the plurality of pads PD formed in the semiconductor chip CHP with the plurality of wires W. This results in solid electrical coupling between the semiconductor chip CHP and the belt-like wiring BLW to allow an improvement in the stability of the reference potential and the power source potential each supplied to the semiconductor chip CHP via the belt-like wiring BLW.

Figure 7:
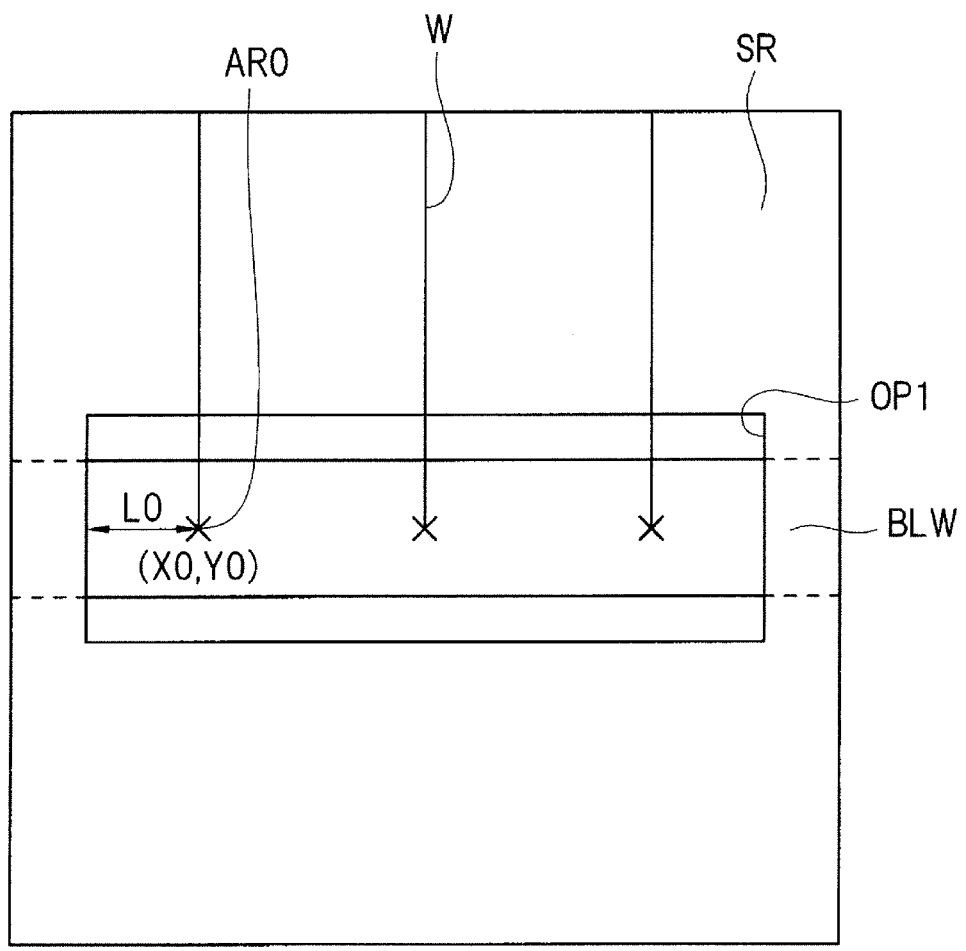
FIG. 7 is a view in which a partial area of a belt-like wiring exposed from the opening shown in FIG. 6 is enlarged.

FIG. 7 is a view in which the partial area of the belt-like wiring BLW exposed from the opening OP1 shown in FIG. 6 is enlarged. As shown in FIG. 7, it can be seen that, from the opening OP1 provided in the solder resist SR, the partial area of the belt-like wiring BLW is exposed. As shown in, e.g., FIG. 7, it can also be seen that, to the partial area of the belt-like wiring BLW exposed from the opening OP1, the three wires W are coupled. At this time, in FIG. 7, a leftmost wire bonding area AR0 (wire bonding position) is set at a design position (X0, Y0). Here, a bonding area (wire bonding position) means that one of the areas of the belt-like wiring BLW to which the wire W is bonded.

When the opening OP1 provided in the solder resist SR is formed according to the design, the wire bonding area AR0 is present at a position away from the left end of the opening OP1 by a distance L0. When the wire bonding area AR0 is present at such a design position, as shown in FIG. 7, the wire W can be normally coupled to the belt-like wiring BLW in the opening OP1.

However, in an actual situation, due to a problem associated with the position accuracy of the opening OP1 formed in the solder resist SR, the position of the opening OP1 may be displaced. In this case, even if, e.g., the leftmost wire bonding area AR0 (wire bonding position) is set at the design position (X0, Y0), a situation may be encountered in which, depending on the displacement of the opening OP1, the wire bonding area AR0 of the belt-like wiring BLW in the opening OP1 is covered with the solder resist SR. To prevent this, in an actual wire bonding step, visual alignment is performed before wire bonding is conducted. A description will be given below of the flow of a real bonding step.

Figure 8:
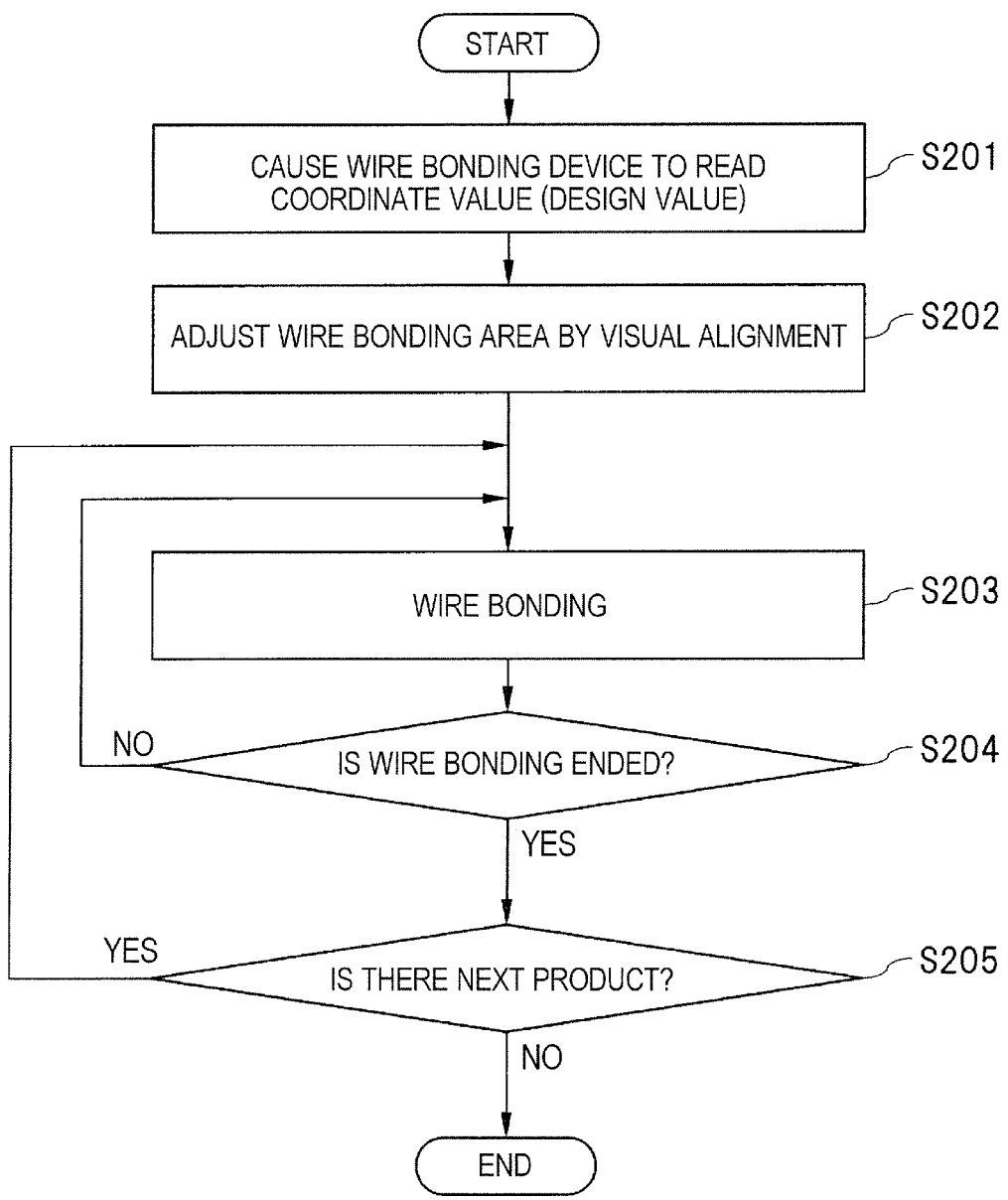
FIG. 8 is a flow chart showing the flow of a wire bonding step in the related art technology.

FIG. 8 is a flow chart showing the flow of a wire bonding step in the related art technology. In FIG. 8, a wire bonding device is first caused to read the coordinate value (design value) of a wire bonding area produced by CAD (Computer aided design) (S201). Subsequently, by visual alignment, the wire bonding area (wire bonding position) is adjusted (S202). This allows the shift of the wire bonding area (wire bonding position) from the design value to be adjusted in accordance with real working dimensions.

Thereafter, based on the adjusted wire bonding area (wire bonding position), wire bonding using the wire bonding device is performed (S203). Specifically, wire bonding for one semiconductor device (one product) is continuously performed. Then, when the wire bonding for the one semiconductor device is ended (S204), wire bonding is continuously performed for the next semiconductor device (one product) (S205). Likewise, wire bonding is performed for an arbitrary number of semiconductor devices. In this manner, the wire bonding step using the wire bonding device can be performed.

Figure 9:
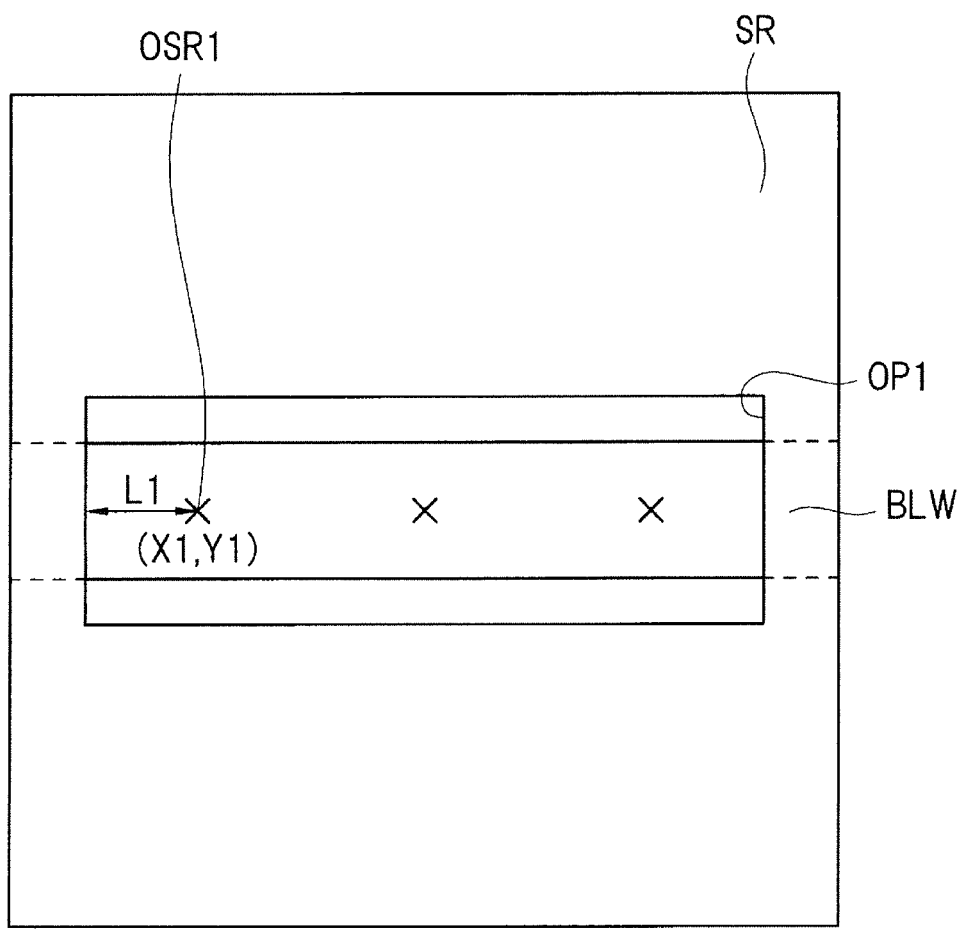
FIG. 9 is a view showing an example of visual alignment.

FIG. 9 is a view showing an example of the visual alignment. In FIG. 9, since there is no characteristic pattern in the belt-like wiring BLW exposed from the opening OP1, the coordinate position of a wire bonding area OSR1 is adjusted to, e.g., a position away from the left end of the opening OP1 by the distance L0 (position corresponding to the design value). However, in an actual situation, an error due to visual recognition occurs so that, in FIG. 9, the position of the wire bonding area OSR1 is adjusted to, e.g., a coordinate position (X1, Y1) away from the left end of the opening OP1 by a distance L1 (L1≈L0). At this time, when the coordinate position of the leftmost wire bonding area OSR1 is adjusted, the coordinate positions of the other wire bonding areas are set based on the design-value distances from the leftmost wire bonding area OSR1.

Figure 10:
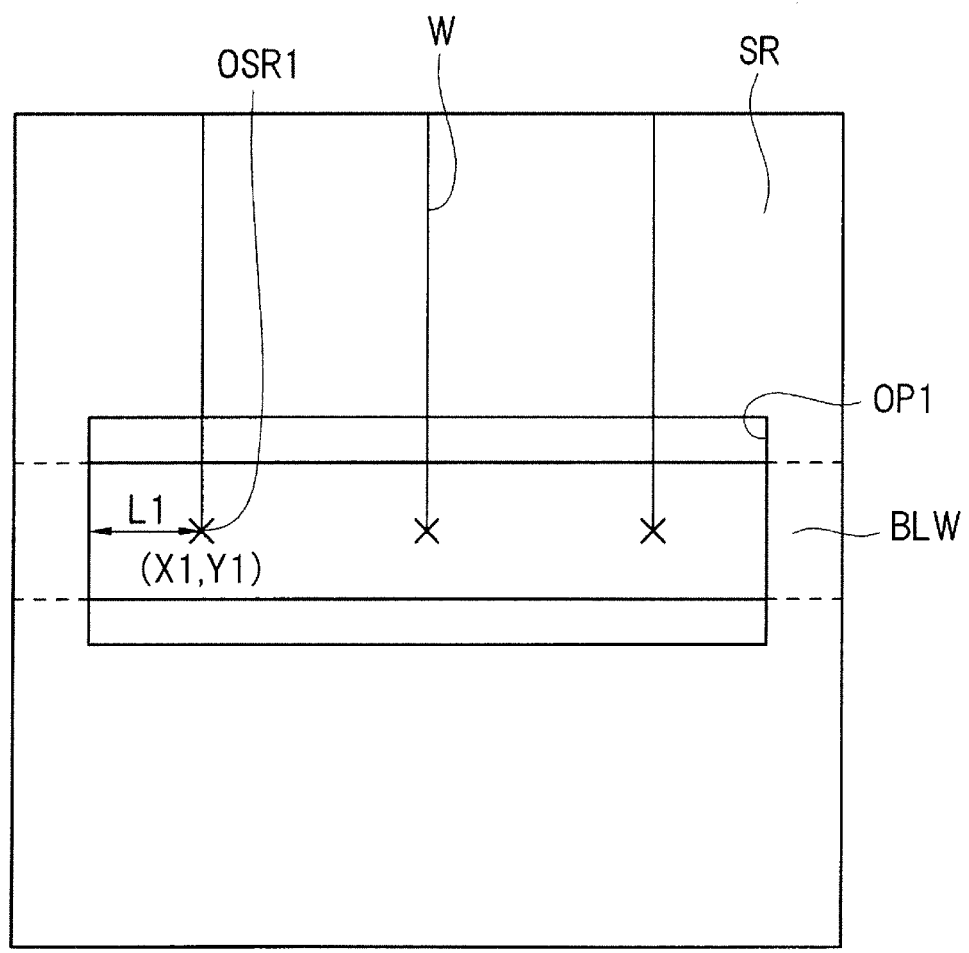
FIG. 10 is a view showing a state in which, after the visual alignment shown in FIG. 9 was performed, wire bonding has been performed for a semiconductor device.

When the visual alignment is thus ended, the wire bonding step using the wire bonding device is performed. FIG. 10 is a view showing a state in which, after the visual alignment shown in FIG. 9 was performed, wire bonding has been performed for a semiconductor device. As shown in, e.g., FIG. 10, it will be understood that, in the semiconductor device in which the opening OP1 is formed at substantially the same position as in the semiconductor device used in the visual alignment, the wires W can be normally electrically coupled to the belt-like wiring BLW exposed from the opening OP1.

<Room for Improvement in Related Art Technology>

However, since the dimensional accuracy of the opening OP1 formed in the solder resist SR is not sufficiently high, there is the possibility of performing the wire bonding step even for a semiconductor device in which the opening OP1 is formed at a position different from that in the semiconductor device used in the visual alignment based on the visual alignment described above. The present inventors have found that, in this case, as described above, in the adjustment method in which, e.g., the wire bonding area is set at a position away from the left end of the solder resist SR by a predetermined distance, there is a room for improvement shown below. That is, in the related art technology, since there is no characteristic pattern in the belt-like wiring BLW exposed from the opening OP1, an adjustment method is used in which, e.g., the coordinate position of the wire bonding area OSR1 is adjusted using the left end of the opening OP1 formed in the solder resist SR as a reference, as shown in FIG. 9.

However, in the adjustment method, the alignment is susceptible to the influence of the displacement of the opening OP1 formed in the solder resist SR. Even though the visual alignment is performed, the wires W cannot be coupled to the adjusted wire bonding area OSR1, leaving a room for improvement. A description will be given below of this point.

Figure 11:
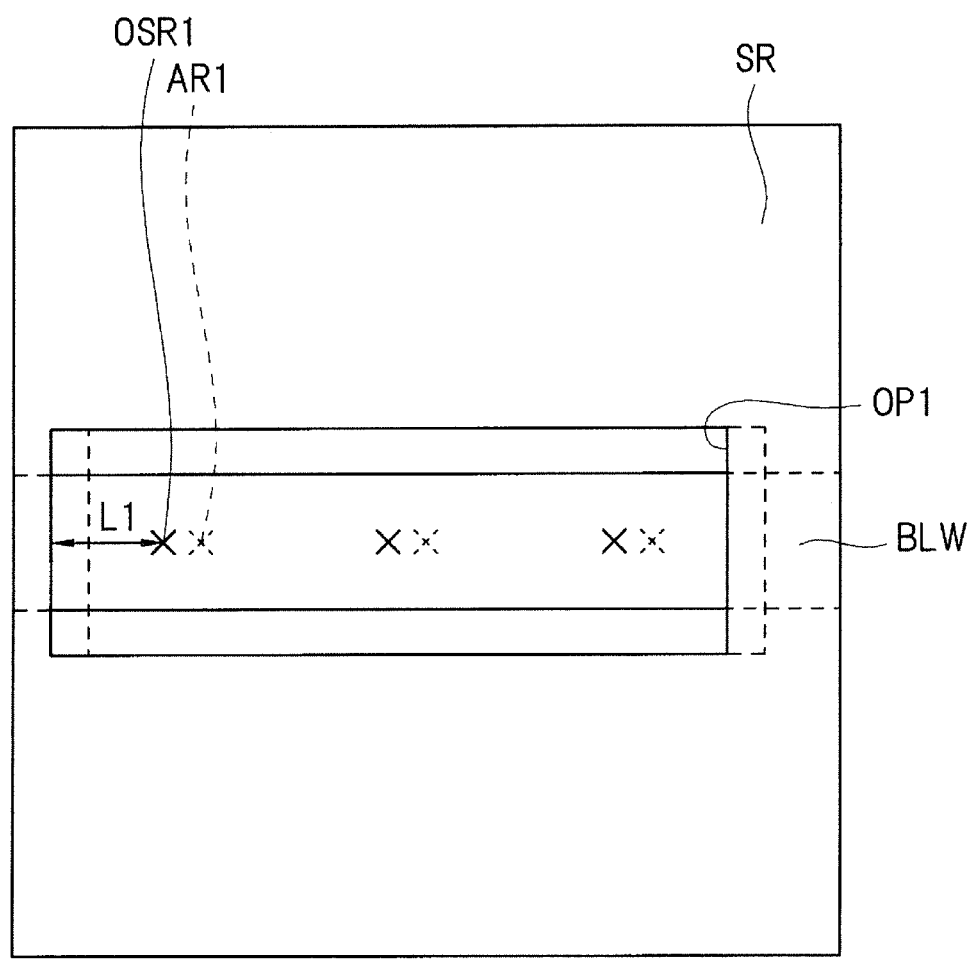
FIG. 11 is a view showing a state in which visual alignment was performed using a semiconductor device in which the position of an opening formed in a solder resist was shifted to the left from a design value.

For example, FIG. 11 is a view showing a state in which visual alignment was performed using a semiconductor device in which the position of the opening OP1 formed in the solder resist SR was shifted to the left from a design value. In FIG. 11, the position indicated by the broken line is the position of the opening OP1 according to the design value. If the position is adjusted to the wire bonding area AR1 away from the left end of the opening OP1 by a predetermined distance, the wire bonding step can be normally performed.

However, when the position of the opening OP1 formed in the solder resist SR is shifted to the left from the design value serving as a reference in an actual situation, visual alignment is consequently performed using the left end of the displaced opening OP1 as a reference. As a result, by the visual alignment, the bonding area is adjusted to the wire bonding area OSR1 located at the distance L1 from the left end of the displaced opening OP1. That is, when the opening OP1 is shifted to the left in the semiconductor device used in the visual alignment, the wire bonding area (wire bonding position) is not adjusted to the ideal wire bonding area AR1, but is actually adjusted to the wire bonding area OSR1 shifted to the left. Thus, when the position of the opening OP1 is shifted to the left from the design value in the semiconductor device used in the visual alignment, the position of the wire bonding area is adjusted to be set to the wire bonding area OSR1 shifted to the left from the position of the ideal wire bonding area AR1.

Figure 12:
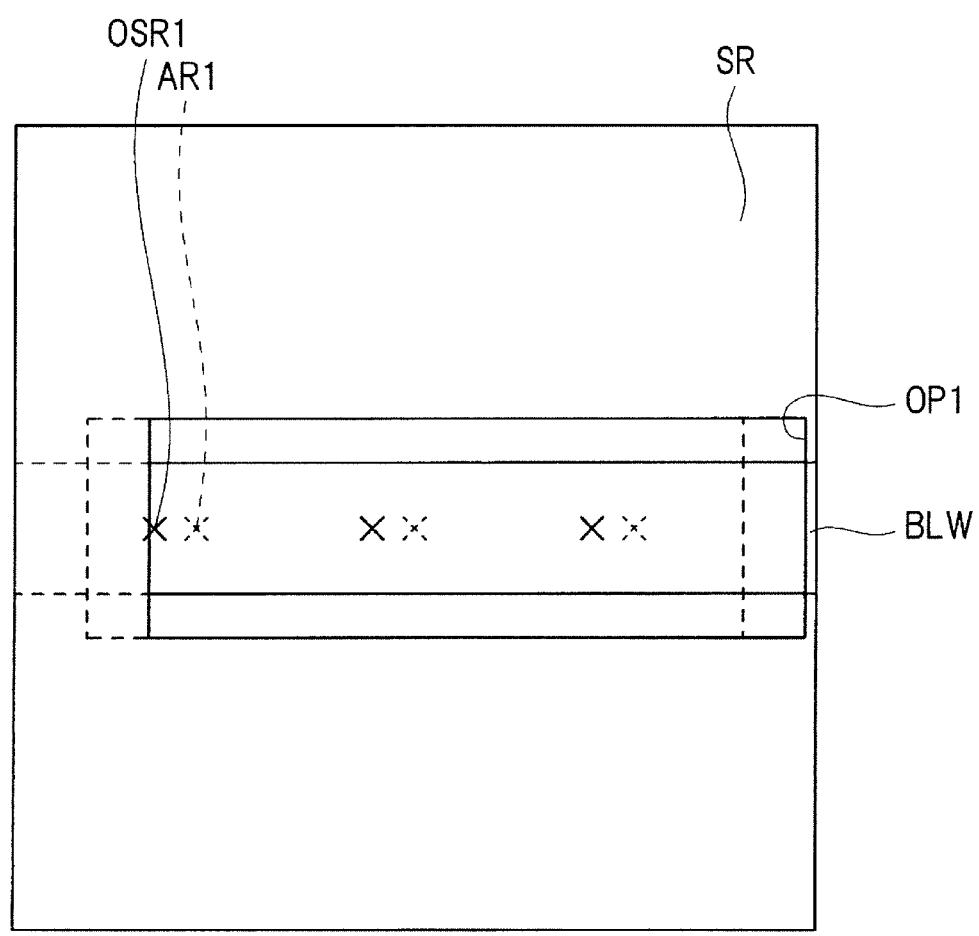
FIG. 12 is a schematic diagram showing a state in which a wire bonding step is performed for another semiconductor device other than the semiconductor device subjected to the visual alignment.

In the situation where such visual alignment has been performed, when the wire bonding step is performed for another semiconductor device, the following situation may possibly occur. FIG. 12 is a schematic diagram showing a state in which a wire bonding step is performed for another semiconductor device other than the semiconductor device subjected to the visual alignment.

For example, in FIG. 12, the semiconductor device in which the opening OP1 formed in the solder resist SR is shifted to the right from the design value is shown. For example, when the visual alignment is performed using a semiconductor device in which the opening OP1 is formed at a normal position close to the design value, the coordinate position of the bonding area is consequently adjusted to the ideal bonding area AR1. In this case, in a semiconductor device in which the opening OP1 is shifted to the right from the design value as shown in FIG. 12 also, it is possible to ensure the distance from the left end of the opening OP1 for the wire bonding area AR1. Accordingly, normal wire bonding can conceivably be performed.

However, as described above, when the visual alignment is performed using the semiconductor device in which the opening OP1 is formed at a position shifted to the left, the coordinate position of the bonding area is displaced from the ideal bonding area AR1 to be adjusted to that of the bonding area OSR1. In this case, in the wire bonding step for a semiconductor device in which the opening OP1 is shifted to the right from the design value as shown in FIG. 12, the wire bonding area OSR1 overlaps the left end of the opening OP1, and therefore normal wire bonding cannot be performed.

From the foregoing, it can be seen that, as shown in, e.g., FIG. 9, in the adjustment method in which the coordinate position of the wire bonding area is adjusted using the left end of the opening OP1 formed in the solder resist SR as a reference, the alignment is susceptible to the influence of the displacement of the opening OP1 formed in the solder resist SR. That is, in the visual alignment in the related art technology, even though the visual alignment is performed, the wires W cannot be coupled to the adjusted wire bonding area, leaving a room for improvement.

Here, it can be considered that, to normally perform the wire bonding step, camera recognition is performed in addition to the visual alignment for each of the semiconductor devices to further adjust the coordinate position of the wire bonding area for each of the semiconductor devices. However, in the related art technology, the situation is encountered in which the adjustment of the wire bonding area based on camera recognition is difficult. A description will be given below of this point.

Figure 13:
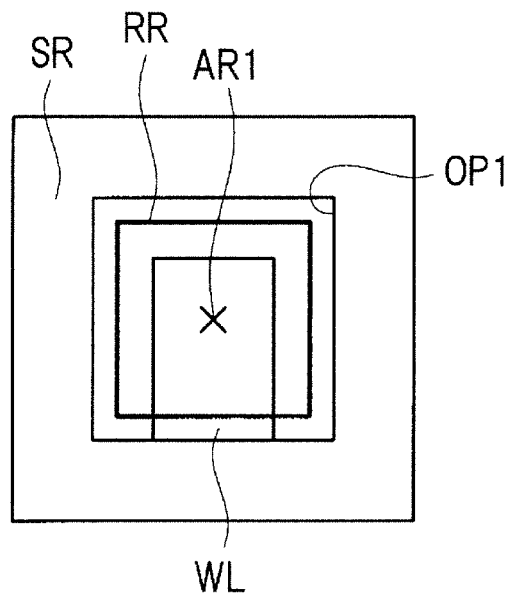
FIG. 13 is a schematic diagram showing an example in which a pattern is detected based on camera recognition.

FIG. 13 is a schematic diagram showing an example in which a pattern is detected based on camera recognition. As shown in FIG. 13, it can be seen that, e.g., the end portion of the wire WL is exposed from the opening OP1 provided in the solder resist SR. When the end portion of the wire WL is thus exposed, by causing a region RR recognized by a camera to include the end portion of the wire WL, the wire bonding area AR1 of the wire WL can be specified. That is, the end portion of the wire WL serves as a characteristic pattern in camera recognition to allow the wire bonding area AR1 of the wire WL to be specified.

Figure 14:
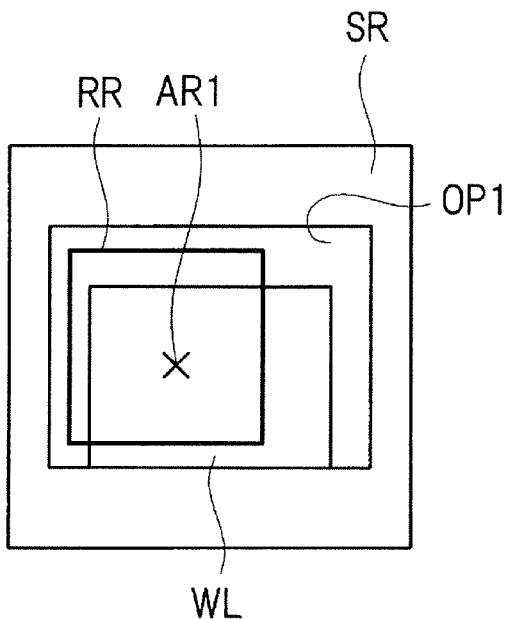
FIG. 14 is a schematic diagram showing another example in which a pattern is detected based on camera recognition.

Likewise, FIG. 14 is a schematic diagram showing another example in which a pattern is detected based on camera recognition. As shown in FIG. 14, it can be seen that, e.g., the end portion of the wire WL is exposed from the opening OP1 provided in the solder resist SR. In this case also, by causing the region RR recognized by the camera to include the end portion of the wire WL, the wire bonding area AR1 of the wire WL can be specified. That is, the end portion of the wire WL serves as a characteristic pattern in camera recognition to allow the wire bonding area AR1 of the wire WL to be specified.

Figure 15:
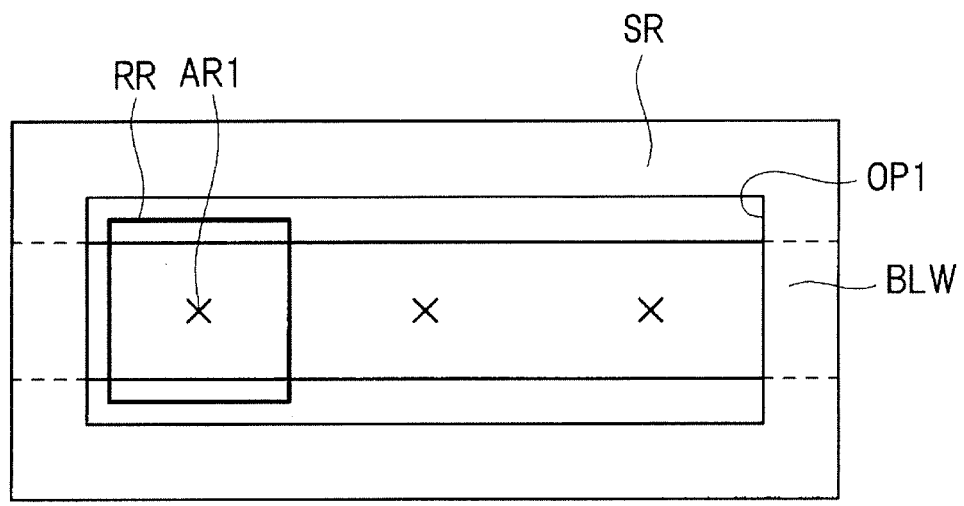
FIG. 15 is a view showing a state in which pattern recognition by means of a camera is performed on the belt-like wiring exposed from the opening formed in the solder resist.
Figure 16:
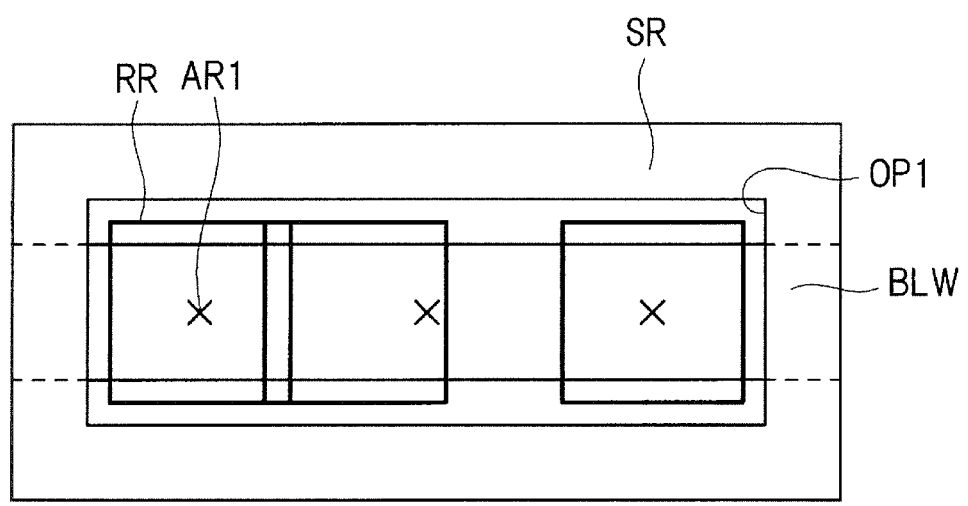
FIG. 16 is a view showing a state in which pattern matching is performed.

However, in the case of using the belt-like wiring BLW, the situation is quite different. FIG. 15 is a view showing a state in which pattern recognition by means of a camera is performed on the belt-like wiring BLW exposed from the opening OP1 formed in the solder resist SR. As shown in FIG. 15, the belt-like wiring BLW exposed from the opening OP1 has no end portion so that there is no characteristic pattern in the region RR recognized by the camera. That is, the recognized pattern of the belt-like wiring BLW exposed from the opening OP1 has no characteristic pattern like the end portion shown in FIGS. 13 and 14. It follows therefore that, in the belt-like wiring BLW having no characteristic pattern, as shown in FIG. 16, there are numerous patterns each having the same shape as that of the recognized pattern. As a result, in the related art technology, even when the wire bonding area AR1 of the belt-like wiring BLW is to be specified based on camera recognition, recognition inability or erroneous recognition is induced so that it is difficult to normally specify the wire bonding area AR1.

Figure 17:
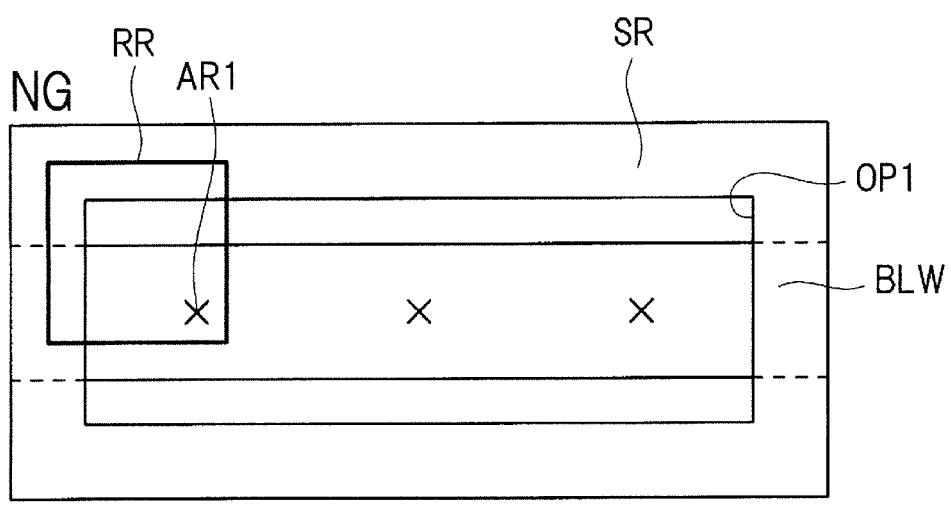
FIG. 17 is a view showing a state in which camera recognition is performed with the corner portion of the opening being included in a recognized region.

With regard to this point, it can be considered that, as shown in, e.g., FIG. 17, the recognized region RR is caused to include the corner portion (corner edge) of the opening OP1. In this case, the recognized region RR consequently includes the characteristic pattern of the corner portion of the opening OP1, and it can be considered that pattern recognition by means of a camera can be normally performed. However, the situation is encountered in which there are variations in the dimensional accuracy and positional accuracy of the opening OP1 of the solder resist SR and, in addition, the solder resist SR is not materially appropriate for camera recognition. That is, the pattern recognition is performed by focusing the camera on the belt-like wiring BLW as the metal wire but, when the camera is focused on the belt-like wiring BLW, due to the height difference between the belt-like wiring BLW and the solder resist SR (the surface of the solder resist SR is higher in level than the surface of the belt-like wiring BLW), the material difference therebetween, or the like, the solder resist SR goes out of focus. That is, it is difficult to focus the camera simultaneously on the belt-like wiring BLW and on the solder resist SR. As a result, even though the recognized region RR is caused to include the corner portion (corner edge) of the opening OP1 provided in the solder resist SR, it is difficult to normally perform the pattern recognition by means of the camera.

From the foregoing, it will be understood that the visual alignment in the related art technology is susceptible to the influence of the displacement of the opening OP1 formed in the solder resist SR to increase the possibility that the wire W cannot be coupled to the adjusted wire bonding area and, in the related art technology, it is also difficult to adjust the wire bonding area based on camera recognition. That is, it will be understood that the related art technology leaves a room for improvement in the reliability of the wire bonding step. In view of this, Embodiment 1 has taken measures to improve the reliability of the wire bonding step. A description will be given below of a technical idea in Embodiment 1 that has taken measures.

<Configuration of Semiconductor Device in Embodiment 1>

Figure 18:
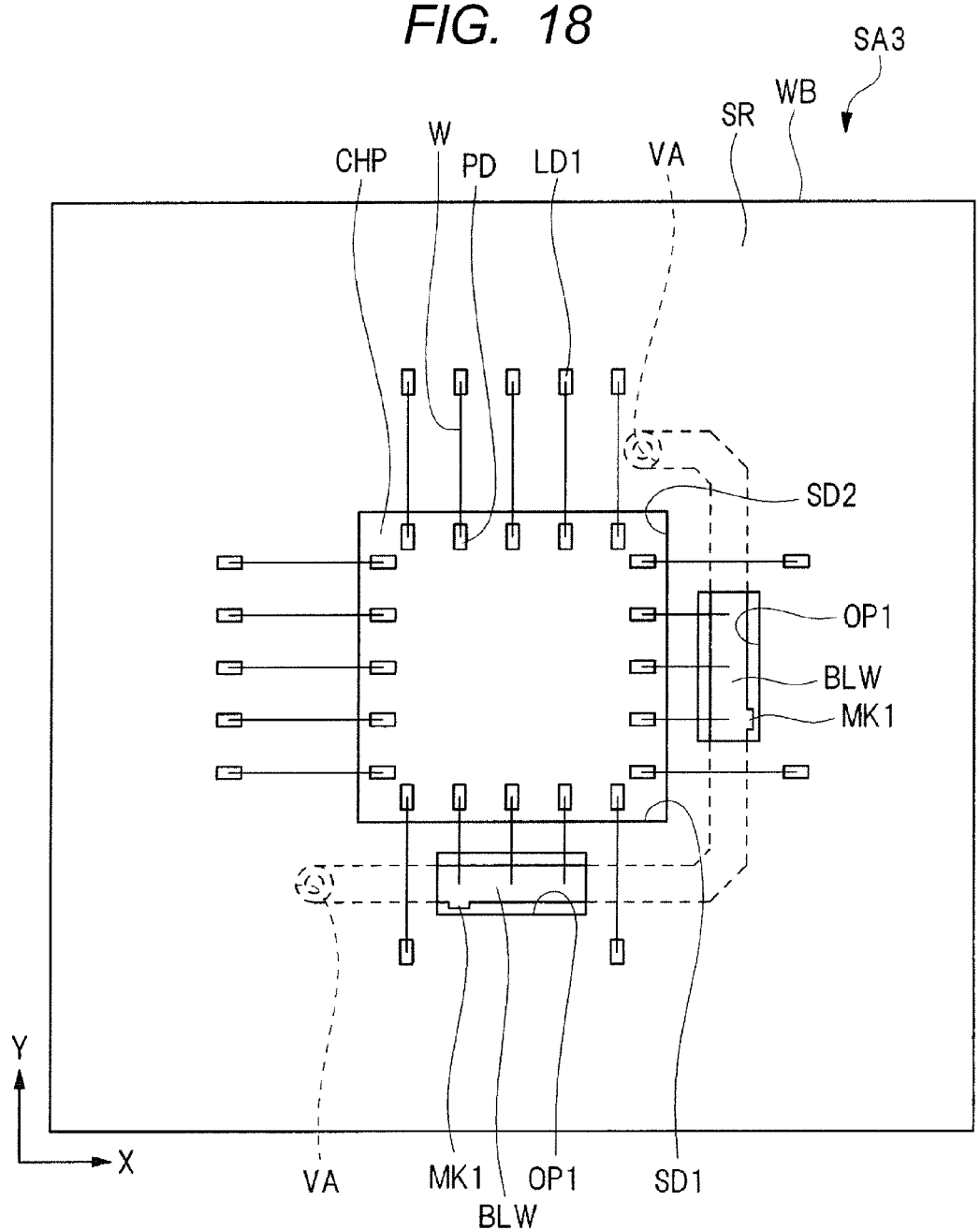
FIG. 18 is a schematic diagram showing an example of a configuration of a semiconductor device in Embodiment 1.

FIG. 18 is a schematic diagram showing an example of a configuration of a semiconductor device SA3 in Embodiment 1. As shown in FIG. 18, in the semiconductor device SA3 in Embodiment 1, over the wiring board WB having a rectangular shape, the semiconductor chip CHP is mounted. The pads PD formed in the semiconductor chip CHP are electrically coupled to the land terminals LD1 formed over the wiring board WB with the wires W.

At this time, in the semiconductor device SA3 in Embodiment 1, as shown in FIG. 18, the belt-like wiring BLW is formed in a part of the region surrounding the semiconductor chip CHP. Specifically, as shown in, e.g., FIG. 18, the first portion of the belt-like wiring BLW is located so as to extend in an X-direction (first direction) along a first side SD1 of the semiconductor chip CHP, while the second portion of the belt-like wiring BLW coupled to the first portion of the belt-like wiring BLW is located so as to extend in a Y-direction (second direction) along a second side SD2 of the semiconductor chip CHP.

The belt-like wiring BLW thus configured is coupled to the vias VA (through electrodes) formed in the wiring board WB and electrically coupled to the solder balls formed over the back surface of the wiring board WB. The belt-like wiring BLW is configured such that the reference potential (GND potential) and the power source potential are supplied from the solder balls formed over the back surface of the wiring board WB to the belt-like wiring BLW through the vias VA.

The belt-like wiring BLW is covered with the solder resist SR (insulating film) formed over the top surface of the wiring board WB, and the partial area of the belt-like wiring BLW is exposed from the opening OP1 formed in the solder resist SR. The major part of the region of the belt-like wiring BLW is thus covered with the solder resist SR for an improvement in the adhesion between the belt-like wiring BLW made of the metal wire and the sealing body containing a resin. That is, since the adhesion between the metal wire and the resin is relatively poor, if the belt-like wiring BLW made of the metal wire is brought into direct contact with the resin, the possibility that the resin peels from the belt-like wiring BLW increases. On the other hand, the adhesion between the solder resist SR and the resin is more excellent than the adhesion between the metal wire and the resin, and therefore the major part of the region of the belt-like wiring BLW is covered with the solder resist SR.

As shown in FIG. 18, to the partial area of the belt-like wiring BLW exposed from the opening OP1, the plurality of wires W are electrically coupled. That is, in the semiconductor device SA3 in Embodiment 1, the partial area of the belt-like wiring BLW exposed from the opening OP1 is electrically coupled to the plurality of pads PD formed in the semiconductor chip CHP with the plurality of wires W. This results in solid electrical coupling between the semiconductor chip CHP and the belt-like wiring BLW to allow an improvement in the stability of the reference potential and the power source potential each supplied to the semiconductor chip CHP via the belt-like wiring BLW Here, as shown in, e.g., FIG. 18, the characteristic feature of Embodiment 1 is that a mark MK1 (mark area) is formed in the opening OP1 provided in the solder resist SR. A description will be given below of the mark MK1.

Figure 19:
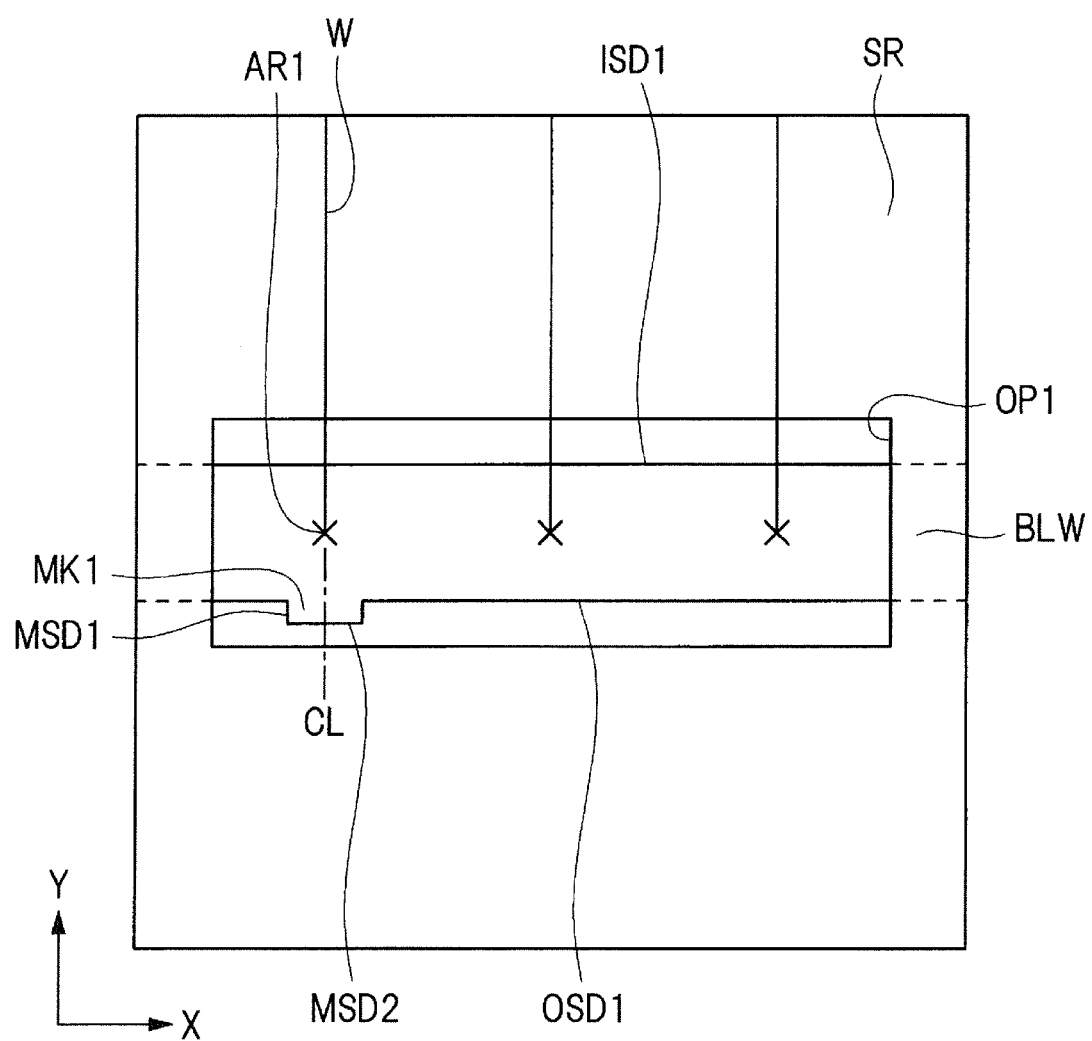
FIG. 19 is an enlarged view showing a region in the vicinity of the opening formed in the solder resist.

FIG. 19 is an enlarged view showing a region in the vicinity of the opening OP1 formed in the solder resist SR. As shown in FIG. 19, in the solder resist SR, the opening OP1 is provided and the partial area of the belt-like wiring BLW is exposed from the opening OP1. It can be seen that, as shown in, e.g., FIG. 19, the three wires W are coupled to the partial area of the belt-like wiring BLW exposed from the opening OP1. From FIG. 19, it can be seen that, at this time, the mark MK1 is formed correspondingly to the leftmost wire bonding area AR1. The mark MK1 has, e.g., a rectangular shape and is formed integrally with the belt-like wiring BLW.

Here, the statement that "the mark MK1 is formed correspondingly to the wire bonding area AR1" means that the mark MK1 is formed so as to allow the coordinate of the position of the wire bonding area AR1 to be set using the mark MK1 as a reference mark. In other words, the statement means that the mark MK1 is formed so as to allow the coordinate of the position of the wire bonding area AR1 to be set using the position of the mark MK1 as a reference.

For example, from FIG. 19, it can be seen that a center line CL of the mark MK1 coincides with the direction in which the wire W coupled to the wire bonding area AR1 extends and the wire bonding area AR1 exists on the center line of the mark MK1. That is, in FIG. 19, the coordinate position of the wire bonding area AR1 can be set correspondingly to the center position of the mark MK1. It can be seen that, in Embodiment 1, the mark MK1 is thus formed correspondingly to the wire bonding area AR1.

Specifically, as shown in FIG. 19, the mark MK1 is placed such that the center thereof is located on the extension line of the coupling point between the wire W and the wire bonding area AR1 of the belt-like wiring BLW in the Y-direction orthogonal to the X-direction in which the belt-like wiring BLW in the opening OP1 extends. In particular, in FIG. 19, the belt-like wiring BLW has a first inner side ISD1 opposing the first side SD1 (see FIG. 18) of the semiconductor chip CHP and a first outer side OSD1 opposing the first inner side ISD1 and located externally of the first inner side ISD1 and the mark MK1 is provided externally of the first outer side OSD1 mentioned above. In Embodiment 1, the mark MK1 is a part of the belt-like wiring BLW and is in contact with the first outer side OSD1.

In other words, in planar view, the mark MK1 projects from the first outer side OSD1 of the belt-like wiring BLW into a protruding shape. In particular, in Embodiment 1, the mark MK1 has a first mark side MSD1 crossing the first outer side OSD1 and a second outer side MSD2 crossing the first mark side MSD1 and opposing the first outer side OSD1 of the belt-like wiring BLW. The length of the second mark side MSD2 is larger than the length of the first mark side MSD1.

Using FIG. 19, the description has been given of the correspondence between the mark MK1 and the wire bonding area AR1 present on the center line CL of the mark MK1. However, the correspondence therebetween is not limited to this example. The mark MK1 can also be formed such that the wire bonding area AR1 exists correspondingly to the right end portion or left end portion of the mark MK1.

<Advantage of Providing Mark>

Thus, the characteristic feature of Embodiment 1 is that, in the opening OP1 provided in the solder resist SR, the mark MK1 is formed correspondingly to the bonding area AR1 of the belt-like wiring BLW. A description will be given below of an advantage achieved by the mark MK1 thus formed.

Figure 20:
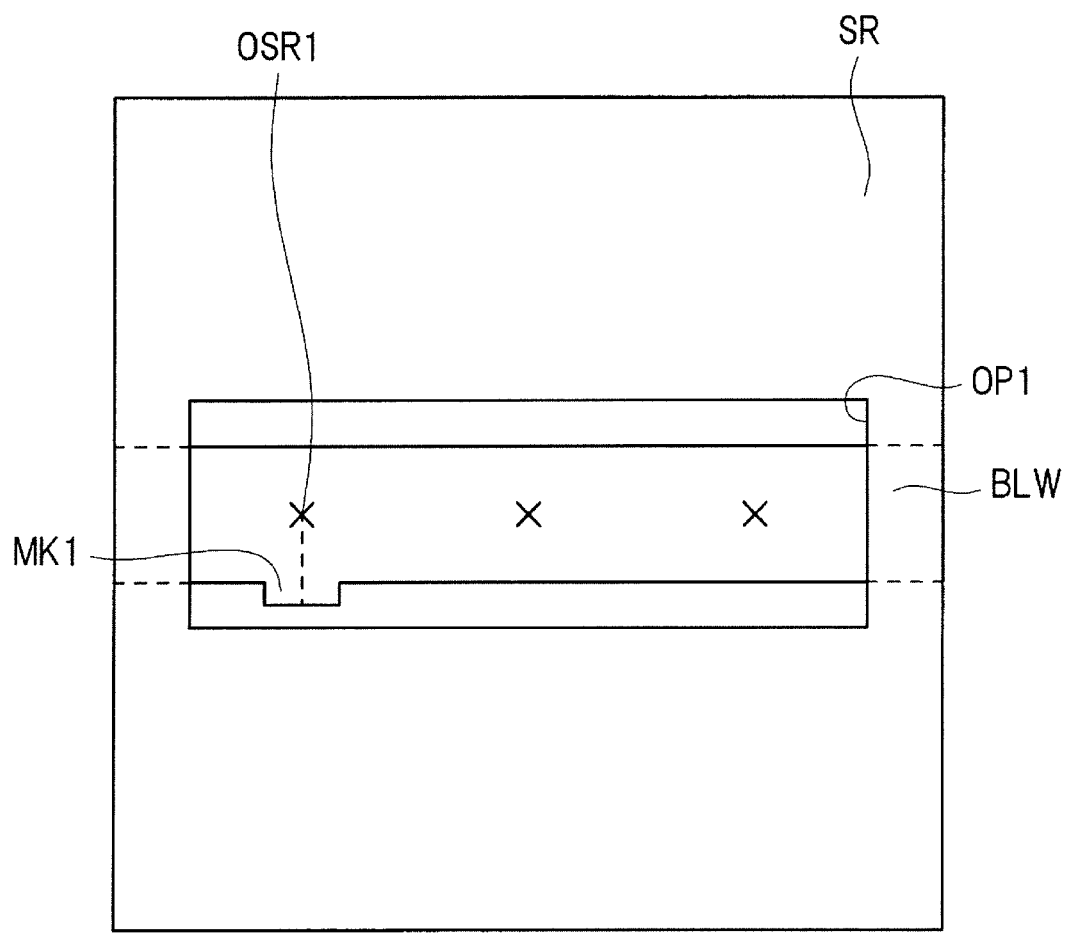
FIG. 20 is a schematic diagram showing a state in which visual alignment is performed.

FIG. 20 is a schematic diagram showing a state in which visual alignment is performed. As shown in FIG. 20, it can be seen that, from the opening OP1 provided in the solder resist SR, the belt-like wiring BLW is exposed and the mark MK1 is formed integrally with the belt-like wiring BLW. In the visual alignment, using the mark MK1 as a reference mark, the wire bonding area OSR1 can be set. That is, in Embodiment 1, the mark MK1 is formed correspondingly to the wire bonding area, and therefore a person who performs alignment can precisely set the wire bonding area OSR1 of the belt-like wiring BLW using the mark MK1 as a reference. For example, the wire bonding area OSR1 can be set on the center line of the mark MK1.

When the leftmost wire bonding area OSR1 is set by alignment, each of the middle wire bonding area and the rightmost wire bonding area can be set based on a design-value distance from the left most wire bonding area.

Thus, in the semiconductor device in Embodiment 1, the mark MK1 is formed correspondingly to the wire bonding area. Therefore, in the alignment step in Embodiment 1, there is no need to set the wire bonding area OSR1 using the left end of the opening OP1 as a reference, unlike in the related art technology, and the wire bonding area OSR1 can be adjusted based on the mark MK1 serving as a reference mark. As a result, the advantage of allowing the position of the wire bonding area OSR1 to be precisely adjusted without being affected by dimensional variations or positional variations in the opening OP1 can be obtained. Using an example, the details of the advantage will be described below.

Figure 21:
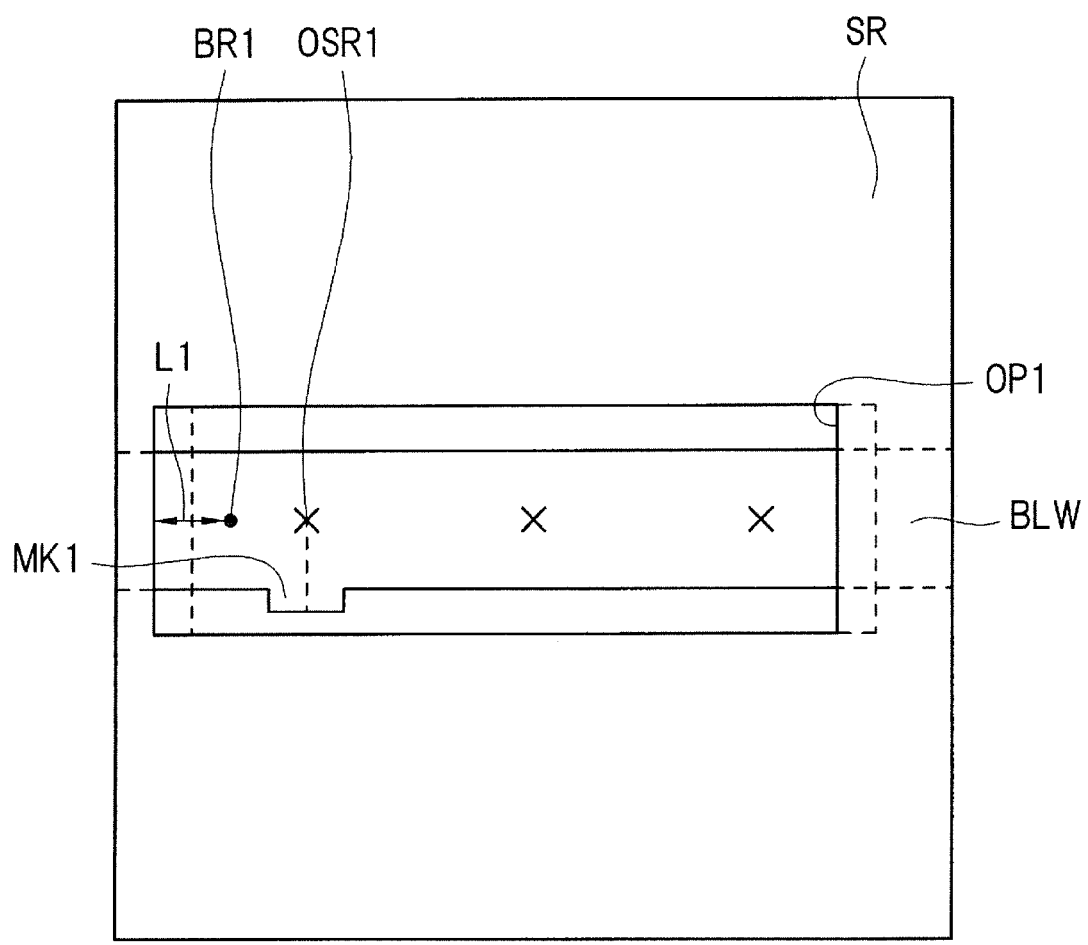
FIG. 21 is a view showing a state in which visual alignment was performed using a semiconductor device in which the position of the opening formed in the solder resist was shifted to the left from the design value.

FIG. 21 is a view showing a state in which visual alignment was performed using a semiconductor device in which the position of the opening OP1 formed in the solder resist SR was shifted to the left from the design value. In FIG. 21, the position indicated by the broken line is the position of the opening OP1 according to the design value.

For example, in the related art technology, when the position of the opening OP1 formed in the solder resist SR is shifted to the left from the design value serving as a reference as indicated by the solid line of FIG. 21, alignment in the related art technology is performed using the left end of the displaced opening OP1 as a reference. As a result, by visual alignment, the position of the wire bonding area is adjusted to a wire bonding area BR1 located at the distance L1 from the left end of the displaced opening OP1. That is, in the semiconductor device used in the visual alignment, when the opening OP1 is shifted to the left, the wire bonding area (wire bonding position) is adjusted to the wire bonding area BR1 shifted to the left. Thus, in the related art technology, when the position of the opening OP1 in the semiconductor device used in the visual alignment is shifted to the left from the design value, the position of the wire bonding area is adjusted to be set to the wire bonding area BR1 shifted to the left.

By contrast, in Embodiment 1, the wire bonding area OSR1 is adjusted using the mark MK1 formed in the opening OP1 as a reference mark. That is, in Embodiment 1, even when the position of the opening OP1 formed in the solder resist SR is shifted to the left from the design value serving as a reference, the wire bonding area can be adjusted to the wire bonding area OSR1 using the mark MK1 as a reference without being affected by the displacement of the opening OP1.

Figure 22:
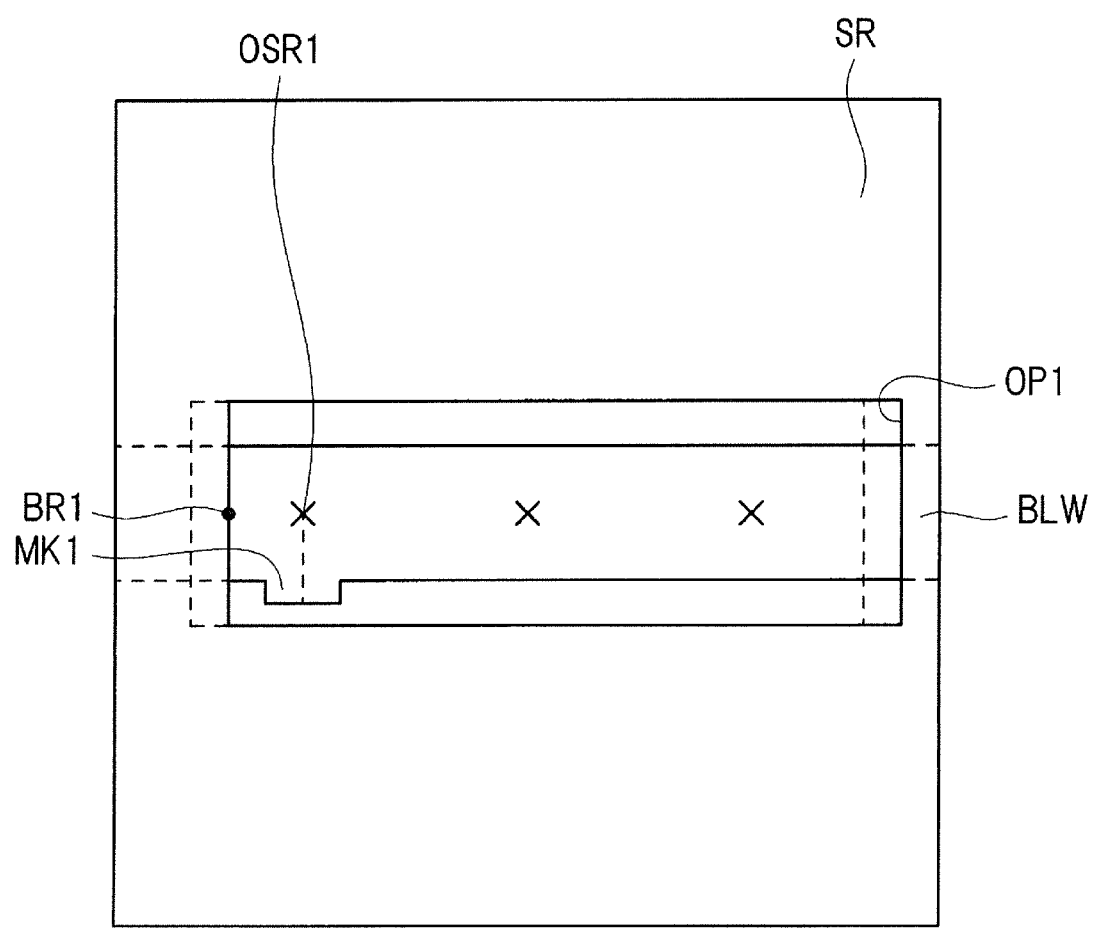
FIG. 22 is a view showing a semiconductor device in which an opening formed in the solder resist is shifted to the right from the design value.

A description will be given of the case where, in a state in which such visual alignment has been performed, a wire bonding step is performed for another semiconductor device. FIG. 22 is a schematic diagram showing a state in which the wire bonding step is performed for another semiconductor device other than the semiconductor device subjected to the visual alignment.

For example, in FIG. 22, the semiconductor device is shown in which the opening OP1 formed in the solder resist SR is shifted to the right from the design value.

As described above, when the visual alignment is performed using the semiconductor device in which the opening OP1 is formed at a position shifted to the left, in the related art technology, the coordinate position of the bonding area is displaced from the ideal bonding area OSR1 to be adjusted to the bonding area BR1. In this case, in a wire bonding step for the semiconductor device in which the opening OP1 is shifted to the right from the design value as shown in FIG. 22, the wire bonding area BR1 overlaps the left end of the opening OP1 so that wire bonding cannot be normally performed.

By contrast, in Embodiment 1, the alignment is performed using, e.g., the mark MK1 as a reference so that the coordinate position of the bonding area is adjusted to the ideal bonding area OSR1. In this case, in a semiconductor device in which the opening OP1 is shifted to the right from the design value as shown in FIG. 22 also, it is possible to ensure a distance from the left end of the opening OP1 for the wire bonding area OSR1. Therefore, wire bonding can be normally performed. That is, when the alignment is performed using the mark MK1 as a reference as in Embodiment 1, the position of the wire bonding area OSR1 can be precisely adjusted without being affected by dimensional variations and positional variations in the opening OP1.

Thus, in an adjustment method in which, e.g., the coordinate position of the wire bonding area is adjusted using the left end of the opening OP1 formed in the solder resist SR as a reference as used in the related art technology, the adjustment is susceptible to the influence of the displacement of the opening OP1 formed in the solder resist SR. That is, in the visual alignment in the related art technology, the possibility increases that a situation is encountered in which, even though the visual alignment is performed, the wire W cannot be coupled to the adjusted wire bonding area.

By contrast, in Embodiment 1, the coordinate position of the wire bonding area is adjusted using not the end portion of the opening OP1 formed in the solder resist SR, but the mark MK1 formed correspondingly to the wire bonding area as a reference. Therefore, according to the alignment in Embodiment 1, the position of the wire bonding area OSR1 can be precisely adjusted without being affected by the displacement of the opening OP1 formed in the solder resist SR. As a result, according to Embodiment 1, the reliability of the wire bonding step can be improved.

Figure 23:
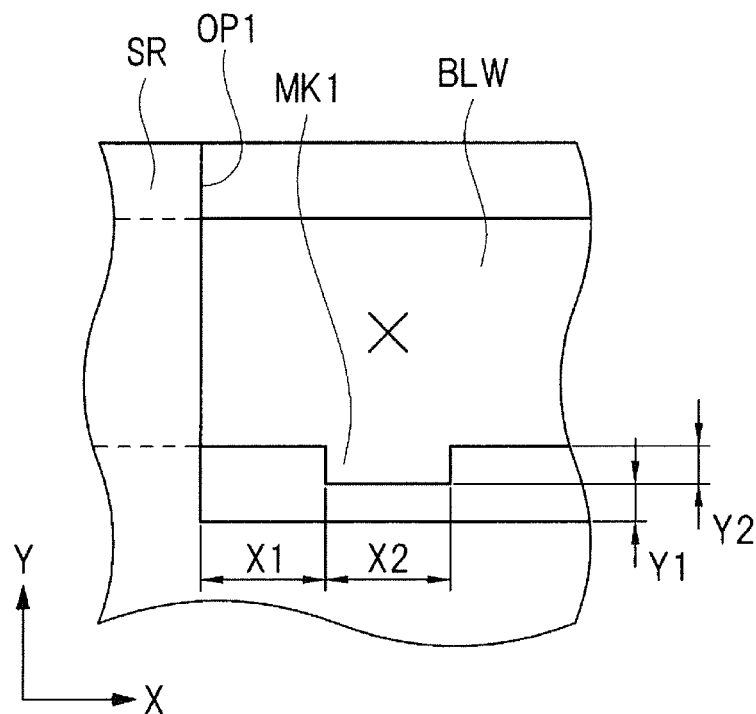
FIG. 23 is a view showing the partial area of the belt-like wiring exposed from the opening and the mark in enlarged relation.

Subsequently, a description will be given of the position of the mark MK1 formed correspondingly to the wire bonding area. FIG. 23 is a view showing the partial area of the belt-like wiring BLW exposed from the opening OP1 and the mark MK1 in enlarged relation. The position at which the mark MK1 is formed shown in FIG. 23 is set based on the accuracy of displacement of the opening OP1 formed in the solder resist SR. For example, when the position of the mark MK1 is excessively close to the end portion of the opening OP1, even if the wire bonding area is set based on the mark MK1, the wire bonding area may conceivably overlap the end portion of the opening OP1 depending on the magnitude of the displacement of the opening OP1. That is, even though the wire bonding area is adjusted using the mark MK1 as a reference mark, when the position at which the mark MK1 is formed is within the acceptable range of the accuracy of displacement of the opening OP1, the wire bonding area adjusted based on the mark MK1 may overlap the end portion of the opening OP1, and wire bonding may not be able to be normally performed.

Accordingly, in Embodiment 1, it is preferable that the distance between the end portion of the opening OP1 and the position at which the mark MK1 is formed is set larger than the acceptable range of the accuracy of displacement of the opening OP1. In this case, when the wire bonding area is set based on the mark MK1, it is possible to prevent the wire bonding area from overlapping the end portion of the opening OP1. As a result, normal wire bonding can be performed on the wire bonding area adjusted based on the mark MK1.

For example, as shown in FIG. 23, a distance X1 between the end portion of the opening OP1 and the left end of the mark MK1 can be adjusted to be not less than 50 µm. In this case, since the accuracy of displacement of the opening OP1 is, e.g., about ±30 µm, by adjusting the distance X1 between the end portion of the opening OP1 and the left end of the mark MK1 in the X-direction to a value of not less than 50 µm, it is possible to effectively prevent the wire bonding area adjusted based on the mark MK1 from overlapping the end portion of the opening OP1.

The mark MK1 can be formed to have, e.g., a rectangular shape, a width X2 in the X-direction of, e.g., not less than 50 µm, and a width Y2 in the Y-direction of, e.g., not less than 25 µm. Here, the distance Y1 between the mark MK1 and the opening OP1 in the Y-direction can be adjusted to be, e.g., not less than 25 µm. In this case, even when the displacement of the opening OP1 in the Y-direction is 30 µm, a part of the mark MK1 can be exposed into the opening OP1.

Next, a description will be given of a further advantage of providing the mark MK1. In terms of normally performing the wire bonding step, it can be considered to perform camera recognition for each of the semiconductor devices in addition to visual alignment to further adjust the coordinate position of the wire bonding area for each of the semiconductor devices. However, as described above, in the related art technology, the belt-like wiring BLW exposed from the opening OP1 has no characteristic pattern, and therefore the situation is encountered in which the adjustment of the wire bonding area based on camera recognition is difficult.

By contrast, in Embodiment 1, the mark MK1 provided correspondingly to the wire bonding area of the belt-like wiring BLW exists in the opening OP1 to serve as a characteristic pattern in camera recognition. As a result, according to Embodiment 1, the advantage that the formation of the mark MK1 allows further adjustment of the wire bonding area based on camera recognition can be obtained. A description will be given below of the advantage.

Figure 24:
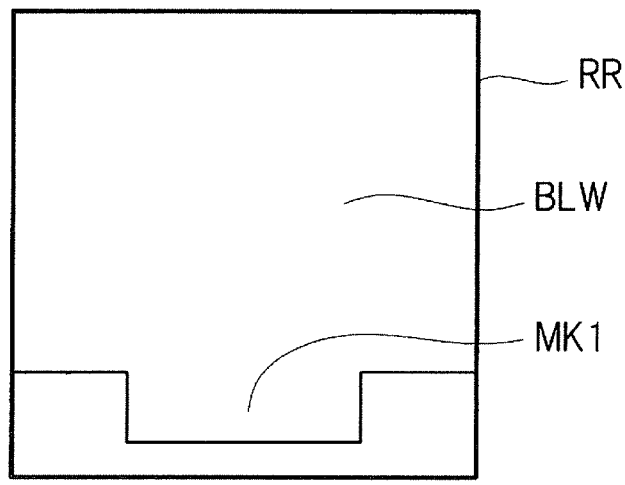
FIG. 24 is a view showing an example of a recognized pattern included in a region recognized by a camera in Embodiment 1.
Figure 25:
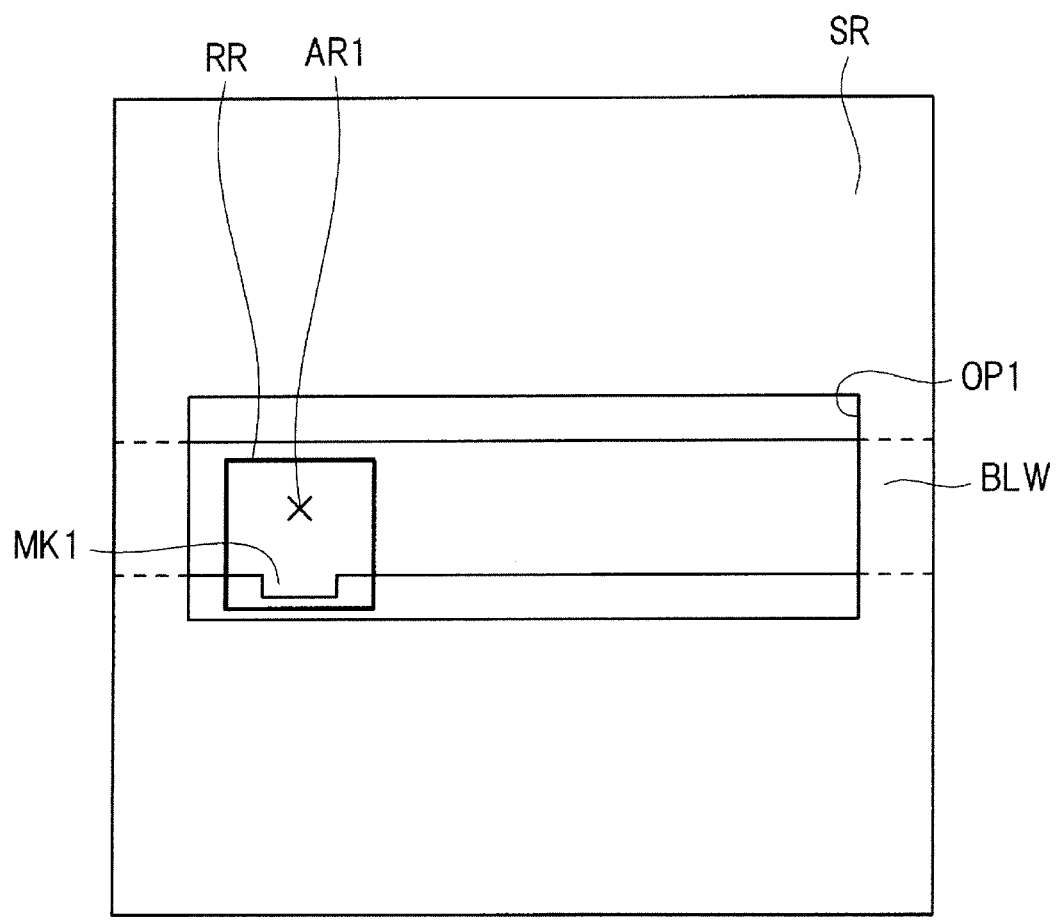
FIG. 25 is a view showing a state in which pattern recognition by means of a camera is performed on the belt-like wiring exposed from the opening formed in the solder resist.

FIG. 24 is a view showing an example of a recognized pattern included in the region RR recognized by a camera in Embodiment 1. The recognized pattern shown in FIG. 24 includes the characteristic pattern provided by the mark MK1. FIG. 25 is a view showing a state in which pattern recognition by means of a camera is performed on the belt-like wiring BLW exposed from the opening OP1 formed in the solder resist SR. In Embodiment 1, as shown in FIG. 25, the belt-like wiring BLW exposed from the opening OP1 has the mark MK1. Therefore, it will be understood that, by detecting the mark MK1, the area corresponding to the recognized pattern shown in FIG. 24 can be uniquely specified. As a result, it will be understood that, according to Embodiment 1, the mark MK1 can be detected based on camera recognition and the bonding area AR1 of the belt-like wiring BLW corresponding to the mark MK1 can be specified. Thus, in Embodiment 1, the mark MK1 serves as the characteristic pattern in camera recognition to allow the mark MK1 to be detected based on camera recognition and allow the wire bonding area corresponding to the mark MK1 to be specified. That is, in Embodiment 1, since the mark MK1 serving as the characteristic pattern is formed, it is possible to obtain the advantage that the adjustment of the wire bonding area based on camera recognition, which has been difficult in the related art technology, can be performed.

To sum up, in the semiconductor device of Embodiment 1, the mark MK1 is provided correspondingly to the bonding area of the belt-like wiring BLW exposed from the opening OP1 provided in the solder resist SR. This provides the following advantages.

(1) The first advantage in Embodiment 1 is that, in the alignment step for the wire bonding area, the coordinate position of the wire bonding area can be adjusted using not the end portion of the opening OP1 formed in the solder resist SR, but the mark MK1 formed correspondingly to the wire bonding area as a reference. As a result, the alignment in Embodiment 1 allows the position of the wire bonding area to be precisely adjusted without being affected by the displacement of the opening OP1 formed in the solder resist SR. Therefore, according to Embodiment 1, the reliability of the wire bonding step can be improved.

(2) The second advantage in Embodiment 1 is that, since the mark MK1 serving as the characteristic pattern is formed in the semiconductor device in Embodiment 1, the adjustment of the wire bonding area based on camera recognition, which has been difficult in the related art technology, can be performed. Thus, due to the combined effects of the first and second advantages described above, Embodiment 1 can achieve a more significant improvement in the reliability of the wire bonding step than achieved by the related art technology.

<Manufacturing Method of Semiconductor Device in Embodiment 1>

The semiconductor device in Embodiment 1 is configured as described above. Referring to the drawings, a description will be given below of the manufacturing method thereof.

Figure 26:
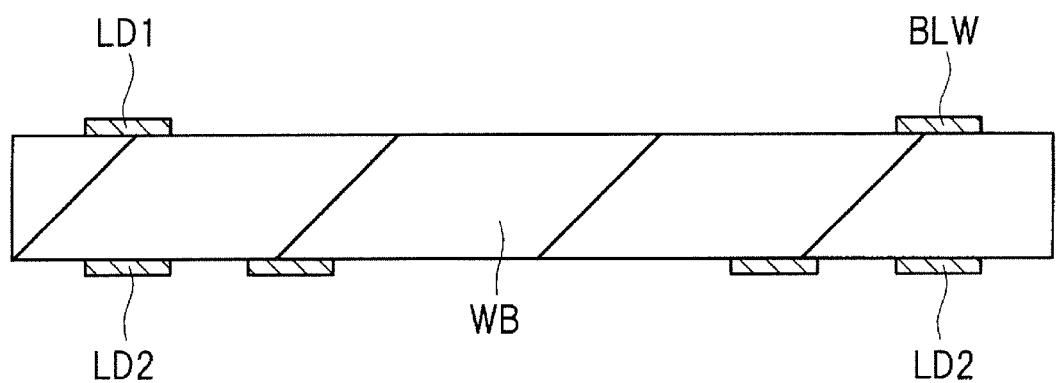
FIG. 26 is a cross-sectional view showing a manufacturing step of a semiconductor device in Embodiment 1.
Figure 27:
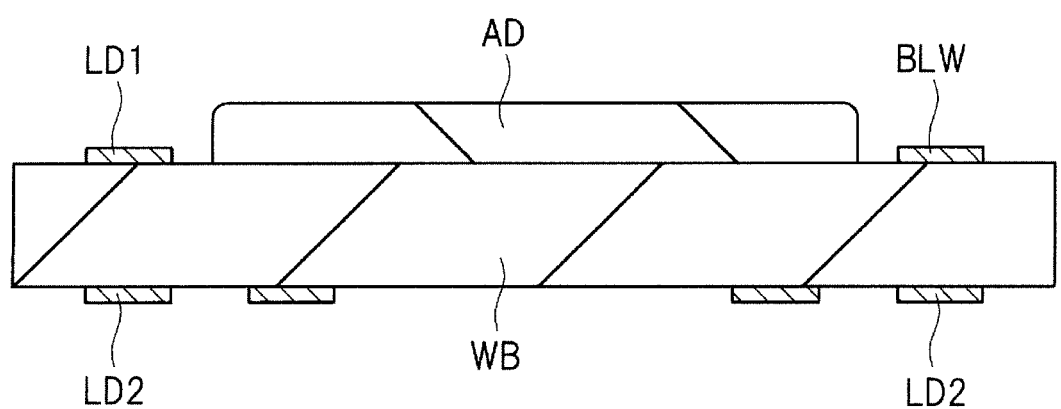
FIG. 27 is a cross-sectional view showing a manufacturing step of the semiconductor device, which is subsequent to FIG. 26.
Figure 28:
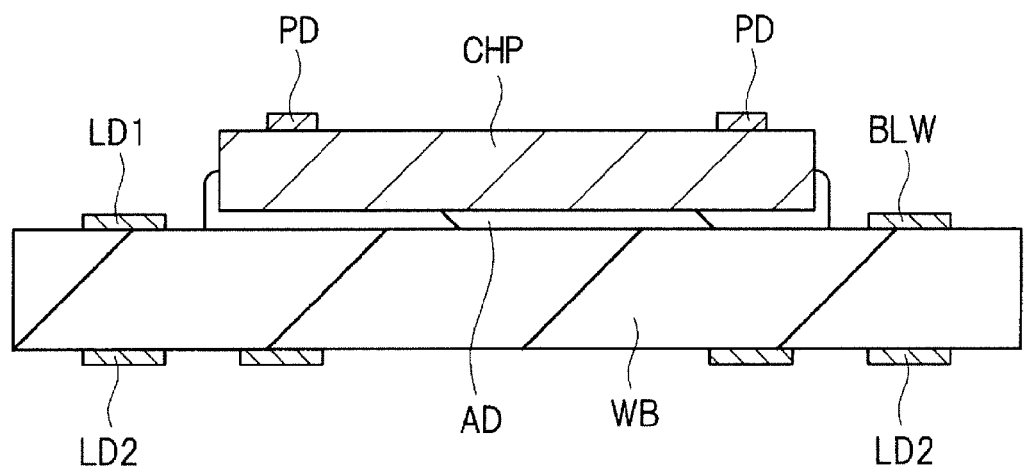
FIG. 28 is a cross-sectional view showing a manufacturing step of the semiconductor device, which is subsequent to FIG. 27.

First, as shown in FIG. 26, the wiring board WB is provided which has the plurality of leads LD1 and the belt-like wiring BLW each formed over the top surface thereof, and the plurality of leads LD2 formed over the back surface thereof opposite to the top surface. Then, as shown in FIG. 27, to the chip mounting portion (chip mounting region) present in the top surface of the wiring board WB, the adhesive AD is applied. Thereafter, as shown in FIG. 28, the semiconductor chip CHP is mounted over the chip mounting portion of the wiring board WB via the adhesive AD applied thereto (die bonding step). In the die bonding step, when the semiconductor chip CHP is mounted over the wiring board WB, heating treatment is performed. Note that the heating treatment may be performed simultaneously with or after the mounting of the semiconductor chip CHP over the wiring board WB.

Figure 29:
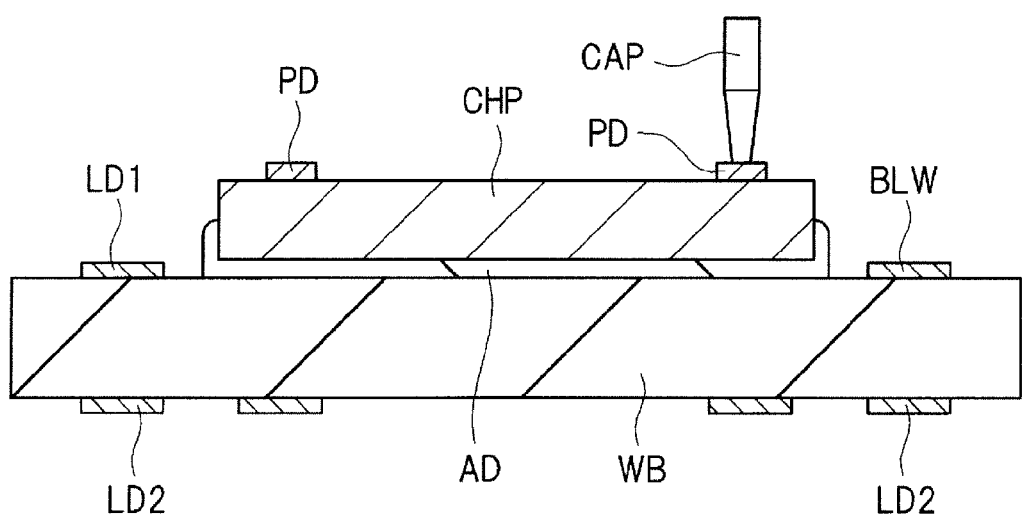
FIG. 29 is a cross-sectional view showing a manufacturing step of the semiconductor device, which is subsequent to FIG. 28.
Figure 30:
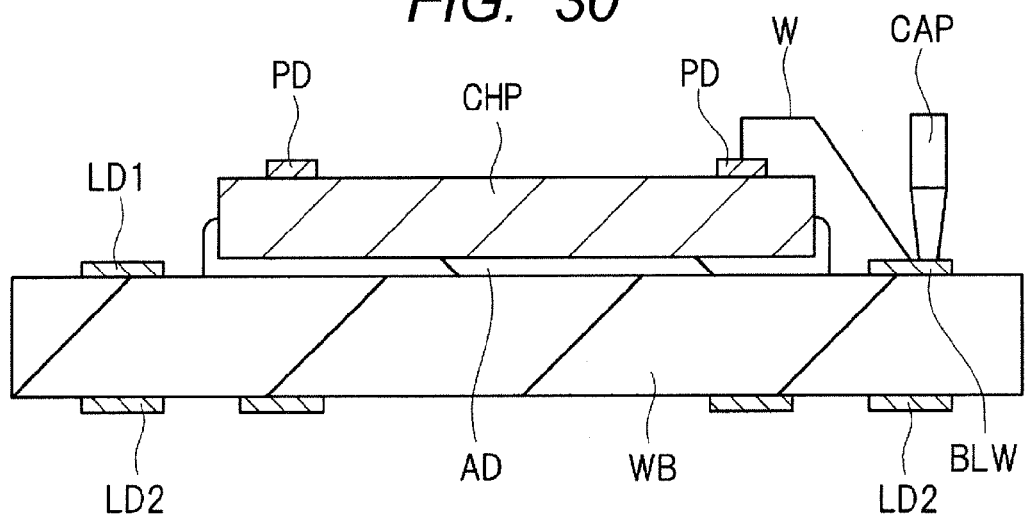
FIG. 30 is a cross-sectional view showing a manufacturing step of the semiconductor device, which is subsequent to FIG. 29.

Subsequently, the pads PD formed in the semiconductor chip CHP are coupled to the belt-like wiring BLW and the leads LD1 each formed over the wiring board WB (wire bonding step) with wires. Specifically, as shown in FIG. 29, a capillary CAP is pressed first against each of the pads PD formed in the semiconductor chip CHP to perform first bonding. Then, as shown in FIG. 30, the capillary is moved to perform second bonding of the wires W to the belt-like wiring BLW formed over the wiring board WB. In this manner, the pads PE formed in the semiconductor chip can be electrically coupled to the belt-like wiring BLW formed over the wiring board WB with the wires W. Likewise, the pads PD formed in the semiconductor chip CHP can be electrically coupled to the leads LD1 formed over the wiring board WB with the wires W.

Figure 31:
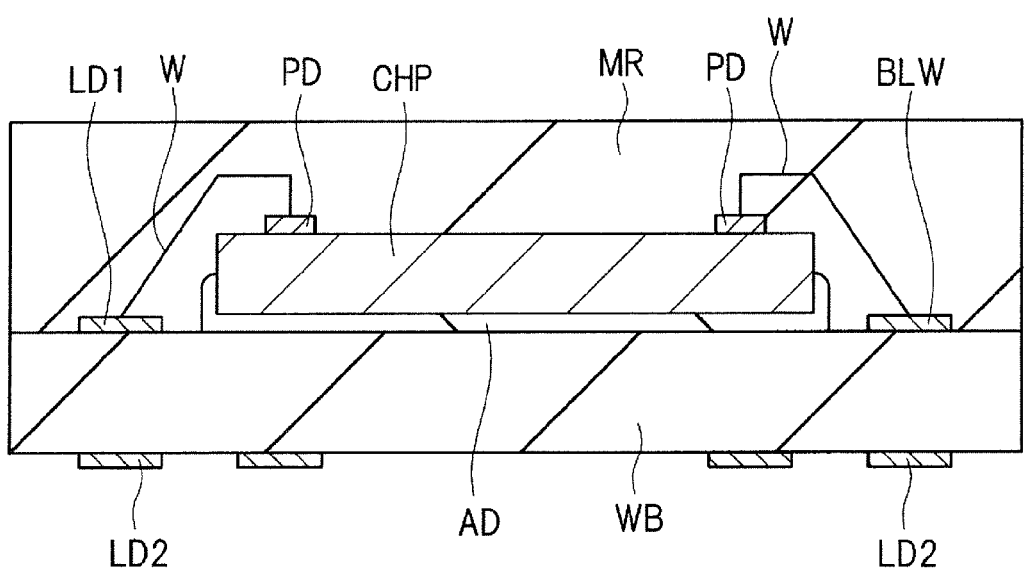
FIG. 31 is a cross-sectional view showing a manufacturing step of the semiconductor device, which is subsequent to FIG. 30.
Figure 32:
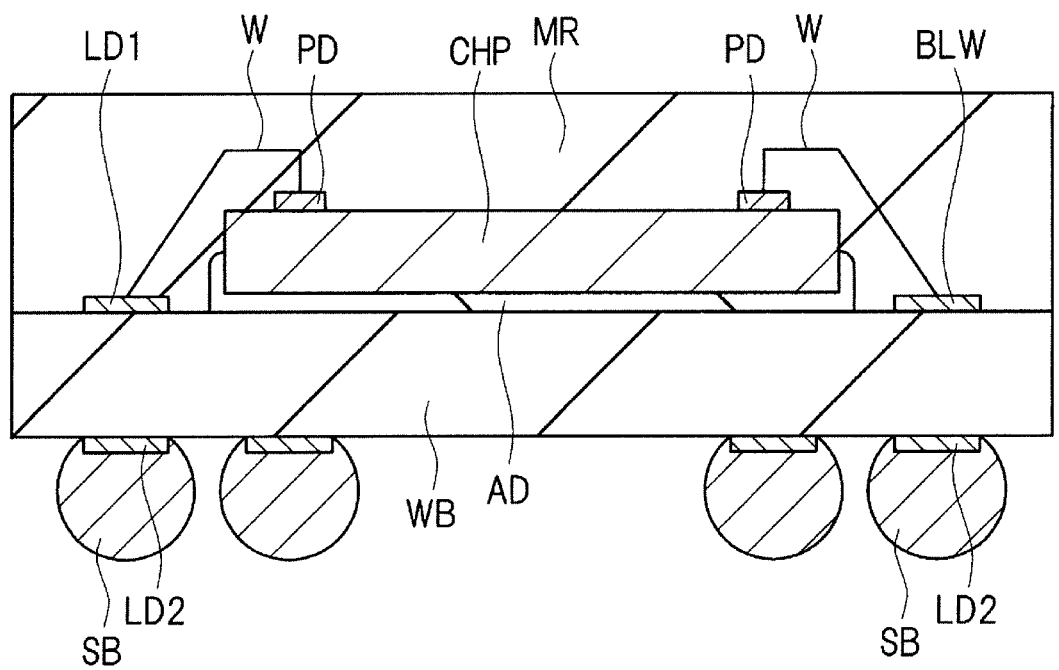
FIG. 32 is a cross-sectional view showing a manufacturing step of the semiconductor device, which is subsequent to FIG. 31.

Next, as shown in FIG. 31, the sealing body made of, e.g., the resin MR is formed so as to cover the semiconductor chip CHP, the wires W, and the top surface of the wiring board WB (molding step). Then, as shown in FIG. 32, to the leads LD2 formed over the back surface of the wiring board WB, the solder balls (external coupling terminals) SB made of, e.g., a solder are attached (solder ball attaching step). In this manner, the semiconductor device in the present embodiment can be manufactured. Note that the completed semiconductor device is mounted over a mounting board (such as a mother board) to be used.

<Wire Bonding Step in Embodiment 1>

Referring to the drawings, a description will be given below of the details of the wire bonding step described above. Specifically, the description will be given of the wire bonding step in Embodiment 1 which takes the first and second advantages into account.

Figure 33:
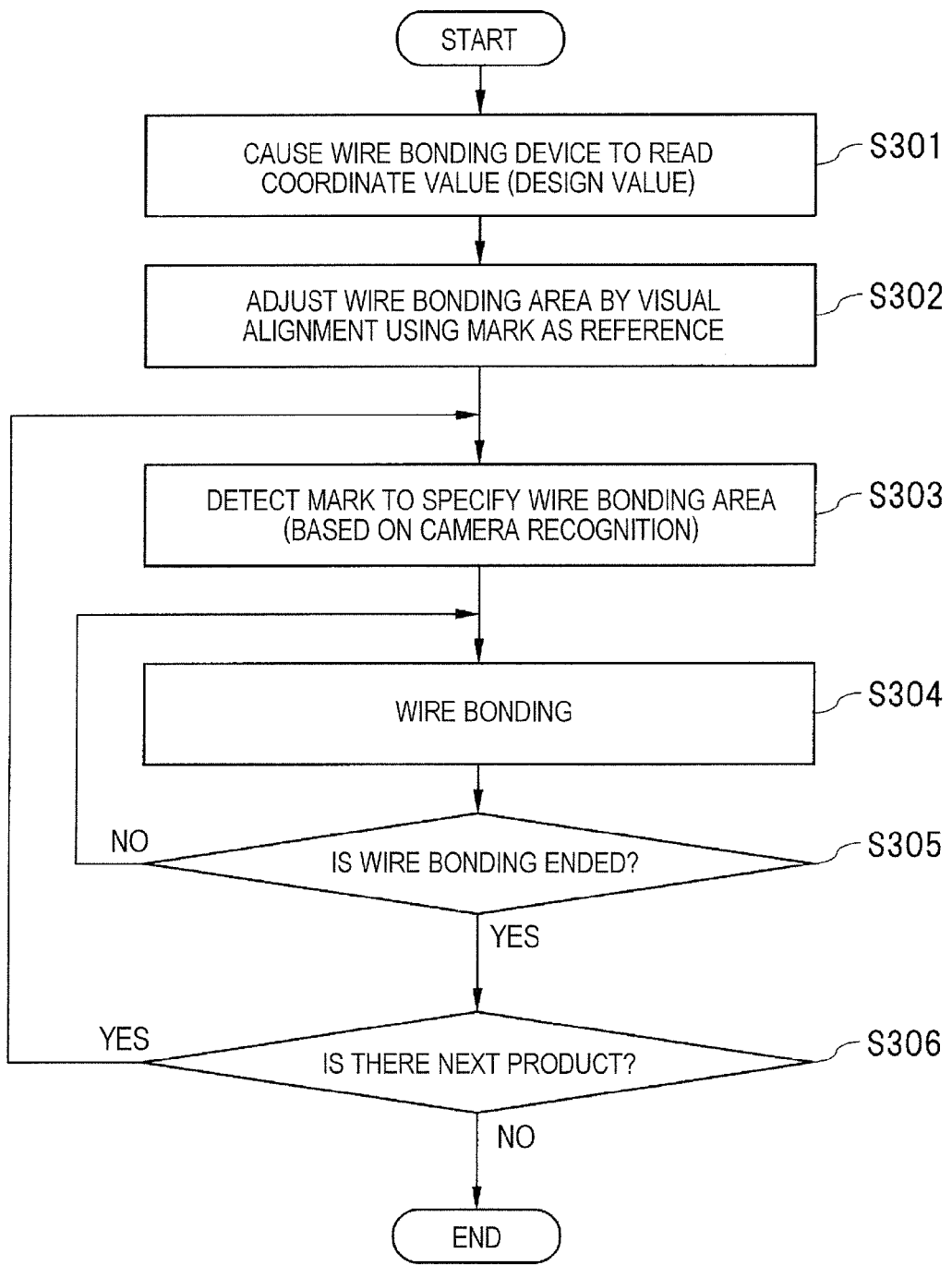
FIG. 33 is a view showing the flow of a wire bonding step in Embodiment 1.

FIG. 33 is a flow chart showing the flow of the wire bonding step in Embodiment 1. First, for example, the wire bonding device is caused to read the coordinate value (design value) of the wire bonding area based on CAD data (S301). Next, an arbitrary semiconductor device is extracted from among a plurality of semiconductor devices and, based on the semiconductor device, a visual alignment step is performed (S302). Specifically, using the mark exposed from the opening provided in the solder resist as a reference mark, the wire bonding area is adjusted from the design value. That is, the wire bonding area is adjusted by alignment using the mark as a reference. As a result, it is possible to effect the adjustment of the wire bonding area which reflects a finished state represented by the size and position of the opening of a real semiconductor device. That is, necessary adjustment is performed by the visual alignment step from the design value of the wire bonding area based on the CAD data such that the wire bonding area corresponds to the finished state of the real semiconductor device.

At this time, in Embodiment 1, the coordinate position of the wire bonding area is adjusted using not the end portion of the opening, but the mark formed correspondingly to the wire bonding area as a reference. As a result, with the alignment step in Embodiment 1, the position of the wire bonding area can be precisely adjusted without being affected by the displacement of the opening formed in the solder resist.

Thus, the alignment step in Embodiment 1 can be performed. The adjustment of the wire bonding area adjusted in the alignment step is also reflected in the wire bonding step for the plurality of semiconductor devices other than the extracted semiconductor device.

Subsequently, wire bonding is performed for the plurality of semiconductor devices. In the plurality of semiconductor devices other than the specified semiconductor device used in the alignment step also, the necessary adjustment based on the alignment step which has been performed from the design value of the wire bonding area based on the CAD data is reflected. As a result, it can be considered that the wire bonding step reflecting the finished state of the real semiconductor device can be performed.

In particular, in Embodiment 1, the coordinate position of the wire bonding area is adjusted using the mark formed correspondingly to the wire bonding area as a reference. Consequently, even in the plurality of semiconductor devices other than the specified semiconductor device used in the alignment step, the position of the wire bonding area is precisely adjusted without being affected by the displacement of the opening formed in the solder resist.

However, it can be considered that, in an actual situation, the finished state of the specified semiconductor device used in the alignment step may be subtly different from the finished states of the semiconductor devices other than that. With regard to this point, in the semiconductor device in Embodiment 1, the mark serving as the characteristic pattern is formed to allow fine adjustment of the wire bonding area based on camera recognition, which has been difficult in the related art technology, to be performed. Thus, in Embodiment 1, by taking the advantage that the camera recognition is applicable thereto, fine adjustment of the wire bonding area based on camera recognition is performed for each of the semiconductor devices.

Specifically, in Embodiment 1, in the target semiconductor device to be subjected to the wire bonding step, the mark is detected based on camera recognition to perform fine adjustment from the wire bonding area adjusted in the alignment step and specify the wire bonding area reflecting the finished state of the target semiconductor device (S303).

Thereafter, based on the position of the specified wire bonding area, the pads formed in the semiconductor chip are coupled to the specified wire bonding area of the belt-like wiring with wires (S304). When the coupling of all the wires present in the target semiconductor device is not ended, the wire bonding step is continuously performed (S305). On the other hand, when the coupling of all the wires present in the target semiconductor device is ended, the wire bonding step for the target semiconductor device is ended (S305).

Then, the wire bonding step for the next semiconductor device is performed (S306). Specifically, by detecting the mark based on camera recognition, fine adjustment is performed from the wire bonding area adjusted in the alignment step to specify the wire bonding area reflecting the finished state of the target semiconductor device (S303).

Thereafter, based on the position of the specified wire bonding area, the pads formed in the semiconductor chip are coupled to the specified wire bonding area of the belt-like wiring with wires (S304). When the coupling of all the wires present in the target semiconductor device is not ended, the wire bonding step is continuously performed (S305). On the other hand, when the coupling of all the wires present in the target semiconductor device is ended, the wire bonding step for the target semiconductor device is ended (S305). By repeating the foregoing steps, the wire bonding steps can be performed for the plurality of semiconductor devices. Thus, the wire bonding steps can be performed for the plurality of semiconductor devices.

The flow of the wire bonding step in Embodiment 1 is as described above. Referring to FIGS. 34 to 37, the wire bonding step in Embodiment 1 will be further described.

For example, FIGS. 34 to 37 show a state in which the wire bonding step is performed for another semiconductor device other than the semiconductor device used in the alignment step. First, in FIG. 34, wire bonding areas CAD1 to CAD3 based on the CAD data are indicated by the solid circles and wire bonding areas OSR1 to OSR3 reflecting the necessary adjustment based on the alignment step are indicated by the broken-line cross marks. That is, in the target semiconductor device of FIG. 34 also, the necessary adjustment based on the alignment step which has been performed from the design value of the wire bonding area based on the CAD data is reflected.

Figure 34:
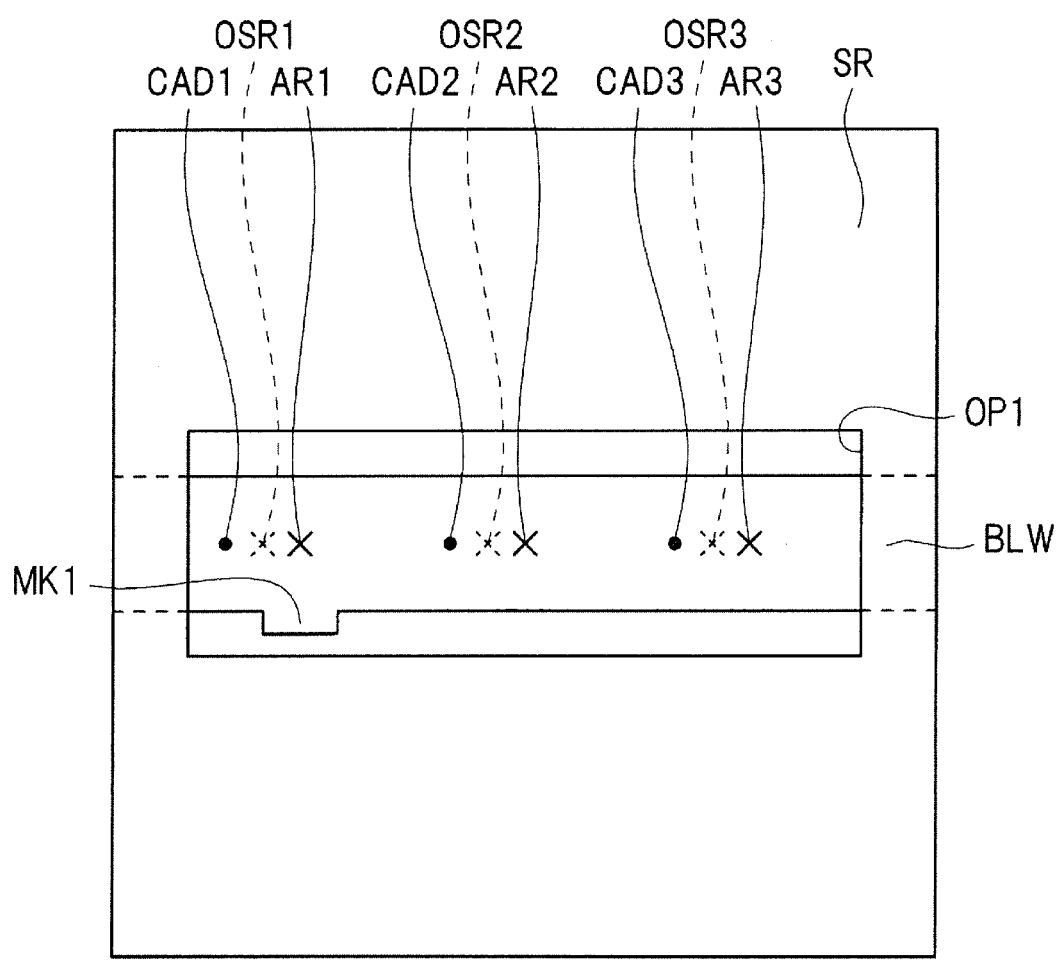
FIG. 34 is a view showing the wire bonding step in Embodiment 1.

However, it is assumed that, in an actual situation, the finished state of the specified semiconductor device used in the alignment step is subtly different from the finished state of the target semiconductor device of FIG. 34. Accordingly, in the target semiconductor device of FIG. 34 also, fine adjustment of the wire bonding area based on camera recognition has been performed.

Specifically, in the target semiconductor device of FIG. 34, by detecting the mark MK1 based on camera recognition, fine adjustment is performed from the wire bonding area OSR1 adjusted in the alignment step to specify the wire bonding area AR1 reflecting the finished state of the target semiconductor device. That is, based on the position of the mark MK1 detected based on camera recognition, the wire bonding area AR1 is specified.

Note that the wire bonding areas AR2 and AR3 are specified by considering the design distances thereof from the specified wire bonding area AR1. Specifically, the wire bonding area AR2 is set to a region away from the wire bonding area AR1 by a predetermined first distance and the wire bonding area AR3 is set to a region away from the wire bonding area AR1 by a predetermined second distance. At this time, for example, the distance (first distance) between the wire bonding areas AR1 and AR2 may be equal to the distance (second distance) between the wire bonding areas AR2 and AR3. In FIG. 34, this state is assumed. Here, the wire bonding areas AR1 to AR3 specified based on camera recognition is indicated by the solid-line cross marks.

Figure 35:
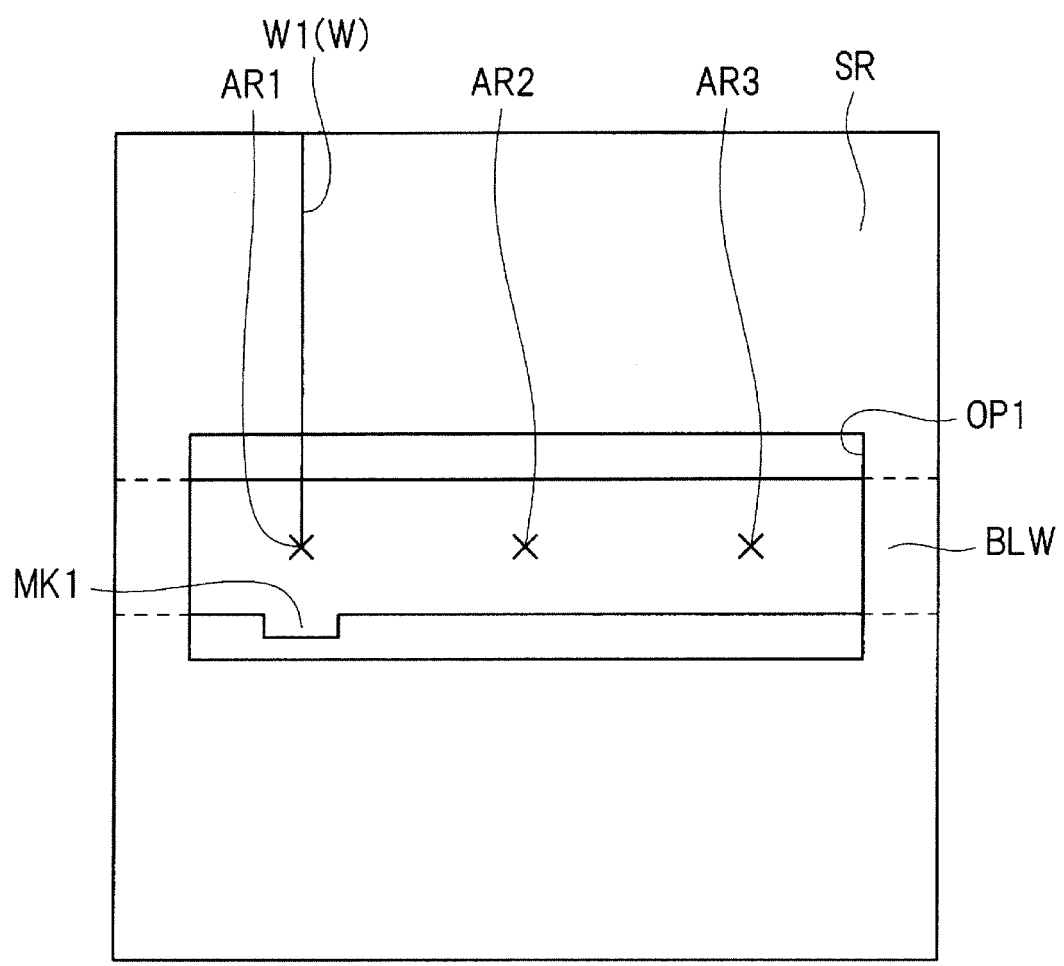
FIG. 35 is a view showing the wire bonding step, which is subsequent to FIG. 34.

Subsequently, as shown in FIG. 35, the first pad formed in the semiconductor chip not shown is electrically coupled to the wire bonding area AR1 of the belt-like wiring BLW exposed from the opening OP1 with a wire W1.

At this time, in Embodiment 1, in the alignment step for the wire bonding area, the coordinate position of the wire bonding area is adjusted using not the end portion of the opening OP1 formed in the solder resist SR, but the mark MK1 formed correspondingly to the wire bonding area as a reference. Therefore, according to Embodiment 1, the position of the wire bonding area can be adjusted without being affected by the displacement of the opening OP1 formed in the solder resist SR. Further, in Embodiment 1, since the mark MK1 serving as the characteristic pattern is formed, the adjustment of the wire bonding area based on camera recognition is performed. Thus, according to Embodiment 1, by the combined effects of these characteristic features, it is possible to effectively suppress the interference between the wire W1 and the opening OP1, as shown in FIG. 35, and consequently achieve a significant improvement in the reliability of the wire bonding step.

Figure 36:
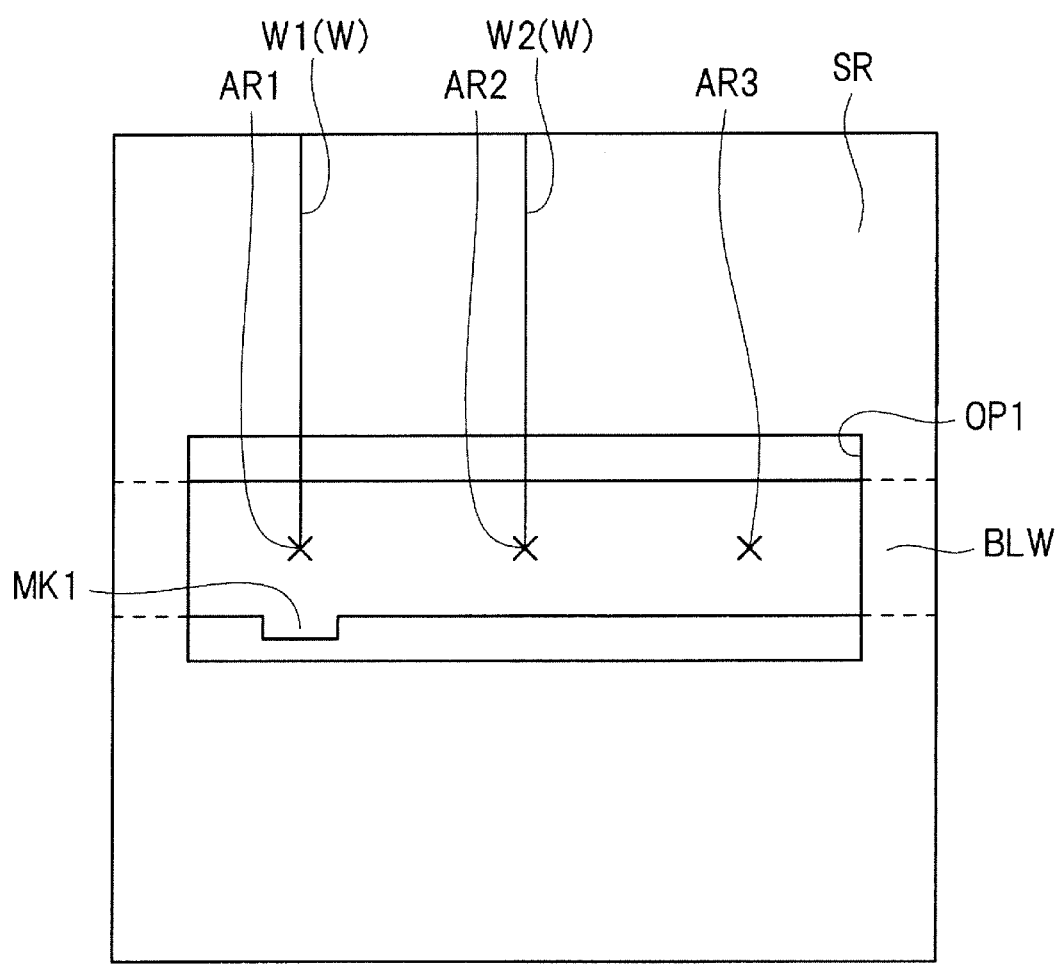
FIG. 36 is a view showing the wire bonding step, which is subsequent to FIG. 35.
Figure 37:
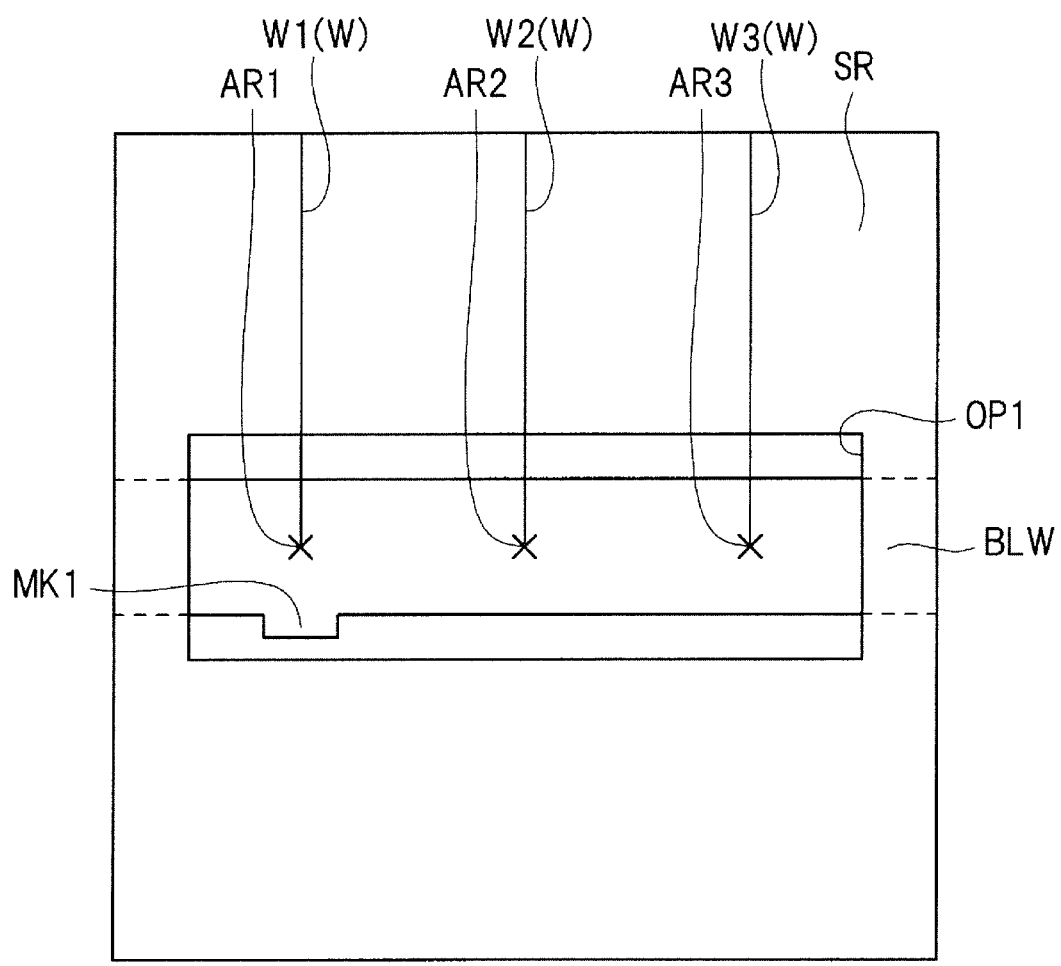
FIG. 37 is a view showing the wire bonding step, which is subsequent to FIG. 36.

Next, as shown in FIG. 36, the second pad formed in the semiconductor chip not shown is electrically coupled to the wire bonding area AR2 of the belt-like wiring BLW exposed from the opening OP1 with a wire W2. Then, as shown in FIG. 37, the third pad formed in the semiconductor chip not shown is electrically coupled to the wire bonding area AR3 of the belt-like wiring BLW exposed from the opening OP1 with a wire W3. Thus, the wire bonding step can be performed.

<Modification 1>

Figure 38:
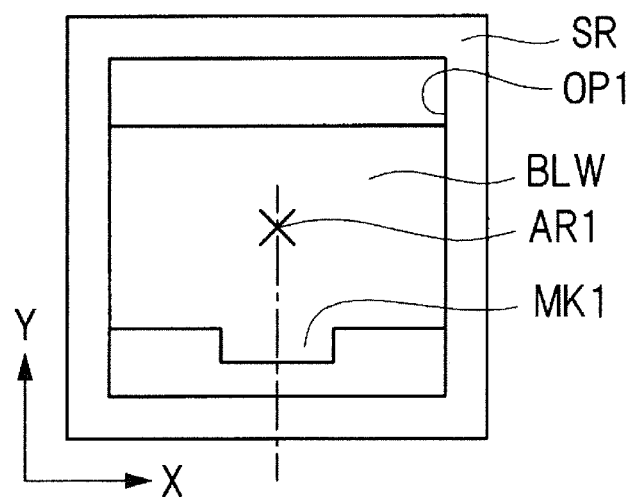
FIG. 38 is a view showing the shape of the mark in Embodiment 1.

Next, a description will be given of Modification 1 of Embodiment 1. For example, FIG. 38 is a view showing the shape of the mark MK1 in Embodiment 1. As shown in FIG. 38, from the opening OP1 formed in the solder resist SR, a part of the belt-like wiring BLW is exposed and the mark MK1 having a protruding shape is formed so as to project from the belt-like wiring BLW. That is, in Embodiment 1, the mark MK1 formed integrally with the belt-like wiring BLW to have a protruding rectangular shape is shown. The mark MK1 is provided correspondingly to the wire bonding area AR1 of the belt-like wiring BLW. For example, the mark MK1 can be placed such that the wire bonding area AR1 exists on the extension line of the center line of the mark MK1 having the rectangular shape. Note that, since, e.g., the size of the mark MK1 having the rectangular shape can be increased, the visibility of the mark MK1 can be improved. The mark MK1 can also be designed to have the same width in the X-direction as that of each of the bonding fingers (leads LD1) for signal lines. In addition, a further advantage is offered that a margin for wire coupling in the Y-direction is increased accordingly by the width of the mark MK1 in the Y-direction.

The mark MK1 has the function of specifying the wire bonding area AR1. As long as the mark MK1 has the function of specifying the wire bonding area AR1, the mark MK1 is not limited to the rectangular shape shown in FIG. 38. That is, the shape of the mark MK1 can be variously changed. A description will be given below of the modification.

Figure 39:
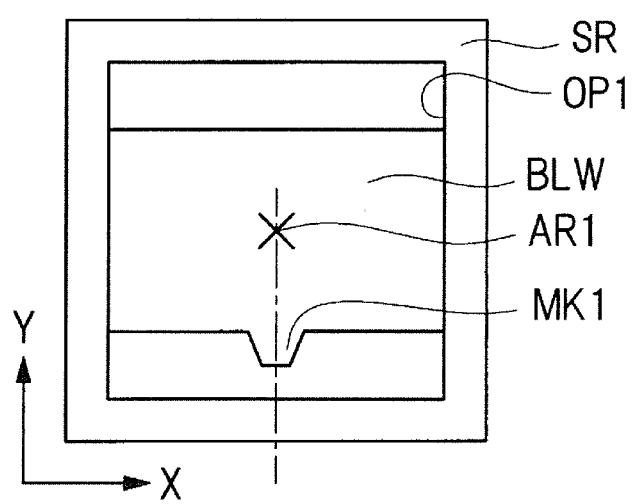
FIG. 39 is a view showing an example of the mark.

FIG. 39 is a view showing an example of the mark MK1. As shown in FIG. 39, the mark MK1 is formed integrally with the belt-like wiring BLW and can be formed to have a protruding triangular or trapezoidal shape. In this case, since the triangular shape in the vicinity of the vertex thereof or the upper side of the trapezoidal shape is narrowed, the advantage is offered that the center line passing through the center of the mark MK1 is easily specified, the wire bonding area is easily specified in the alignment step, and the wire bonding area is easily specified based on camera recognition.

Figure 40:
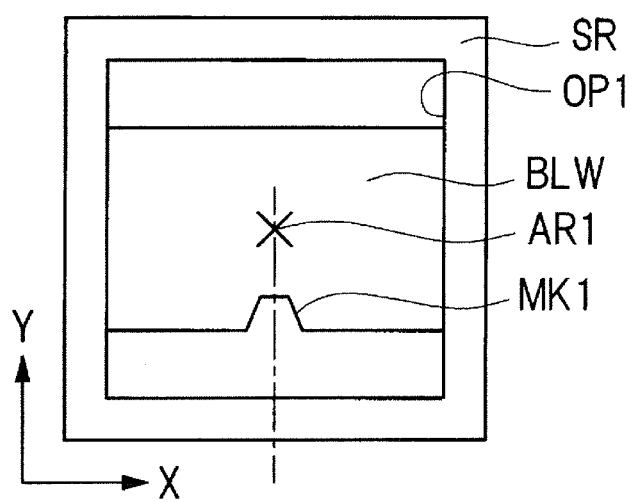
FIG. 40 is a view showing another example of the mark.

FIG. 40 is a view showing another example of the mark MK1. As shown in FIG. 40, for example, the mark MK1 can also be formed by notching a part of the belt-like wiring BLW. That is, for example, the mark MK1 is formed integrally with the belt-like wiring BLW and can also be formed to have a V-notch shape or a U-notch shape. In this case, since the vertex of the notch shape is narrowed, the advantage is offered that the center line passing through the center of the mark MK1 is easily specified, the wire bonding area is easily specified in the alignment step, and the wire bonding area is easily specified based on camera recognition. Moreover, since the mark MK1 is formed in a portion of the belt-like wiring BLW internal of those of the mark MK1 having the rectangular shape shown in FIG. 38 and the mark MK1 having the triangular or trapezoidal shape shown in FIG. 39 by notching a part of the first outer side OSD1 of the belt-like wiring BLW, there is no increase in the width of the belt-like wiring BLW. Accordingly, when the number of wires is large, it is possible to reduce the area occupied by the wires and arrange the plurality of wires at reduced intervals, which is effective in downsizing the semiconductor device.

Figure 41:
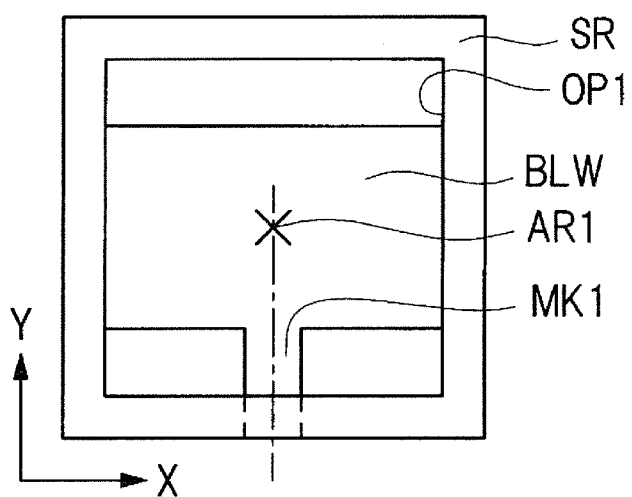
FIG. 41 is a view showing still another example of the mark.

FIG. 41 is a view showing still another example of the mark MK1. As shown in FIG. 41, for example, the mark MK1 can also be formed as a wire coupled to the belt-like wiring BLW. In this case, by reducing the width of the wire forming the mark MK1, the advantage is offered that the center line passing through the center of the mark MK1 is easily specified, the wire bonding area is easily specified in the alignment step, and the wire bonding area is easily specified based on camera recognition. In addition, it is possible to provide the mark MK1 with the function of the wire electrically coupled to the belt-like wiring BLW besides the main function of specifying the wire bonding area AR1.

In other words, the wire coupled to the belt-like wiring BLW can also be used as the mark MK1. Moreover, since the part of the wire is covered with the solder resist SR (broken-line portion of FIG. 41), it is also possible to prevent the belt-like wiring BLW from peeling from the base material of the wiring board from the mark MK1 (wire) as a starting point.

The advantage common to FIGS. 38 to 41 described above is that, since a projecting/depressed shape can be added to the belt-like wiring BLW by forming the mark MK1, the adhesion between the wiring board and the sealing body (resin) can also be improved by an anchoring effect.

Figure 42:
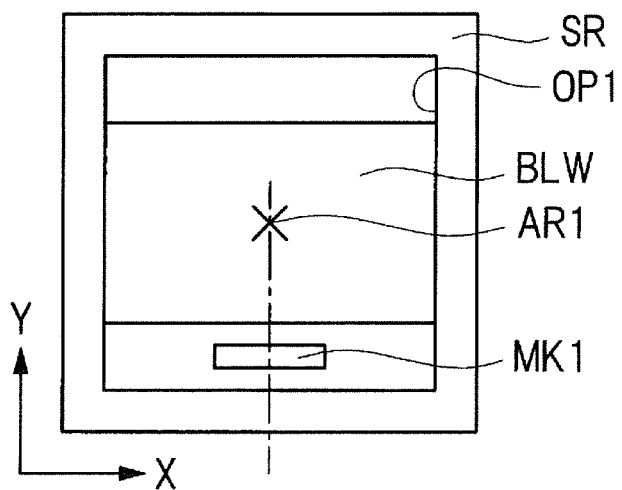
FIG. 42 is a view showing yet another example of the mark.

Note that the mark MK1 need not be formed integrally with the belt-like wiring BLW. As long as the mark MK1 has the function of specifying the wire bonding area AR1, as shown in, e.g., FIG. 42, the mark MK1 can also be formed as the mark MK1 spatially separated from the belt-like wiring BLW.

Also, the mark MK1 is preferably formed of the same material as that of the belt-like wiring BLW. This is because, as described with regard to the related art technology, since the belt-like wiring BLW and the solder resist SR are formed of different materials, it is difficult to cause a camera to focus on each of the belt-like wiring BLW and the solder resist SR due to a factor such as the reflectivity difference therebetween. As a result, if the different materials are used for the belt-like wiring BLW and the mark MK1, in the same manner as in the case described above, the situation may be revealed in which camera recognition is difficult to effect. In other words, when the belt-like wiring BLW and the mark MK1 are formed of the same metal material, an out-of-focus condition resulting from the reflectivity difference or the like can be suppressed. As a result, the accuracy of camera recognition can be improved. A further advantage of forming the belt-like wiring BLW and the mark MK1 from the same material is that, by patterning a conductor film formed over the wiring board, the belt-like wiring BLW and the mark MK1 can be formed simultaneously. This can inhibit the process of manufacturing the wiring board from being complicated by forming the mark MK1 and also inhibit a rise in the cost of manufacturing the wiring board.

<Modification 2>

Figure 43:
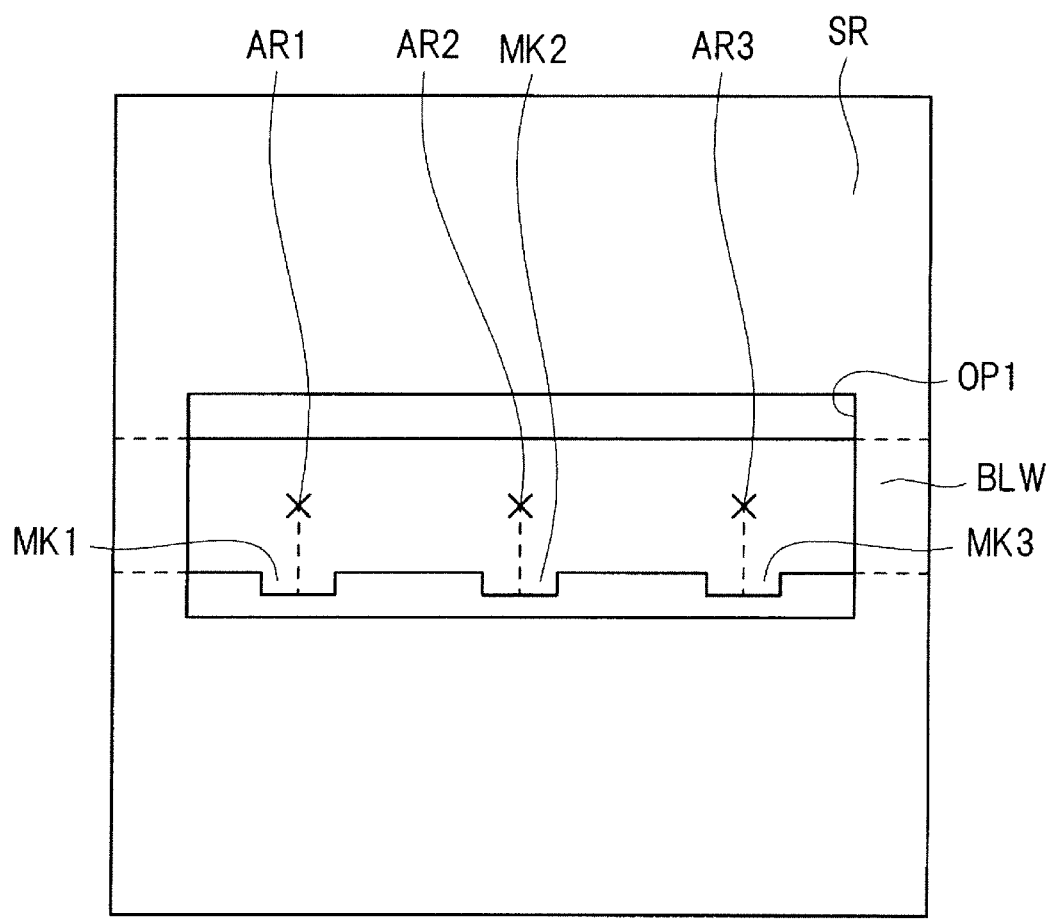
FIG. 43 is an enlarged view showing a region in the vicinity of an opening formed in a solder resist in Modification 2.

Subsequently, a description will be given of Modification 2 of Embodiment 1. FIG. 43 is an enlarged view showing a region in the vicinity of the opening OP1 formed in the solder resist SR in Modification 2. As shown in FIG. 43, in the solder resist SR, the opening OP1 is provided and, from the opening OP1, the partial area of the belt-like wiring BLW is exposed. In addition, as shown in, e.g., FIG. 43, marks MK1 to MK3 are formed in the partial area of the belt-like wiring BLW exposed from the opening OP1. That is, in Modification 2, in the belt-like wiring BLW exposed from the opening OP1, the marks MK1 to MK3 are disposed to be arranged at predetermined intervals. Specifically, in Modification 2, the mark MK1 is formed correspondingly to the wire bonding area AR1, the mark MK2 is formed correspondingly to the wire bonding area AR2, and the mark MK3 is formed correspondingly to the wire bonding area AR3.

Therefore, according to Modification 2, in the adjustment of the wire bonding areas which is performed based on camera recognition for each of the semiconductor devices, the marks MK1 to MK3 can be used. For example, it is possible to detect the mark MK1 based on camera recognition and specify the wire bonding area AR1 using the position of the detected mark MK1 as a reference. Then, in Modification 2, it is possible to detect the mark MK2 based on camera recognition and specify the wire bonding area AR2 using the position of the detected mark MK2 as a reference. Further, subsequently in Modification 2, it is possible to detect the mark MK3 based on camera recognition and specify the wire bonding area AR3 using the position of the detected mark MK3 as a reference. In this manner, wires are coupled to the specified wire bonding areas AR1 to AR3.

Thus, according to Modification 2, for example, the marks MK1 to MK3 are formed correspondingly to the three respective wire bonding areas AR1 to AR3 shown in FIG. 43. As a result, all the three wire bonding areas AR1 to AR3 can be specified using the respective marks MK1 to MK3 as a reference. That is, in Embodiment 1, as shown in, e.g., FIG. 34, the wire bonding area AR1 is specified using the position of the mark MK1 as a reference. On the other hand, the wire bonding areas AR2 and AR3 are not specified using the positions of the marks as a reference, but are automatically specified using the already specified wire bonding area AR1 as a reference. Accordingly, if, e.g., an error occurs in the wire bonding area AR1 which is set based on the position of the mark MK1, the error is undesirably reflected in the wire bonding areas AR2 and AR3.

By contrast, in Modification 2, the wire bonding areas AR1 to AR3 are each specified individually and independently based on the positions of the marks MK1 to MK3 corresponding thereto. Accordingly, even if, e.g., an error occurs in the specification of the wire bonding area AR1, the error does not affect the specification of the wire bonding areas AR2 and AR3. Therefore, according to Modification 2, the independency of each of the wire bonding areas AR1 to AR3 can be enhanced to allow an improvement in the accuracy of specifying the wire bonding areas AR1 to AR3. In particular, in the case where a large number of wires are coupled to the belt-like wiring BLW and the pitch between the wires decreases to increase the risk of an electrical short circuit between the wires, the foregoing characteristic feature of Modification 2 is effective. As a result, according to Modification 2, the reliability of the wire bonding step can be improved.

Note that, in Modification 2, the description has been given of the example in which the marks MK1 to MK3 are used in the adjustment of the wire bonding areas based on camera recognition performed for each of the semiconductor devices. In addition, in the adjustment of the wire bonding areas in the visual alignment step also, the marks MK1 to MK3 can be used to allow an improvement in the accuracy of the visual alignment step.

Thus, the characteristic feature of Modification 2 is that the marks are formed correspondingly to the plurality of individual wire bonding areas. This can achieve an improvement in the reliability of the wire bonding step. Additionally, according to Modification 2, since the marks are formed correspondingly to the plurality of individual wire bonding areas, the projecting/depressed shapes formed in the belt-like wiring BLW are increased. As a result, it is also possible to obtain the effect of increased adhesion between the wiring board and the sealing body (resin) due to the anchoring effect.

<Modification 3>

Figure 44:
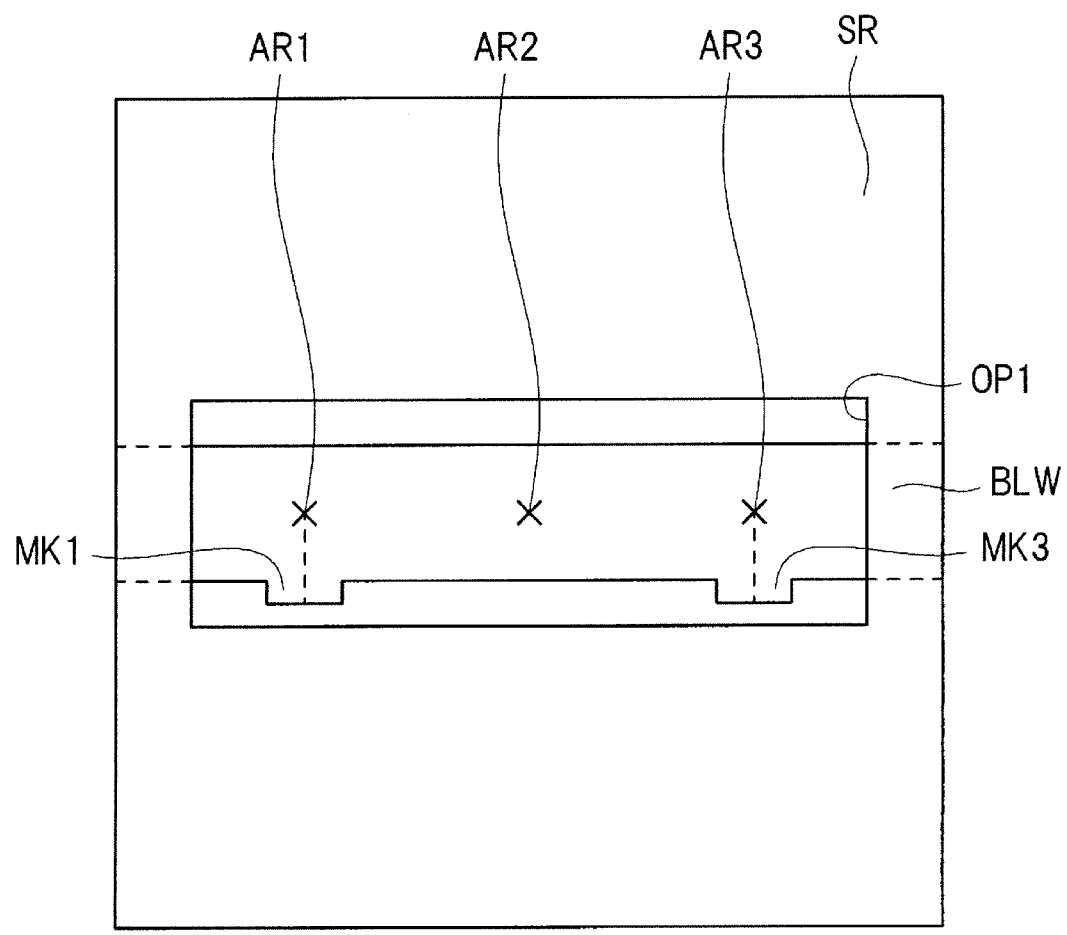
FIG. 44 is an enlarged view showing a region in the vicinity of an opening formed in a solder resist in Modification 3.

Next, a description will be given of Modification 3 of Embodiment 1. FIG. 44 is an enlarged view showing a region in the vicinity of the opening OP1 formed in the solder resist SR in Modification 3. As shown in FIG. 44, in the solder resist SR, the opening OP1 is provided and, from the opening OP1, the partial area of the belt-like wiring BLW is exposed. In addition, as shown in, e.g., FIG. 44, the marks MK1 and MK3 are formed in the partial area of the belt-like wiring BLW exposed from the opening OP1. That is, in Modification 3, in the belt-like wiring BLW exposed from the opening OP1, the marks MK1 to MK3 are arranged at a predetermined interval Specifically, in Modification 3, the mark MK1 is formed correspondingly to the wire bonding area AR1, and the mark MK3 is formed correspondingly to the wire bonding area AR3. Note that, in Modification 3, a mark corresponding to the wire bonding area AR2 is not formed.

Therefore, according to Modification 3, in the adjustment of the wire bonding areas which is performed based on camera recognition for each of the semiconductor devices, the marks MK1 and MK3 can be used. For example, it is possible to detect the mark MK1 based on camera recognition and specify the wire bonding area AR1 using the position of the detected mark MK1 as a reference. Then, the wire bonding area AR2 is not specified using the position of a mark as a reference, but can be automatically specified using the design difference from the already specified wire bonding area AR1 or the like as a reference. Subsequently, the mark MK3 is detected based on camera recognition and, using the position of the detected mark MK3 as a reference, the wire bonding area AR3 can be specified. In this manner, wires are coupled to the specified wire bonding areas AR1 to AR3.

For example, in Modification 2 described above, as shown in FIG. 43, the marks MK1 to MK3 are formed correspondingly to the three respective wire bonding areas AR1 to AR3. In this case, it is necessary to perform camera recognition on each of the marks MK1 to MK3, and there is concern about a reduction in the throughput of the wire bonding step.

Accordingly, in Modification 3, the marks MK1 to MK3 are not formed correspondingly to the respective wire bonding areas AR1 to AR3, but the marks MK1 and MK3 are formed correspondingly to the wire bonding areas AR1 and AR3, while a mark corresponding to the wire bonding area AR2 is not formed. That is, the characteristic feature of Modification 3 is that the marks are formed correspondingly to some of the wire bonding areas.

As a result, the wire bonding areas AR1 and AR3 are specified individually and independently based on the positions of the marks MK1 and MK3 corresponding thereto. Accordingly, even if an error occurs in, e.g., the specification of the wire bonding area AR1, the error does not affect the specification of the wire bonding area AR3. Therefore, according to Modification 3, the independency of each of the wire bonding areas AR1 and AR3 can be enhanced to allow an improvement in the accuracy of specifying the wire bonding areas AR1 and AR3. As a result, according to Modification 3 also, the reliability of the wire bonding step can be improved.

On the other hand, in Modification 3, a mark corresponding to the wire bonding area AR2 is not formed. That is, the wire bonding area AR2 is not specified using the position of a mark as a reference, but is automatically specified using the design distance from the already specified wire bonding area AR1 or the like as a reference. As a result, according to Modification 3, the frequency with which camera recognition is performed can be reduced compared to the case where the marks are formed correspondingly to the three respective wire bonding areas AR1 to AR3. This can suppress a reduction in the throughput of the wire bonding step.

Note that, in Modification 3, a description has been given of the example in which, in the adjustment of the wire bonding areas performed based on camera recognition for each of the semiconductor devices, the marks MK1 and MK3 are used. In addition, in the adjustment of the wire bonding areas in the visual alignment step also, the marks MK1 and MK3 can be used to allow an improvement in the accuracy of the visual alignment step.

Additionally, according to Modification 3, since the marks are formed correspondingly to the plurality of individual wire bonding areas, the projecting/depressed shapes formed in the belt-like wiring BLW are increased. As a result, it is also possible to obtain the effect of increased adhesion between the wiring board and the sealing body (resin) due to the anchoring effect.

Embodiment 2

Layout Configuration of Wiring Board

Figure 45:
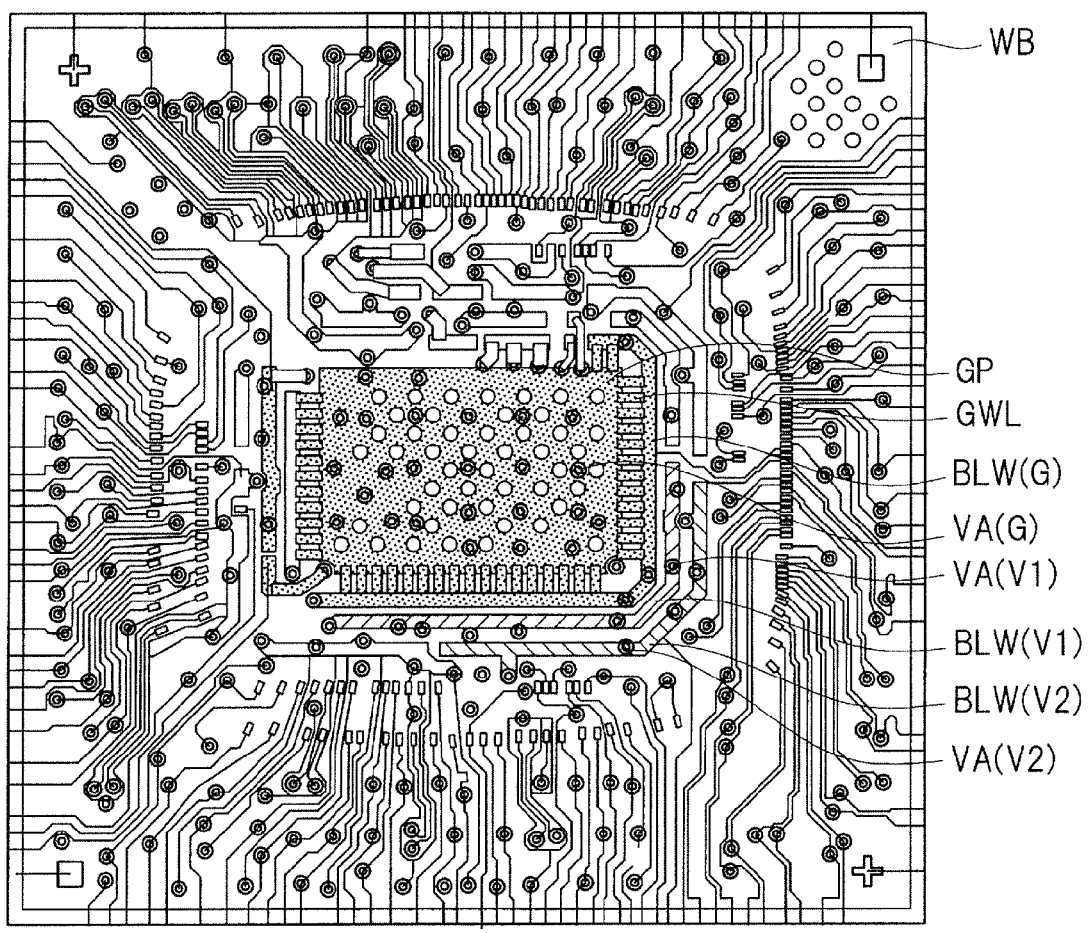
FIG. 45 is a view showing a layout configuration of the main surface of a wiring board used in a semiconductor device in Embodiment 2.

FIG. 45 is a view showing a layout configuration of the main surface (top surface) of the wiring board WB used in a semiconductor device in Embodiment 2. As shown in FIG. 45, the wiring board WB in Embodiment 2 has a rectangular shape, and a GND plane (plane wiring) GP having a rectangular shape is formed in the middle portion thereof. To the GND plane GP, a reference potential (GND potential or ground potential) is supplied through vias VA(G) and, over the GND plane GP, a semiconductor chip is mounted. That is, the GND plane GP and the semiconductor chip are placed so as to overlap each other in planar view.

Around the GND plane GP, a belt-like wiring BLW(G) is placed along the outer edge of the GND plane GP. At this time, over the GND plane GP, the semiconductor chip having a rectangular shape is mounted. Accordingly, it can also be said that the belt-like wiring BLW(G) is placed around the semiconductor chip along the outer edge of the semiconductor chip. The GND plane GP is electrically coupled to the belt-like wiring BLW(G) with a plurality of coupling wires GWL. Accordingly, to the belt-like wiring BLW(G) also, the reference potential is applied. Additionally, to the belt-like wiring BLW(G) also, the vias VA(G) are coupled.

Outside the belt-like wiring BLW(G), a belt-like wiring BLW(V1) is placed so as to be parallel with, e.g., the belt-like wiring BLW(G). To the belt-like wiring BLW(V1), vias VA(V1) are coupled. The belt-like wiring BLW(V1) is configured such that, the through vias VA(V1), a first power source potential is supplied. Outside the belt-like wiring BLW(V1), a belt-like wiring BLW(V2) is placed so as to be parallel with, e.g., the belt-like wiring BLW(V1). To the belt-like wiring BLW(V2), vias VA(V2) are coupled. The belt-like wiring BLW(V2) is configured such that, through the vias VA(V2), a second power source potential higher than the first power source potential is supplied.

Figure 46:
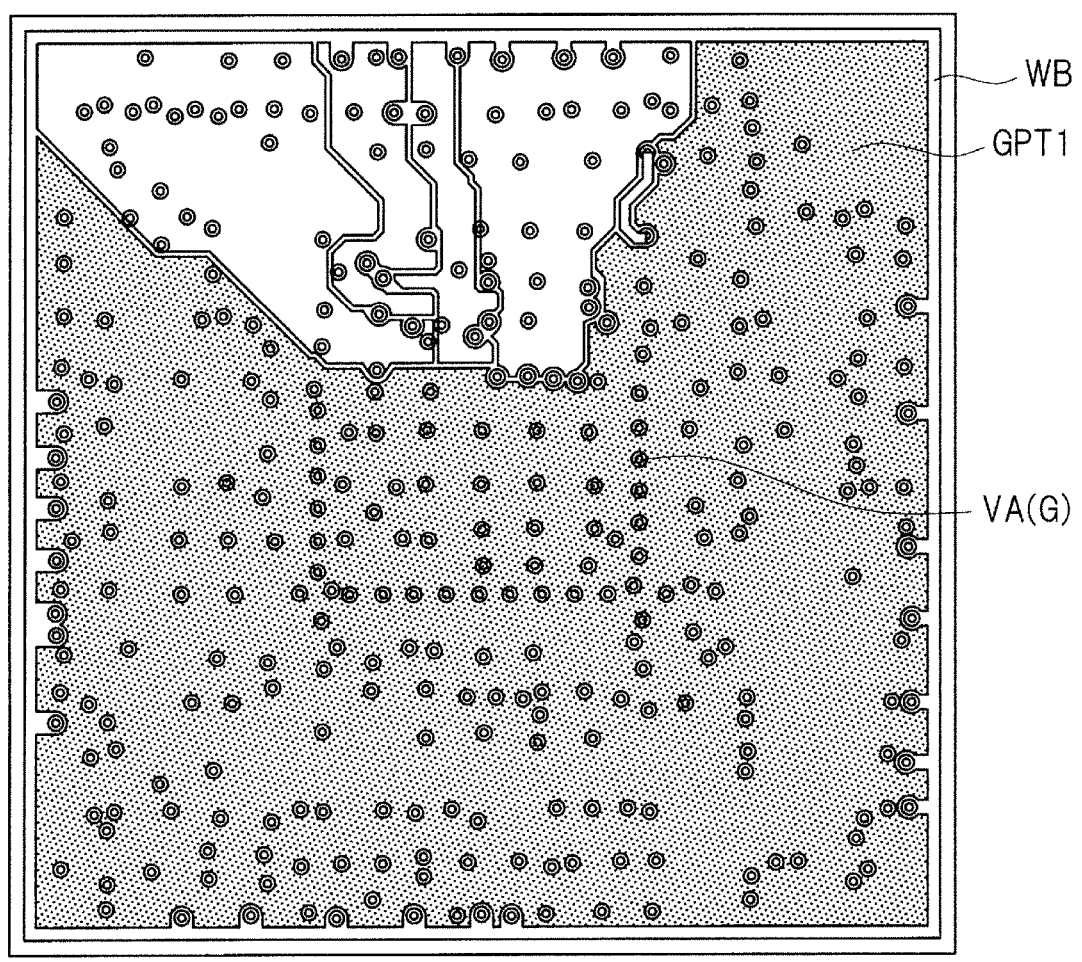
FIG. 46 is a view showing a layout configuration of the second layer of the wiring board.

The wiring board WB in Embodiment 2 has a multilayer wiring structure. Referring to FIG. 46, a description will be given below of the wiring structure placed in a layer (second layer) immediately under the top surface (first layer) of the wiring board WB shown in FIG. 45. Specifically, the wiring board WB in Embodiment 2 has, e.g., a four-layer structure. For the sake of convenience, the top surface of the wiring board WB shown in FIG. 45 will be referred to as the first layer, the layer immediately under the first layer will be referred to as the second layer, a layer under the second layer will be referred to as a third layer, and the back surface of the wiring board WB in a layer under the third layer will be referred to as a fourth layer.

FIG. 46 is a view showing a layout configuration of the second layer of the wiring board WB. As shown in FIG. 46, in the second layer of the wiring board WB, a GND pattern GPT1 is formed. To the GND pattern GPT1, the vias VA(G)

are coupled. Therefore, it will be understood that the GND plane GP and the belt-like wiring BLW(G) each formed over the top surface (in the first layer) of the wiring board WB shown in FIG. 45 are electrically coupled to the GND pattern GPT1 formed in the second layer of the wiring board WB shown in FIG. 46 through the vias VA(G).

Figure 47:
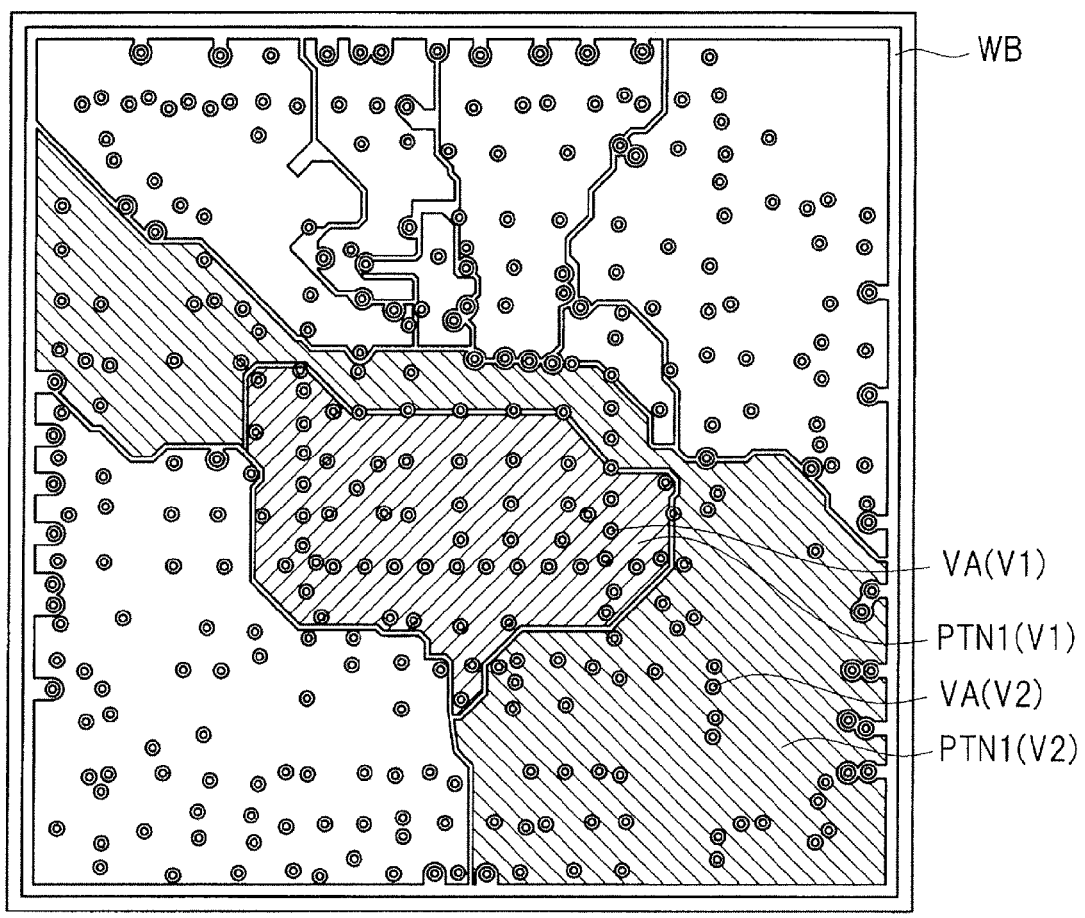
FIG. 47 is a view showing a layout configuration of the third layer of the wiring board.

Subsequently to FIG. 46, FIG. 47 is a view showing a layout configuration of the third layer of the wiring board WB. As shown in FIG. 47, in the third layer of the wiring board WB, a power source pattern PTN1(V1) and a power source pattern PTN1(V2) are formed. The power source pattern PTN1(V1) is electrically coupled to the vias VA(V1), and the power source pattern PTN2(V2) is electrically coupled to the vias VA(V2). Accordingly, it will be understood that the belt-like wiring BLW(V1) formed over the top surface (in the first layer) of the wiring board WB shown in FIG. 45 is electrically coupled to the power source pattern PTN1(V1) formed in the third layer of the wiring board WB shown in FIG. 47 through the vias VA(V1). Likewise, it will be understood that the belt-like wiring BLW(V2) formed over the top surface (in the first layer) of the wiring board WB shown in FIG. 45 is electrically coupled to the power source pattern PTN1(V2) formed in the third layer of the wiring board WB shown in FIG. 47 through the vias VA(V2).

Figure 48:
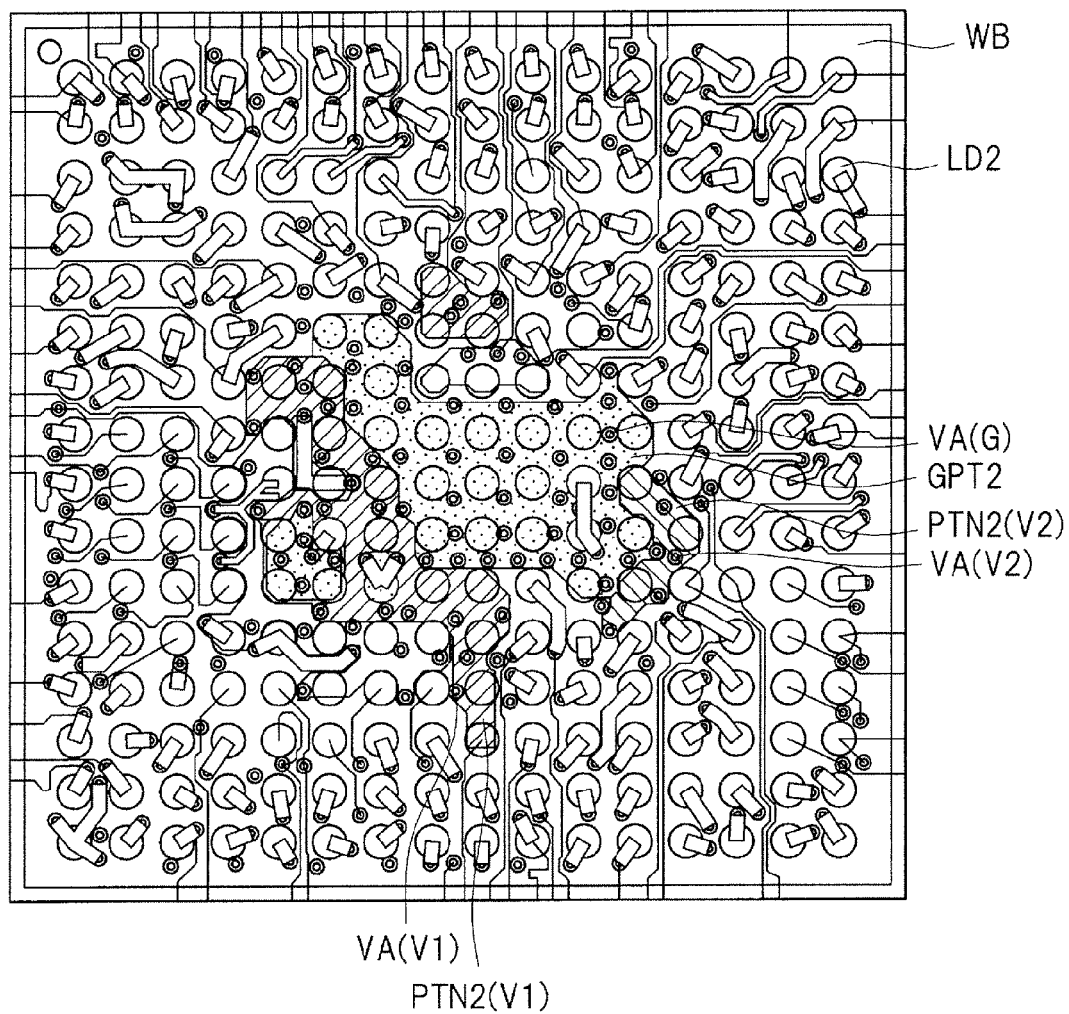
FIG. 48 is a view showing a layout configuration of the back surface (fourth layer) of the wiring board.

Subsequently to FIG. 47, FIG. 48 is a view showing a layout configuration of the back surface (fourth layer) of the wiring board WB. As shown in FIG. 48, over the back surface of the wiring board WB, the plurality of terminals LD2 are arranged in an array pattern and, over the terminals LD2, solder balls are mounted. In addition, in Embodiment 2, a GND pattern GPT2 is formed to be electrically coupled to some of the plurality of terminals LD2. The GND pattern GPT2 is also electrically coupled to the vias VA(G). Accordingly, it will be understood that, e.g., the integrated circuit formed in the semiconductor chip is eventually coupled to the solder balls in a path extending from the pads to the solder balls successively through the wires, the belt-like wiring BLW(G) and the GND plane GP, the vias VA(G), the GND pattern GPT1, the vias VA(G), the GND pattern GPT2, and the terminals LD2. Consequently, it will be understood that, by supplying the reference potential to some of the solder balls formed in the semiconductor device, the stabilized reference potential can be supplied to the integrated circuit formed in the semiconductor chip.

Likewise, in Embodiment 2, the power source pattern PTN2(V1) is formed so as to be electrically coupled to some others of the plurality of terminals LD2. The power source pattern PTN2(V1) is also electrically coupled to the vias VA(V1). Accordingly, it will be understood that, e.g., the integrated circuit formed in the semiconductor chip is eventually coupled to the solder balls in a path extending from the pads to the solder balls successively through the wires, the belt-like wiring BLW(V1), the vias VA(V1), the power source pattern PTN1(V1), the vias VA(V1), the power source pattern PTN2(V1), and the terminals LD2. Consequently, it will be understood that, by supplying the first power source potential to some of the solder balls formed in the semiconductor device, the stabilized first power source potential can be supplied to the integrated circuit formed in the semiconductor chip.

Also, in Embodiment 2, the power source pattern PTN2(V2) is formed so as to be electrically coupled to some others of the plurality of terminals LD2. The power source pattern PN2(V2) is also electrically coupled to the vias VA(V2). Accordingly, it will be understood that, e.g., the integrated circuit formed in the semiconductor chip is eventually coupled to the solder balls in a path extending from the pads to the solder balls successively through the wires, the belt-like wiring BLW(V2), the vias VA(V2), the power source pattern PTN1(V2), the vias VA(V2), the power source pattern PTN2(V2), and the terminals LD2. Consequently, it will be understood that, by supplying the second power source potential to some of the solder balls formed in the semiconductor device, the stabilized second power source potential can be supplied to the integrated circuit formed in the semiconductor chip.

<Characteristic Feature in Embodiment 2>

Figure 49:
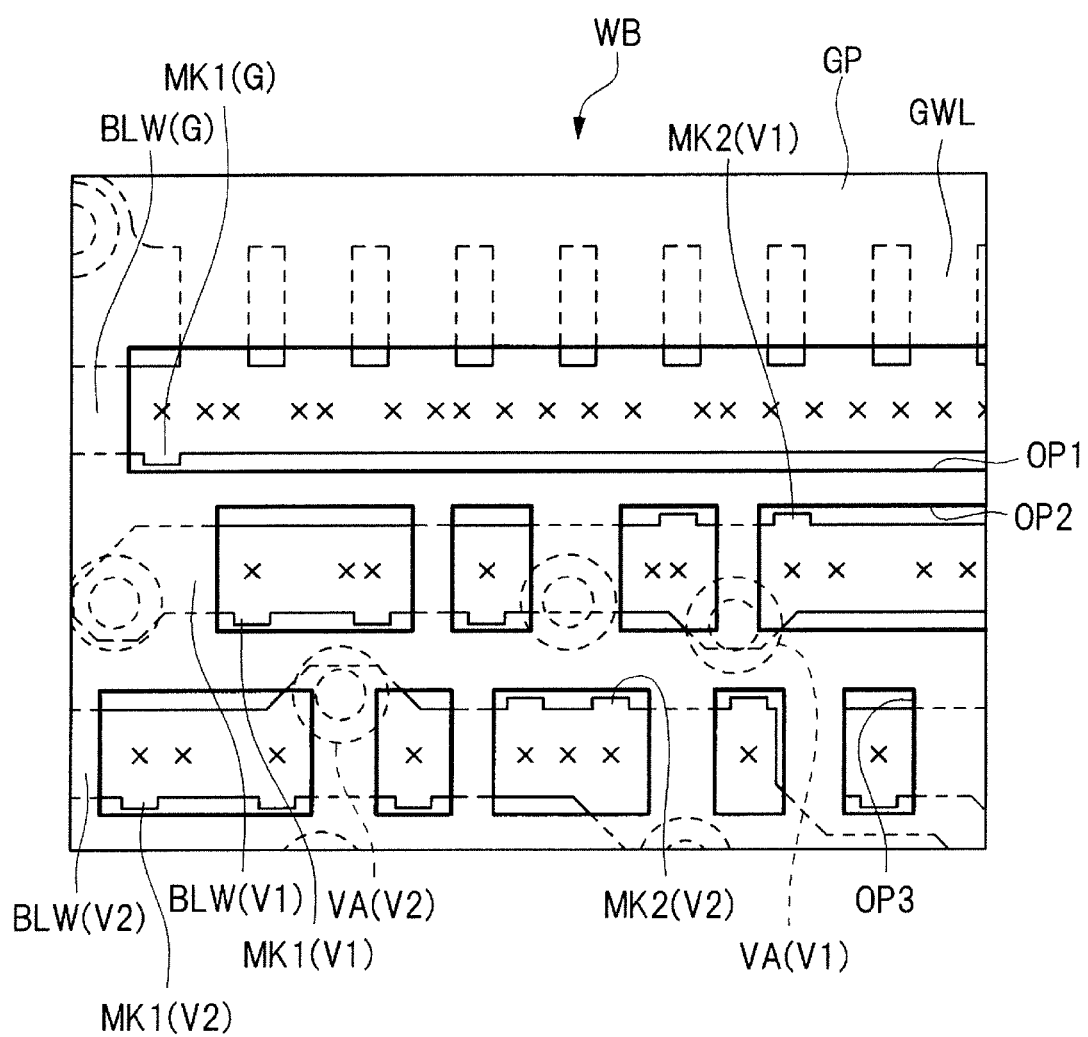
FIG. 49 is a view showing a partial area formed in the top surface of the wiring board in Embodiment 2 in enlarged relation.

Subsequently, a description will be given of the characteristic feature of Embodiment 2. FIG. 49 is a view showing a partial area formed in the top surface (first layer) of the wiring board WB in Embodiment 2 in enlarged relation. As shown in FIG. 49, it can be seen first that, in the wiring board WB in Embodiment 2, the belt-like wiring BLW(G) is placed externally of the GND plane GP and the GND plane GP is coupled to the belt-like wiring BLW(G) with the plurality of coupling wires GWL. Specifically, the belt-like wiring BLW(G) is basically covered with the solder resist SR, and a part of the belt-like wiring BLW(G) is exposed from the opening OP1 provided in the solder resist SR. The part of the belt-like wiring BLW(G) exposed from the opening OP1 is electrically coupled to the GND plane GP with the plurality of coupling wires GWL. This allows the reference potential supplied to the belt-like wiring BLW(G) to be stabilized to allow an improvement in the electric characteristic of the semiconductor device.

Here, the part of the belt-like wiring BLW(G) exposed from the opening OP1 serves as a region coupled to the coupling wires GWL and also includes a wire bonding area to which the wire is to be coupled. Accordingly, in Embodiment 2 also, in the same manner as in Embodiment 1, at least one mark MK1(G) is formed correspondingly to the wire bonding area included in the belt-like wiring BLW(G) exposed from the opening OP1.

Therefore, in Embodiment 2 also, in the alignment step for the wire bonding area, the coordinate position of the wire bonding area can be adjusted using not the end portion of the opening OP1 formed in the solder resist SR, but the mark MK1(G) formed correspondingly to the wire bonding area as a reference. As a result, in the alignment step in Embodiment 2 also, the position of the wire bonding area can be precisely adjusted without being affected by the displacement of the opening OP1 formed in the solder resist SR. Consequently, according to Embodiment 2, the reliability of the wire bonding step can be improved. In addition, since the mark MK1(G) serving as a characteristic pattern is formed also in Embodiment 2, the adjustment of the wire bonding area based on camera recognition can also be performed. Thus, in Embodiment 2 also, the reliability of the wire bonding step can be significantly improved.

Here, what is important is a position at which the mark MK1(G) is provided. As described above, the wire bonding area closest to the end portion of the opening OP1 is most affected by the displacement of the opening OP1 formed in the solder resist SR. Accordingly, in Embodiment 2, as shown in, e.g., FIG. 49, the mark MK1(G) is provided correspondingly to the wire bonding area closest to the end portion of the opening OP1. This allows the coordinate position of the wire bonding area closest to the end portion of the opening OP1 to be adjusted using the mark MK1(G) formed correspondingly to the wire bonding area as a reference. As a result, according to Embodiment 2, when the wire is coupled to the wire bonding area closest to the end portion of the opening OP1, it is possible to prevent the interference between the wire and the end portion of the opening OP1. This allows an improvement in the reliability of the wire bonding step in Embodiment 2.

At this time, there can be considered a configuration in which the mark MK1(G) is provided internally of the belt-like wiring BLW(G) and a configuration in which the mark MK1(G) is provided externally of the belt-like wiring BLW(G). In other words, there can be considered a configuration in which the mark MK1(G) is provided on the inner side (side close to the GND plane GP) forming the belt-like wiring BLW(G) and a configuration in which the mark MK1(G) is provided on the outer side (side distant from the GND plane GP) forming the belt-like wiring BLW(G).

With regard to this point, in Embodiment 2, the configuration is used in which the mark MK1(G) is provided externally of the belt-like wiring BLW(G). The reason for this is as follows. For example, as shown in FIG. 49, the plurality of coupling wires GWL to be electrically coupled to the GND plane GP are provided internally of the belt-like wiring BLW(G). As a result, for example, in the case of using the configuration in which the mark MK1(G) is provided internally of the belt-like wiring BLW(G), the mark MK1(G) is formed in a vacant space resulting from removal of some of the coupling wires GWL. This means that the number of the coupling wires GWL is reduced to increase the coupling resistance between the belt-like wiring BLW(G) and the GND plane GP.

Here, in Embodiment 2, by stabilizing the reference potential supplied to the semiconductor chip, an improvement in the electric characteristic of the semiconductor device is achieved. Accordingly, in Embodiment 2, in terms of stabilizing the reference potential at the belt-like wiring BLW(G) coupled to the semiconductor chip with the wires, it is preferable to maximize the number of the coupling wires GWL coupled to the GND plane GP and the width of each of the wires and thereby reduce the coupling resistance. With regard to this point, in the case of using the configuration in which the mark MK1(G) is provided internally of the belt-like wiring BLW(G), the space occupied by the coupling wires GWL is reduced as a result of ensuring the space where the mark MK1(G) is formed to result in an increase in the coupling resistance between the belt-like wiring BLW(G) and the GND plane GP. Accordingly, in Embodiment 2, the configuration is used in which the mark MK1(G) is provided externally of the belt-like wiring BLW(G). In this case, since the space occupied by the coupling wires GWL need not be reduced to ensure the space where the mark MK1(G) is formed, the coupling resistance between the belt-like wiring BLW(G) and the GND plane GP can be reduced. As a result, according to Embodiment 2, it is possible to achieve an improvement in the reliability of the wire bonding step resulting from the provision of the mark MK1(G), while reducing the coupling resistance between the belt-like wiring BLW(G) and the GND plane GP. That is, according to Embodiment 2, it is possible to achieve each of the improvement in the electric characteristic of the semiconductor device and the improvement in the reliability of the semiconductor device. In addition, if it is assumed that the mark MK1(G) is provided externally of the belt-like wiring BLW(G) on the opposite side of the coupling wires GWL, the advantage of easy board design can also be obtained.

Subsequently, as shown in FIG. 49, the belt-like wiring BLW(V1) to which the first power source potential is supplied is placed externally of the belt-like wiring BLW (G). Specifically, the belt-like wiring BLW(V1) is basically covered with the solder resist SR, and a part of the belt-like wiring BLW(V1) is exposed from an opening OP2 provided in the solder resist SR. The part of the belt-like wiring BLW(V1) exposed from the opening OP2 serves as the wire bonding area to which the wire is to be coupled. Accordingly, in Embodiment 2 also, in the same manner as in Embodiment 1, at least one mark MK1(V1) and at least one mark MK2(V1) are formed correspondingly to the wire bonding areas included in the belt-like wiring BLW(V1) exposed from the opening OP2.

In addition, as shown in FIG. 49, the belt-like wiring BLW(V2) to which the second power source potential higher than the first power source potential is supplied is placed externally of the belt-like wiring BLW(V1). Specifically, the belt-like wiring BLW(V2) is basically covered with the solder resist SR, and a part of the belt-like wiring BLW(V2) is exposed from an opening OP3 provided in the solder resist SR. A part of the belt-like wiring BLW(V2) exposed from the opening OP3 serves as the wire bonding area to which the wire is to be coupled. Accordingly, in Embodiment 2 also, in the same manner as in Embodiment 1, at least one mark MK1(G) and at least one mark MK2(V2) are formed correspondingly to the wire bonding areas included in the belt-like wiring BLW(V2) exposed from the opening OP3.

Here, when attention is focused on the belt-like wiring BLW(V1), the mark MK1(V1) corresponding to the wire bonding area of the belt-like wiring BLW(V1) exposed from the opening OP2 is basically placed externally of the belt-like wiring BLW(V1). This is for allowing a line and space between the belt-like wiring BLW(G) and the belt-like wiring BLW(V1) to be most easily ensured. For the same reason, when attention is focused on, e.g., the belt-like wiring BLW(V2), the mark MK1(V2) corresponding to the wire bonding area of the belt-like wiring BLW(V2) exposed from the opening OP3 is basically placed externally of the belt-like wiring BLW(V2).

However, as shown in FIG. 49, between the belt-like wiring BLW(V1) and the belt-like wiring BLW(V2), the via VA(V1) electrically coupled to the belt-like wiring BLW (V1) and the via VA(V2) electrically coupled to the belt-like wiring BLW(V2) may be placed. In this case, when attention is focused on, e.g., the belt-like wiring BLW(V1), a situation is encountered in which the mark MK2(V1) cannot be placed externally of the belt-like wiring BLW(V1) due to the via VA(V1). Accordingly, in this case, as shown in FIG. 49, the mark MK2(V1) can also be placed internally of the belt-like wiring BLW(V1) on the opposite side of the position at which the via VA(V1) is placed. This allows the mark MK2(V1) to be formed correspondingly to the wire bonding area of the belt-like wiring BLW(V1) exposed from the opening OP2 without being affected by the placement of the via VA(V1).

Likewise, if attention is focused on the belt-like wiring BLW(V1), as shown in, e.g., FIG. 49, a situation is encountered in which the mark MK2(V2) cannot be placed externally of the belt-like wiring BLW(V2) due to the belt-like wiring BLW(V2) depending on the placement layout of the belt-like wiring BLW(V2). Accordingly, in this case, as shown in FIG. 49, the mark MK2(V2) can also be placed internally of the belt-like wiring BLW(V2) on the opposite side of the position at which the belt-like wiring BLW(V2) is placed. This allows the mark MK2(V2) to be formed correspondingly to the wire bonding area of the belt-like wiring BLW(V2) exposed from the opening OP3 without being affected by the placement of the belt-like wiring BLW(V2).

<Modification 1>

Figure 50:
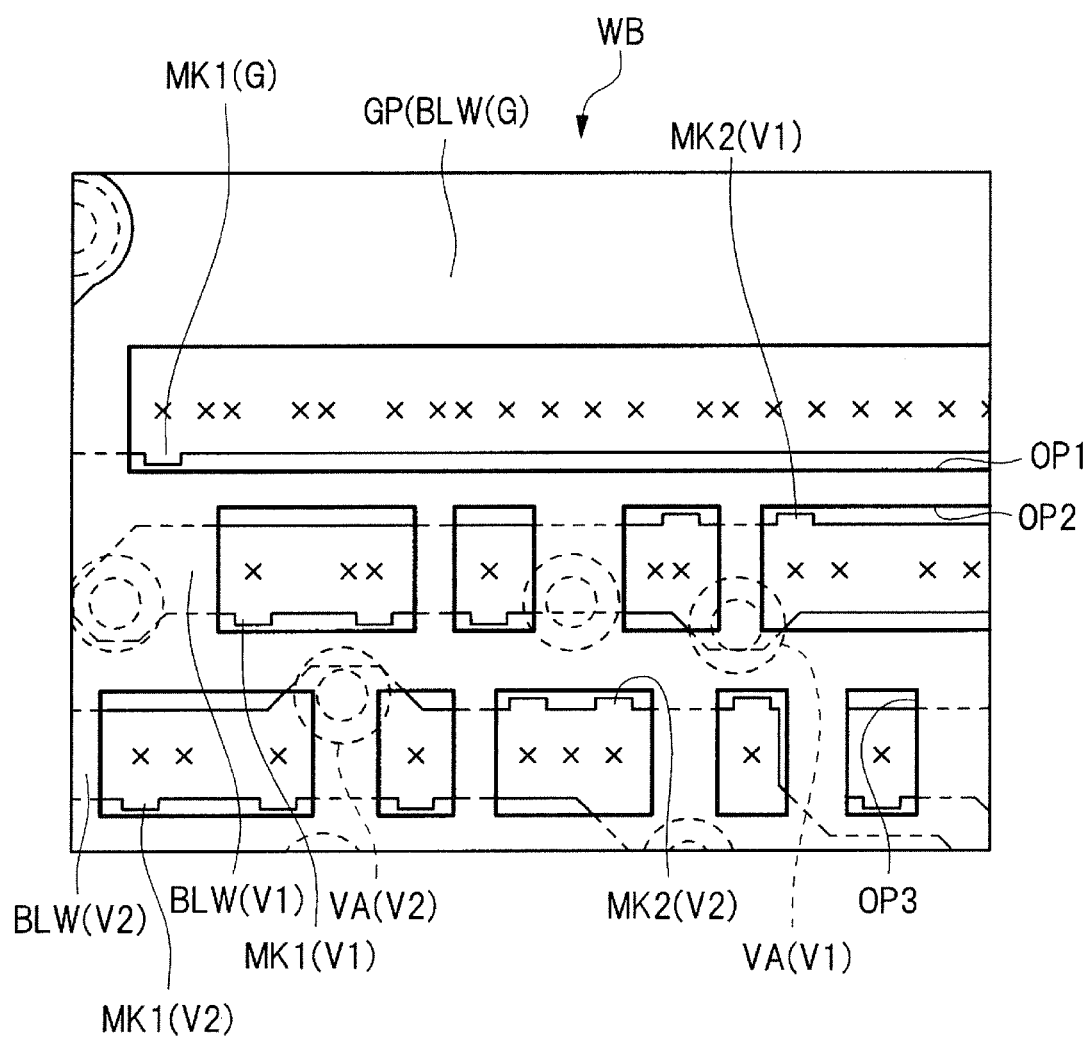
FIG. 50 is a view showing a partial area formed in the surface of the wiring board in Modification 1 of Embodiment 2 in enlarged relation.

FIG. 50 is a view showing a partial area formed in the surface (first layer) of the wiring board WB in Modification 1 of Embodiment 2 in enlarged relation. Since the configuration of Modification 1 shown in FIG. 50 is substantially the same as the configuration of Embodiment 2 shown in FIG. 49, a description will be given mainly of the difference therebetween.

In Modification 1 of FIG. 50, the GND plane GP and the belt-like wiring BLW(G) are integrally formed. That is, in Embodiment 2 shown in FIG. 49, the configuration is used in which the GND plane GP is separate from the belt-like wiring BLW(G) and electrically coupled thereto with the plurality of coupling wires GWL. By contrast, in Modification 1 shown in FIG. 50, the GND plane GP and the belt-like wiring BLW(G) are integrally formed. As a result, according to Modification 1 shown in FIG. 50, the coupling resistance between the GND plane GP and the belt-like wiring BLW(G) can further be reduced to allow the reference potential to be further stabilized. That is, according to Modification 1, the electric characteristic of the semiconductor device can further be improved. Moreover, since the coupling wires GWL are not provided, the area of the semiconductor device is reduced accordingly by the region where the coupling wires GWL are placed, which may allow the semiconductor device to be downsized.

<Modification 2>

Figure 51:
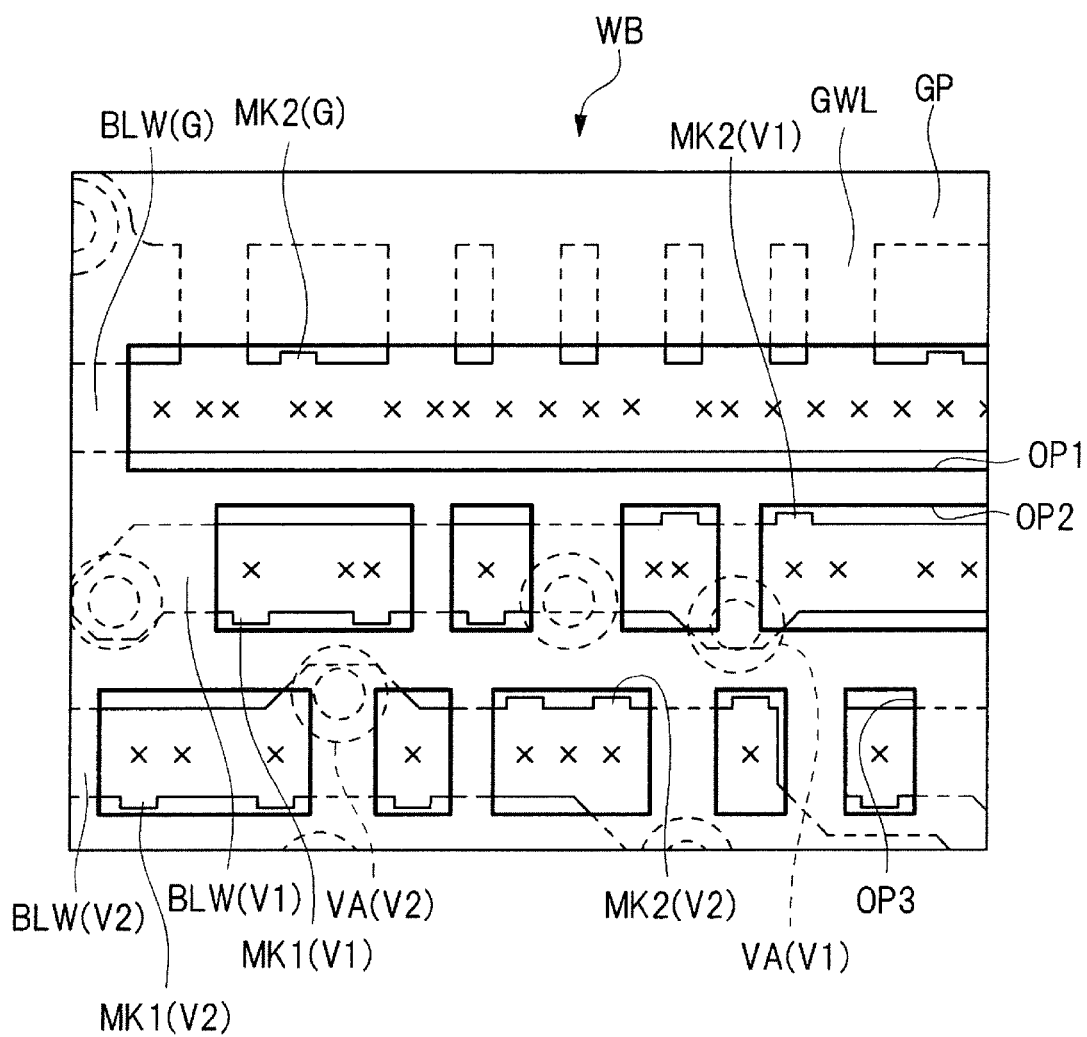
FIG. 51 is a view showing a partial area formed in the surface of the wiring board in Modification 2 of Embodiment 2 in enlarged relation.

FIG. 51 is a view showing a partial area formed in the surface (first layer) of the wiring board WB in Modification 2 of Embodiment 2 in enlarged relation. Since the configuration of Modification 2 shown in FIG. 51 is substantially the same as the configuration of Embodiment 2 shown in FIG. 49, a description will be given mainly of the difference therebetween.

In Modification 2 of FIG. 51, a configuration is used in which the mark MK1(G) is provided internally of the belt-like wiring BLW(G), conversely to that in Embodiment 2 shown in FIG. 49. In this case, the mark MK2(G) is formed in a vacant space resulting from removal of some of the coupling wires GWL. This means that the number of the coupling wires GWL is reduced to increase the coupling resistance between the belt-like wiring BLW(G) and the GND plane GP. Therefore, in the case of using the configuration of Modification 2, in terms of stabilizing the reference potential at the belt-like wiring BLW(G) coupled to the semiconductor chip with the wire, the configuration of Modification 2 is not comparable to the configuration of Embodiment 2 shown in FIG. 49.

However, from another viewpoint, it can be considered that a reduction in the area occupied by the coupling wires GWL formed of metal wires leads to an improvement in the adhesion between the sealing body (resin) and the wiring board WB. As a result, when, e.g., it is necessary to give a higher priority to the improvement in the adhesion between the sealing body (resin) and the wiring board WB at some cost of the stabilization of the reference potential using the coupling wires GWL, the configuration of Modification 2 shows obvious superiority to the configuration of Embodiment 2.

Note that, even in the case of using the configuration of Modification 2, if a configuration is used in which, e.g., the mark MK2(G) is formed of a wire (see FIG. 41) having a width different from that of the coupling wire GLW to be distinguished from the coupling wire GLW and the belt-like wiring BLW(G) is coupled to the GND plane GP with the wire (mark MK2(G)), the stabilization of the reference potential can also be achieved.

<Wire Bonding Step 1 in Embodiment 2>

Referring next to the drawings, a description will be given of the details of a wire bonding step in Embodiment 2.

Figure 52:
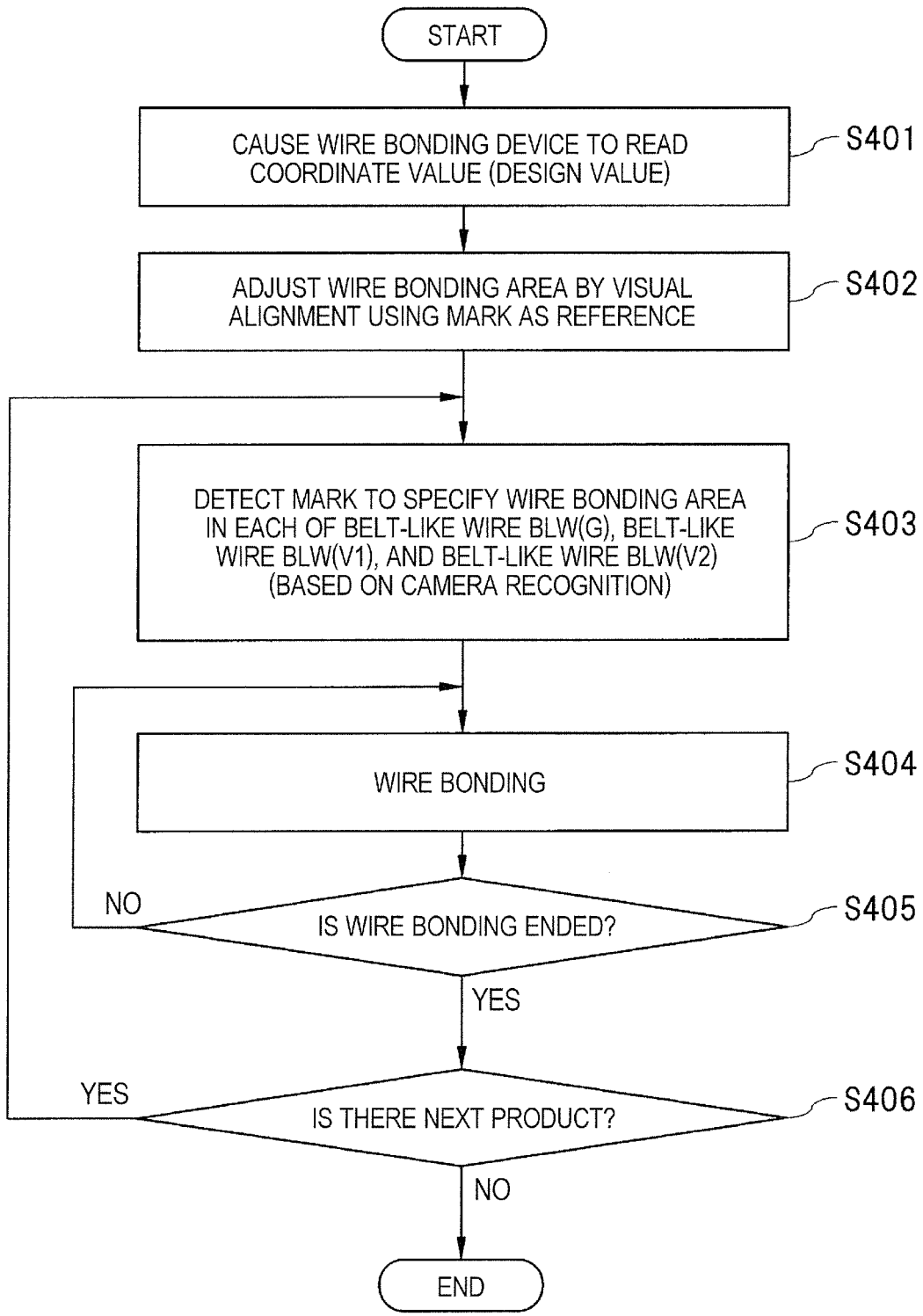
FIG. 52 is a flow chart showing the flow of a wire bonding step in Embodiment 2.

FIG. 52 is a flow chart showing the flow of the wire bonding step in Embodiment 2. First, for example, the wire bonding device is caused to read the coordinate value (design value) of the wire bonding area based on CAD data (S401). Next, an arbitrary semiconductor device is extracted from among a plurality of semiconductor devices and, based on the semiconductor device, a visual alignment step is performed (S402). Specifically, using each of the marks exposed from the openings provided in the solder resist as a reference mark, each of the wire bonding areas is adjusted from the design value. That is, the wire bonding areas are adjusted by alignment using the marks as a reference. At this time, the alignment step in Embodiment 2 is performed for the wire bonding areas provided in the belt-like wiring BLW(G), the belt-like wiring BLW(V1), and the belt-like wiring BLW(V2).

As a result, it is possible to effect the adjustment of the wire bonding areas which reflects a finished state represented by the size and position of each of the openings of a real semiconductor device. That is, necessary adjustment is performed by the visual alignment step from the design value of each of the wire bonding areas based on the CAD data such that the wire bonding area corresponds to the finished state of the real semiconductor device.

At this time, in Embodiment 2, the coordinate positions of the wire bonding areas are adjusted using not the end portions of the openings, but the marks formed correspondingly to the wire bonding areas as a reference. As a result, with the alignment step in Embodiment 2, the positions of the wire bonding areas can be precisely adjusted without being affected by the displacement of the openings formed in the solder resist.

Thus, the alignment step in Embodiment 2 can be performed. The adjustment of each of the wire bonding areas adjusted in the alignment step is also reflected in the wire bonding step for the plurality of semiconductor devices other than the extracted semiconductor device.

Subsequently, wire bonding is performed for the plurality of semiconductor devices. In the plurality of semiconductor devices other than the specified semiconductor device used in the alignment step also, the necessary adjustment based on the alignment step which has been performed from the design value of each of the wire bonding areas based on the CAD data is reflected. As a result, it can be considered that the wire bonding step reflecting the finished state of the real semiconductor device can be performed.

In particular, in Embodiment 2, the coordinate positions of the wire bonding areas are adjusted using the marks formed correspondingly to the wire bonding areas as a reference. Consequently, even in the plurality of semiconductor devices other than the specified semiconductor device used in the alignment step, the positions of the wire bonding areas are precisely adjusted without being affected by the displacement of the openings formed in the solder resist.

However, it can be considered that, in an actual situation, the finished state of the specified semiconductor device used in the alignment step may be subtly different from the finished states of the semiconductor devices other than that. With regard to this point, in the semiconductor device in Embodiment 2, the marks each serving as the characteristic pattern are formed to allow fine adjustment of the wire bonding areas based on camera recognition, which has been difficult in the related art technology, to be performed. Thus, in Embodiment 2, by taking the advantage that the camera recognition is applicable thereto, fine adjustment of the wire bonding areas based on camera recognition is performed for each of the semiconductor devices.

Specifically, in Embodiment 2, in the target semiconductor device to be subjected to the wire bonding step, the marks are detected based on camera recognition to perform fine adjustment from the wire bonding areas adjusted in the alignment step and specify the wire bonding areas reflecting the finished state of the target semiconductor device (S403). Specifically, by detecting the marks, the wire bonding areas are specified in each of the belt-like wiring BLW(G), the belt-like wiring BLW(V1), and the belt-like wiring BLW(V2).

Thereafter, based on the position of the specified wire bonding areas, the pads formed in the semiconductor chip are coupled to the specified wire bonding areas of each of the belt-like wiring BLW(G), the belt-like wiring BLW(V1), and the belt-like wiring BLW(V2) (S404). When the coupling of all the wires present in the target semiconductor device is not ended, the wire bonding step is continuously performed (S405). On the other hand, when the coupling of all the wires present in the target semiconductor device is ended, the wire bonding step for the target semiconductor device is ended (S405).

Then, the wire bonding step for the next semiconductor device is performed (S406). Specifically, by detecting the marks based on camera recognition, fine adjustment is performed from the wire bonding areas adjusted in the alignment step to specify the wire bonding areas reflecting the finished state of the target semiconductor device (S403). Specifically, by detecting the marks, the wire bonding areas are specified in each of the belt-like wiring BLW(G), the belt-like wiring BLW(V1), and the belt-like wiring BLW(V2).

Thereafter, based on the positions of the specified wire bonding areas, the pads formed in the semiconductor chip are coupled to the wire bonding areas specified in each of the belt-like wiring BLW(G), the belt-like wiring BLW(V1), and the belt-like wiring BLW(V2) with wires (S404). When the coupling of all the wires present in the target semiconductor device is not ended, the wire bonding step is continuously performed (S405). On the other hand, when the coupling of all the wires present in the target semiconductor device is ended, the wire bonding step for the target semiconductor device is ended (S405). By repeating the foregoing steps, the wire bonding steps can be performed for the plurality of semiconductor devices. Thus, the wire bonding steps can be performed for the plurality of semiconductor devices.

The flow of the wire bonding step in Embodiment 2 is as described above. Referring to FIGS. 53 to 56, the wire bonding step in Embodiment 2 will be further described.

For example, FIGS. 53 to 56 show a state in which the wire bonding step is performed for another semiconductor device other than the semiconductor device used in the alignment step. First, in FIG. 53, wire bonding areas CAD1 to CAD5 based on the CAD data are indicated by the solid circles and wire bonding areas OSR1 to OSR5 reflecting the necessary adjustment based on the alignment step are indicated by the broken-line cross marks. That is, in the target semiconductor device of FIG. 53 also, the necessary adjustment based on the alignment step which has been performed from the design value of the wire bonding area based on the CAD data is reflected.

Figure 53:
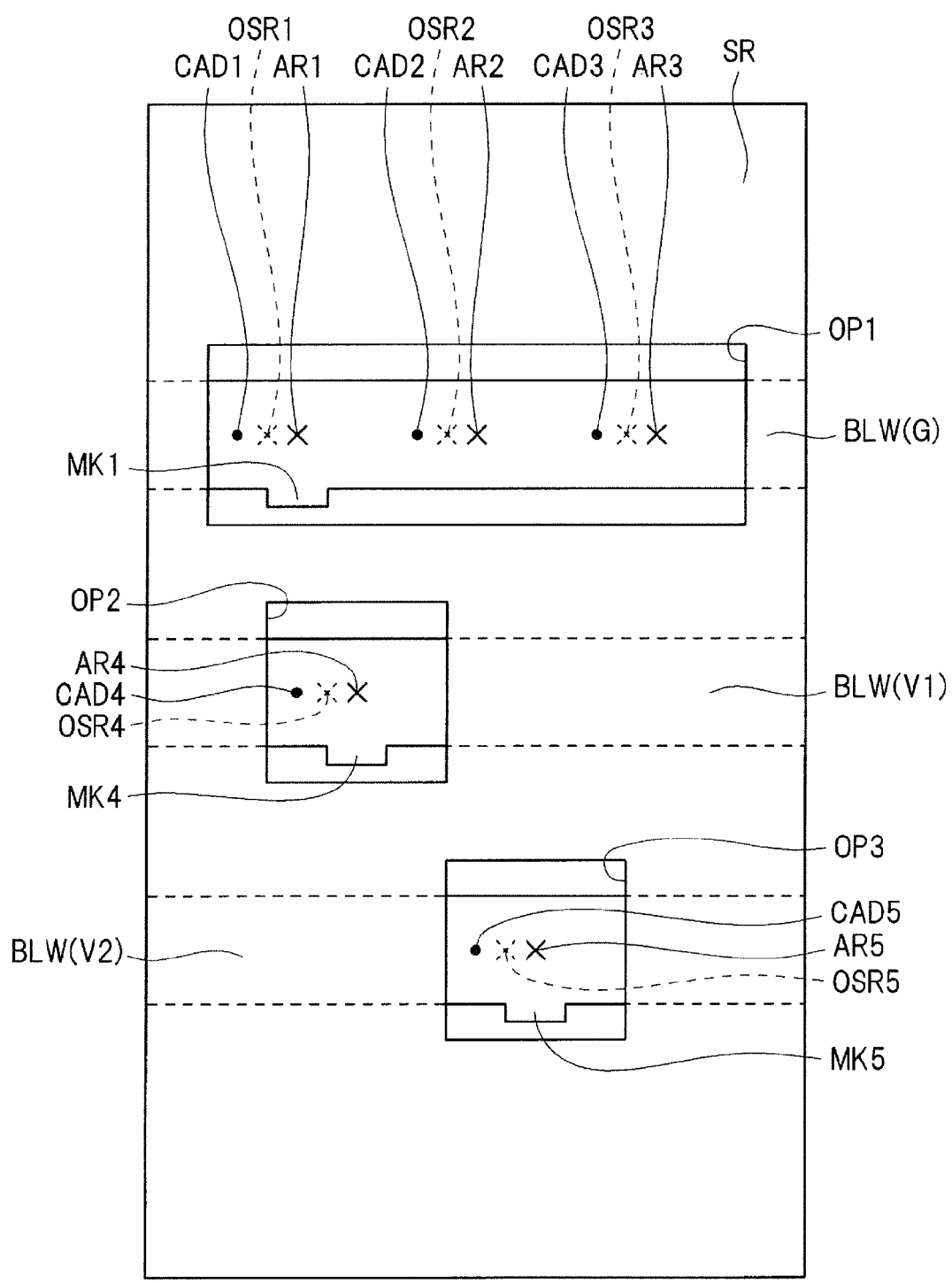
FIG. 53 is a view showing the wire bonding step in Embodiment 2.

However, it is assumed that, in an actual situation, the finished state of the specified semiconductor device used in the alignment step is subtly different from the finished state of the target semiconductor device of FIG. 53. Accordingly, in the target semiconductor device of FIG. 53 also, fine adjustment of the wire bonding area based on camera recognition has been performed.

Specifically, in the target semiconductor device of FIG. 53, by detecting the mark MK1 formed in the belt-like wiring BLW(G) based on camera recognition, fine adjustment is performed from the wire bonding area OSR1 adjusted in the alignment step to specify the wire bonding area AR1 reflecting the finished state of the target semiconductor device. That is, based on the position of the mark MK1 detected based on camera recognition, the wire bonding area AR1 is specified.

Note that the wire bonding areas AR2 and AR3 formed in the belt-like wiring BLW(G) are specified by considering the design distances thereof from the specified wire bonding area AR1. Specifically, the wire bonding area AR2 is set to a region away from the wire bonding area AR1 by a predetermined first distance and the wire bonding area AR3 is set to a region away from the wire bonding area AR1 by a predetermined second distance. Here, the wire bonding areas AR1 to AR3 specified based on camera recognition are indicated by the solid-line cross marks.

Likewise, in the target semiconductor device of FIG. 53, by detecting the mark MK4 formed in the belt-like wiring BLW(V1) based on camera recognition, fine adjustment is performed from the wire bonding area OSR4 adjusted in the alignment step to specify a wire bonding area AR4 reflecting the finished state of the target semiconductor device. That is, based on the position of the mark MK1 detected based on camera recognition, the wire bonding area AR4 is specified. Here, the wire bonding area AR4 specified based on camera recognition is shown by the solid-line cross mark.

Also, in the target semiconductor device of FIG. 53, by detecting a mark MK5 formed in the belt-like wiring BLW(V2) based on camera recognition, fine adjustment is performed from the wire bonding area OSR5 adjusted in the alignment step to specify a wire bonding area AR5 reflecting the finished state of the target semiconductor device. That is, based on the position of the mark MK5 detected based on camera recognition, the wire bonding area AR5 is specified. Here, the wire bonding area AR5 specified based on camera recognition is shown by the solid-line cross mark.

Figure 54:
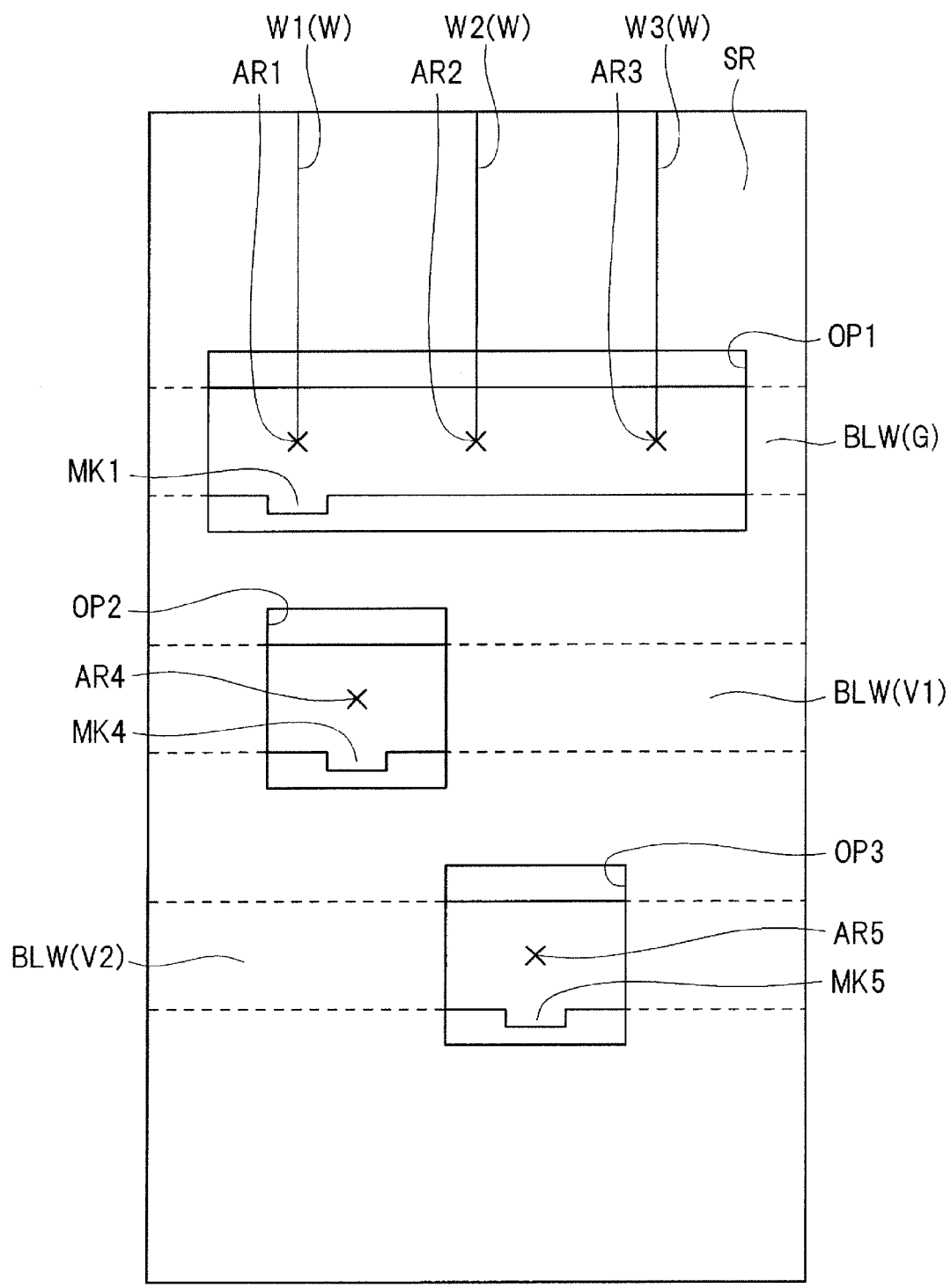
FIG. 54 is a view showing the wire bonding step, which is subsequent to FIG. 53.

Subsequently, as shown in FIG. 54, the first to third pads formed in the semiconductor chip not shown are electrically coupled to the wire bonding areas AR1 to AR3 of the belt-like wiring BLW(G) exposed from the opening OP1 with the wires W1 to W3.

Figure 55:
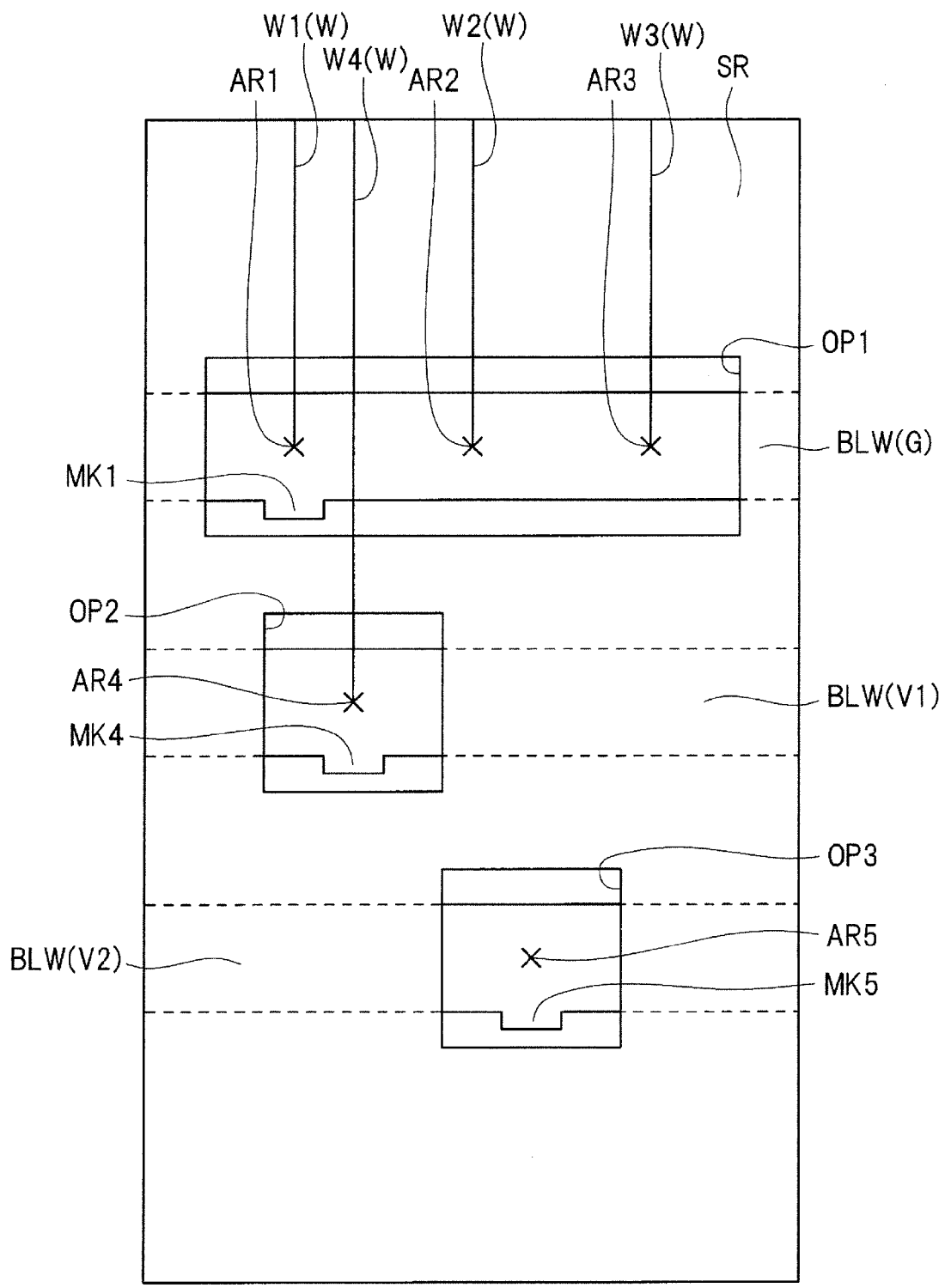
FIG. 55 is a view showing the wire bonding step, which is subsequent to FIG. 54.

Then, as shown in FIG. 55, a fourth pad formed in the semiconductor chip not shown is electrically coupled to the wire bonding area AR4 of the belt-like wiring BLW(V1) exposed from the opening OP2 with a wire W4.

Figure 56:
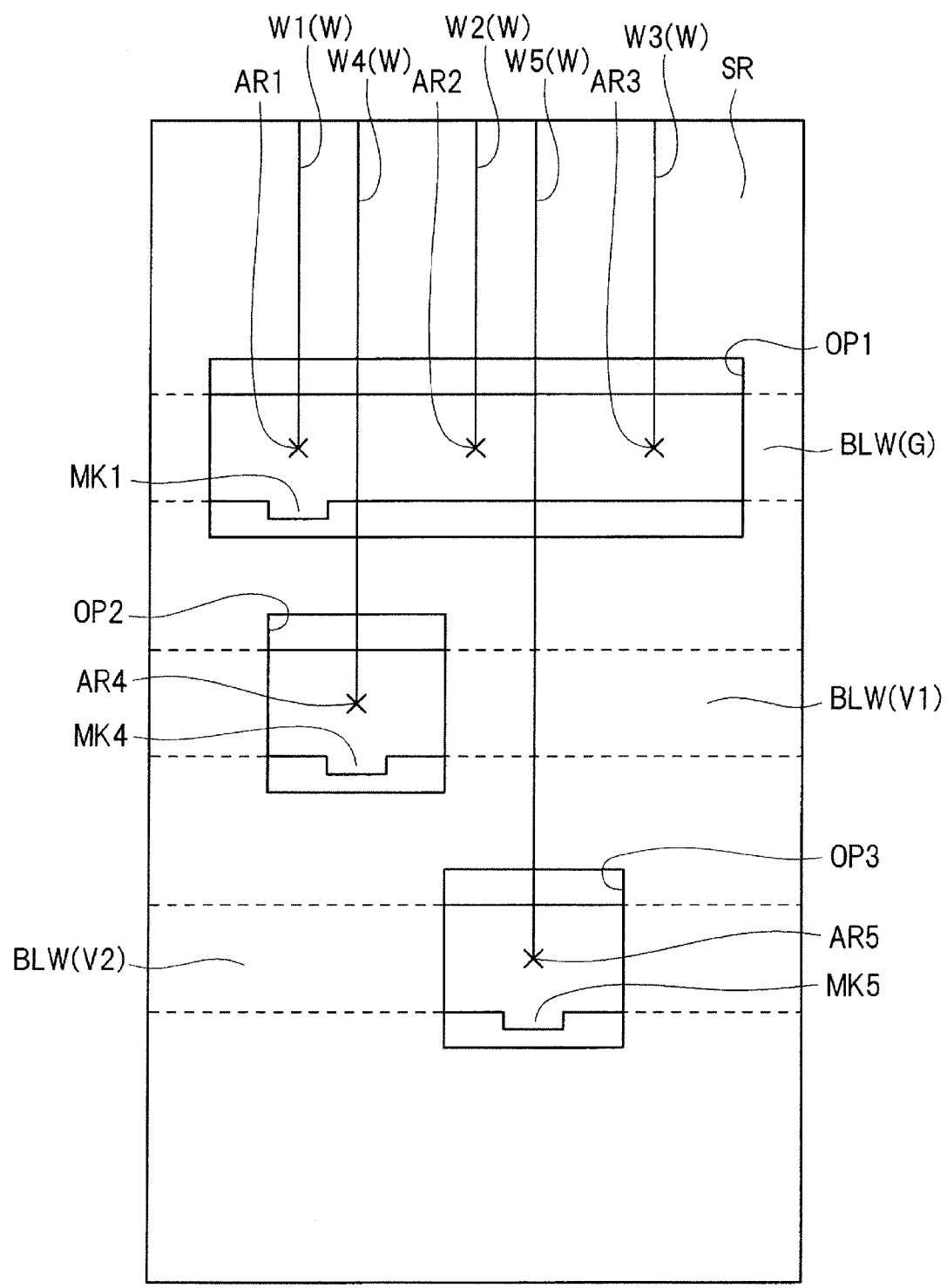
FIG. 56 is a view showing the wire bonding step, which is subsequent to FIG. 55.

Further, as shown in FIG. 56, a fifth pad formed in the semiconductor chip not shown is electrically coupled to the wire bonding area AR5 of the belt-like wiring BLW(V2) exposed from the opening OP3 with a wire W5.

At this time, in Embodiment 2, in the alignment step for the wire bonding area, the coordinate position of the wire bonding area is adjusted using not the end portions of the openings OP1 to OP3 formed in the solder resist SR, but the marks MK1, MK4, and MK5 formed correspondingly to the wire bonding areas as a reference. Therefore, according to Embodiment 2, the position of the wire bonding area can be adjusted without being affected by the displacement of the openings OP1 to OP3 formed in the solder resist SR. Further, in Embodiment 2, since the marks MK1, MK4, and MK5 each serving as the characteristic pattern are formed, the adjustment of the wire bonding area based on camera recognition is performed. Thus, according to Embodiment 2, by the combined effects of these characteristic features, it is possible to effectively suppress the interference between the wires W1 to W5 and the openings OP1 to OP3, as shown in FIG. 56, and consequently achieve a significant improvement in the reliability of the wire bonding step. Thus, the wire bonding step can be performed.

<Wire Bonding Step 2 in Embodiment 2>

Referring next to the drawings, a description will be given of the details of another wire bonding step in Embodiment 2.

Figure 57:
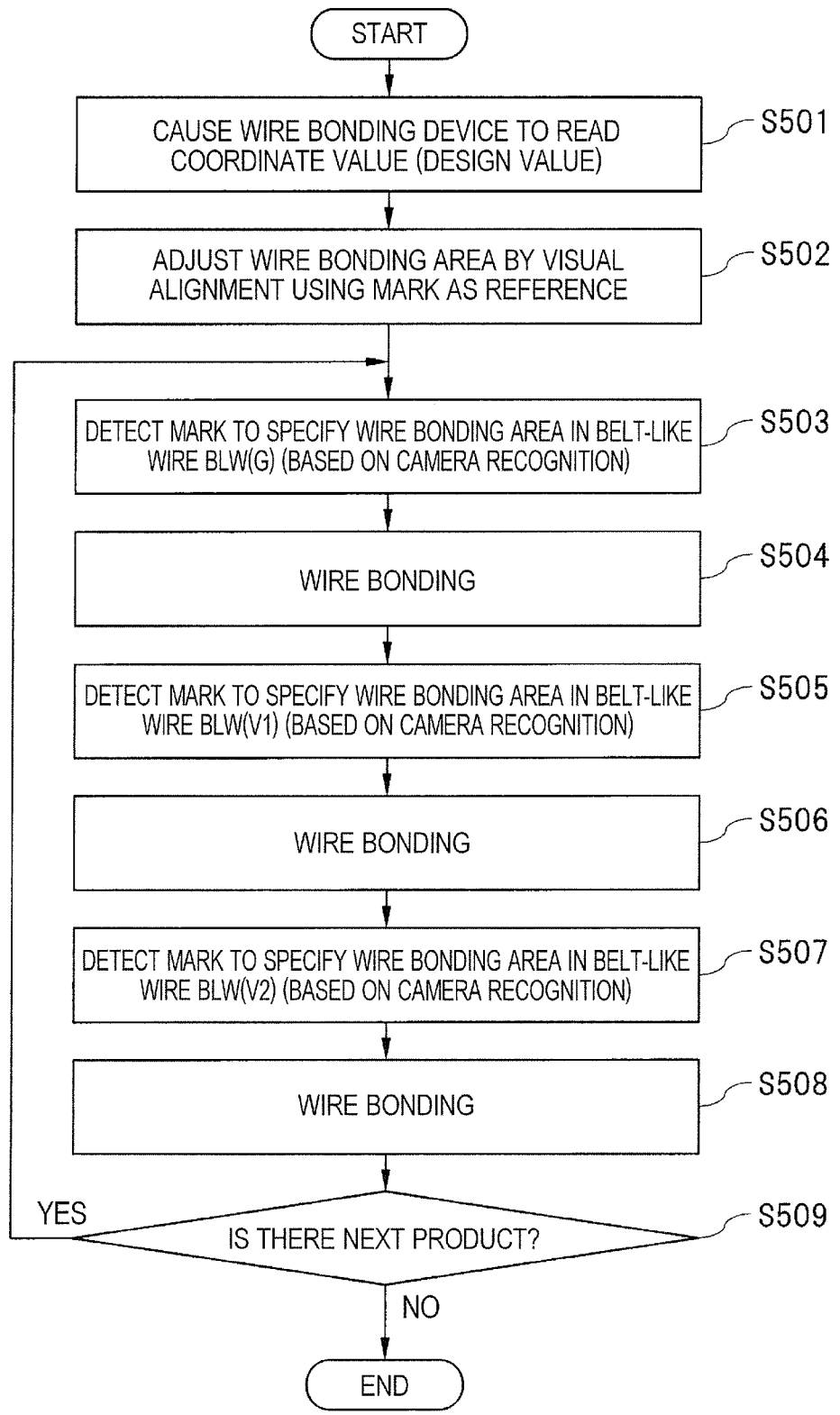
FIG. 57 is a flow chart showing the flow of another wire bonding step in Embodiment 2.

FIG. 57 is a flow chart showing the flow of the other wire bonding step in Embodiment 2. First, for example, the wire bonding device is caused to read the coordinate value (design value) of the wire bonding area based on CAD data (S501). Next, an arbitrary semiconductor device is extracted from among a plurality of semiconductor devices and, based on the semiconductor device, a visual alignment step is performed (S502). Specifically, using each of the marks exposed from the openings provided in the solder resist as a reference mark, each of the wire bonding areas is adjusted from the design value. That is, the wire bonding areas are adjusted by visual alignment using the mark as a reference. At this time, the alignment step in Embodiment 2 is performed for the wire bonding areas provided in the belt-like wiring BLW(G), the belt-like wiring BLW(V1), and the belt-like wiring BLW(V2).

As a result, it is possible to effect the adjustment of the wire bonding areas which reflects a finished state represented by the size and position of each of the openings of a real semiconductor device. That is, necessary adjustment is performed by the visual alignment step from the design value of each of the wire bonding areas based on the CAD data such that the wire bonding area corresponds to the finished state of the real semiconductor device.

At this time, in Embodiment 2, the coordinate positions of the wire bonding areas are adjusted using not the end portions of the openings, but the marks formed correspondingly to the wire bonding areas as a reference. As a result, with the alignment step in Embodiment 2, the positions of the wire bonding areas can be precisely adjusted without being affected by the displacement of the openings formed in the solder resist.

Thus, the alignment step in Embodiment 2 can be performed. The adjustment of each of the wire bonding areas adjusted in the alignment step is also reflected in the wire bonding step for the plurality of semiconductor devices other than the extracted semiconductor device.

Subsequently, wire bonding is performed for the plurality of semiconductor devices. In the plurality of semiconductor devices other than the specified semiconductor device used in the alignment step also, the necessary adjustment based on the alignment step which has been performed from the design value of each of the wire bonding areas based on the CAD data is reflected. As a result, it can be considered that the wire bonding step reflecting the finished state of the real semiconductor device can be performed.

In particular, in Embodiment 2, the coordinate positions of the wire bonding areas are adjusted using the marks formed correspondingly to the wire bonding areas as a reference. Consequently, even in the plurality of semiconductor devices other than the specified semiconductor device used in the alignment step, the positions of the wire bonding areas are precisely adjusted without being affected by the displacement of the openings formed in the solder resist.

However, it can be considered that, in an actual situation, the finished state of the specified semiconductor device used in the alignment step may be subtly different from the finished states of the semiconductor devices other than that. With regard to this point, in the semiconductor device in Embodiment 2, the marks each serving as the characteristic pattern are formed to allow fine adjustment of the wire bonding areas based on camera recognition, which has been difficult in the related art technology, to be performed. Thus, in Embodiment 2, by taking the advantage that the camera recognition is applicable thereto, fine adjustment of the wire bonding areas based on camera recognition is performed for each of the semiconductor devices.

Specifically, in Embodiment 2, in the target belt-like wiring BLW(G) to be subjected to the wire bonding step, the marks are detected based on camera recognition to perform fine adjustment of the wire bonding areas adjusted in the alignment step and specify the wire bonding areas reflecting the finished state of the target semiconductor device (S503). Specifically, by detecting the marks, the wire bonding areas are specified in the belt-like wiring BLW(G).

Thereafter, based on the position of the wire bonding areas specified in the belt-like wiring BLW(G), the pads formed in the semiconductor chip are coupled to the wire bonding areas specified in the belt-like wiring BLW(G) (S504).

Subsequently, by detecting the marks in the target belt-like wiring BLW(V1) to be subjected to the wire bonding step based on camera recognition, fine adjustment is performed from the wire bonding areas adjusted in the alignment step to specify the wire bonding areas reflecting the finished state of the target semiconductor device (S505). Specifically, by detecting the marks, the wire bonding areas are specified in the belt-like wiring BLW(V1).

Thereafter, based on the positions of the wire bonding areas specified in the belt-like wiring BLW(V1), the pads formed in the semiconductor chip are coupled to the wire bonding areas specified in the belt-like wiring BLW(V1) with wires (S506).

Next, by detecting the marks in the target belt-like wiring BLW(V2) to be subjected to the wire bonding step based on camera recognition, fine adjustment is performed from the wire bonding areas adjusted in the alignment step to specify the wire bonding areas reflecting the finished state of the target semiconductor device (S507). Specifically, by detecting the marks, the wire bonding areas are specified in the belt-like wiring BLW(V2).

Thereafter, based on the positions of the wire bonding areas specified in the belt-like wiring BLW(V2), the pads formed in the semiconductor chip are coupled to the wire bonding areas specified in the belt-like wiring BLW(V2) with wires (S508).

Then, the wire bonding step is performed for the next semiconductor device (S509). By repeating the foregoing steps, the wire bonding steps can be performed for the plurality of semiconductor devices. Thus, the wire bonding steps can be performed for the plurality of semiconductor devices.

The flow of the other wire bonding step in Embodiment 2 is as described above. Referring to FIGS. 58 to 63, the other wire bonding step in Embodiment 2 will be further described.

For example, each of FIGS. 58 to 63 shows a state in which the wire bonding step is performed on a semiconductor device other than the semiconductor device used in the alignment step. Here, a description will be given of the steps including and subsequent to S503 shown in FIG. 57.

Figure 58:
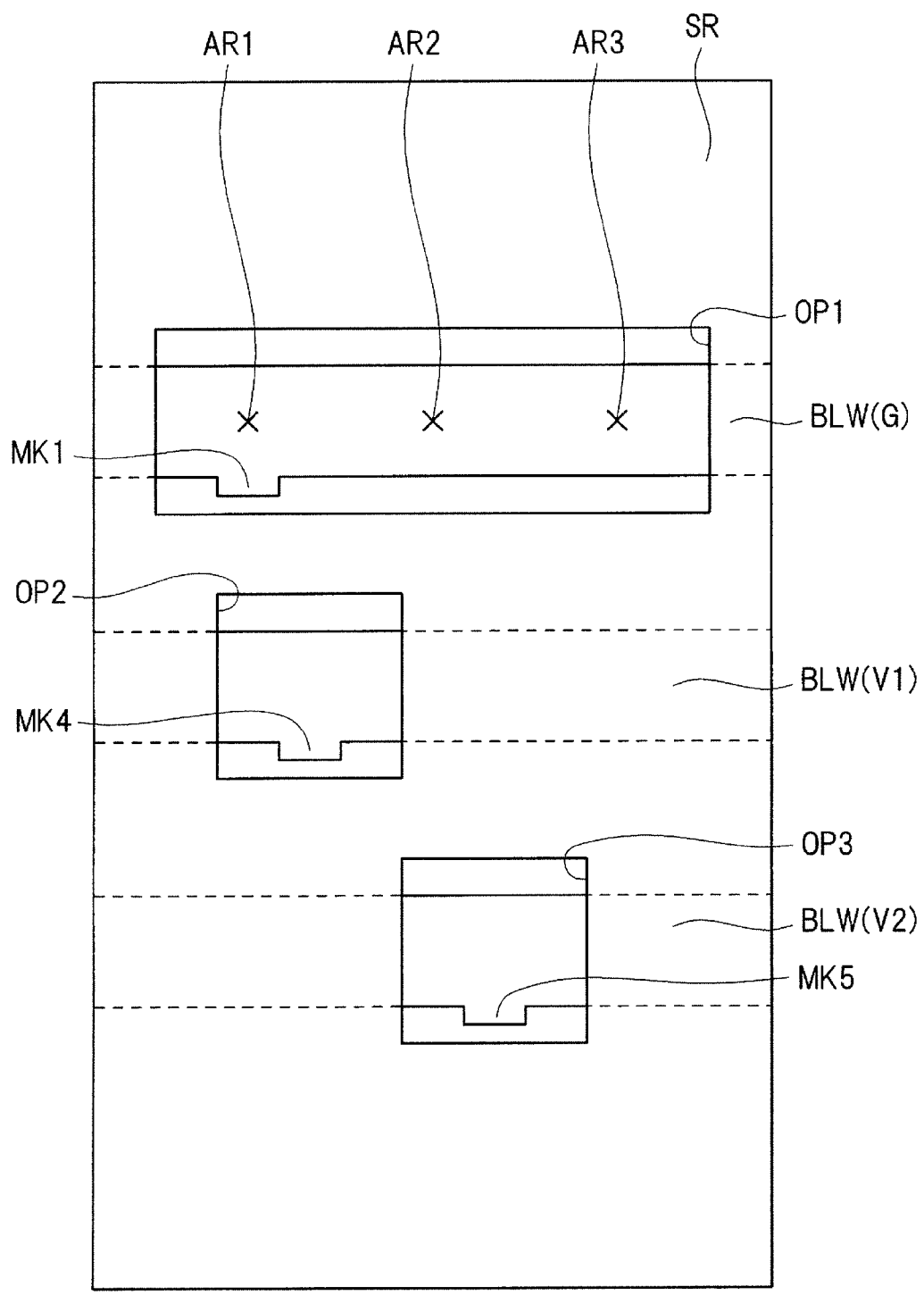
FIG. 58 is a view showing the other wire bonding step in Embodiment 2.

First, in the target semiconductor device of FIG. 58, by detecting the mark MK1 formed in the belt-like wiring BLW(G) based on camera recognition, fine adjustment is performed from the wire bonding area adjusted in the alignment step to specify the wire bonding area AR1 reflecting the finished state of the target semiconductor device. That is, based on the mark MK1 detected based on camera recognition, the wire bonding area AR1 is specified.

Note that the wire bonding areas AR2 and AR3 formed in the belt-like wiring BLW(G) are each specified in consideration of, e.g., the design distance from the specified wire bonding area AR1. Specifically, the wire bonding area AR2 is set in a region away from the wire bonding area AR1 by a first predetermined distance and the wire bonding area AR3 is set in a region away from the wire bonding area AR1 by a second predetermined distance. Here, the wire bonding areas AR1 to AR3 specified based on camera recognition are indicated by the solid-line cross marks.

Figure 59:
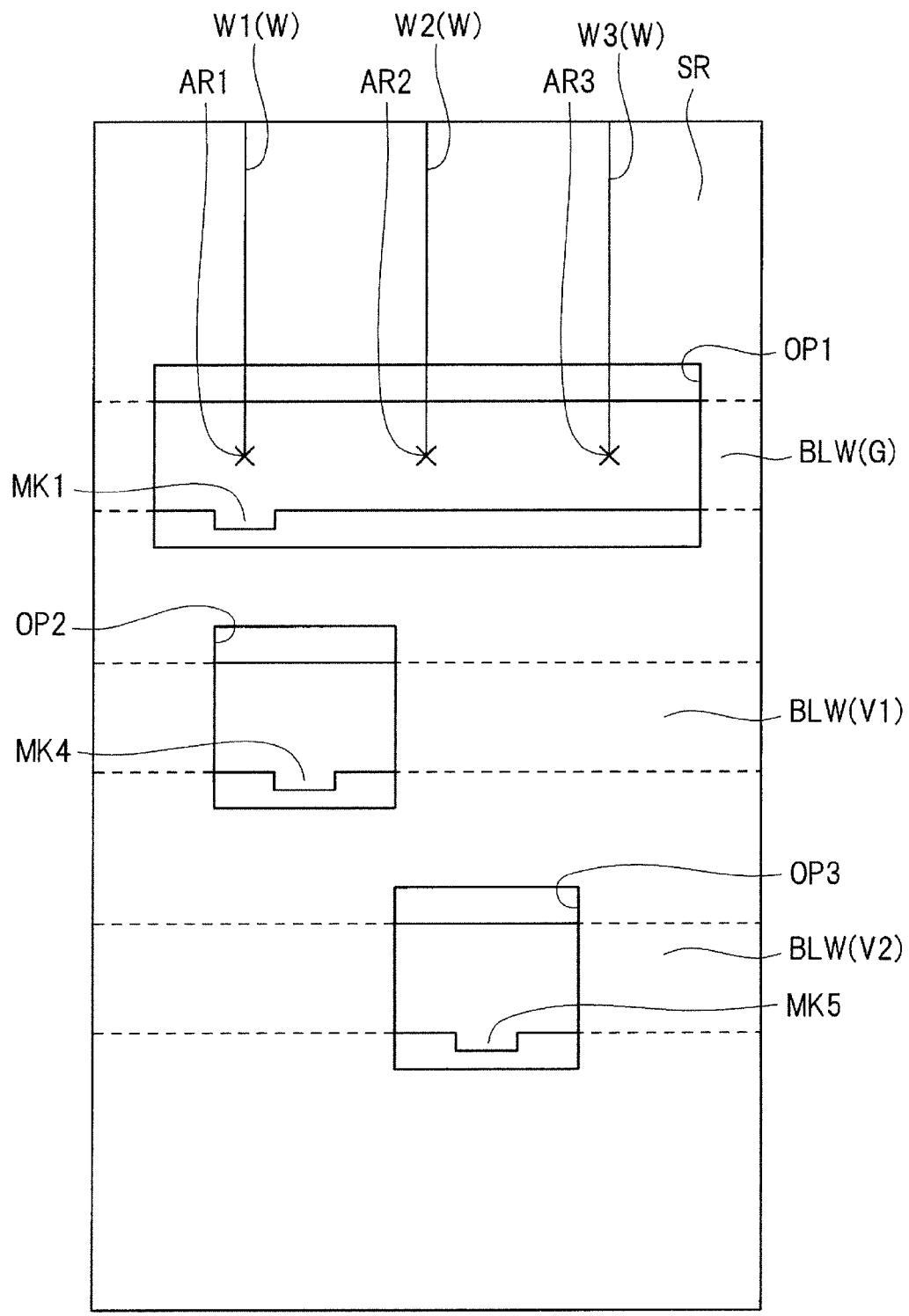
FIG. 59 is a view showing the wire bonding step, which is subsequent to FIG. 58.

Next, as shown in FIG. 59, the first to third pads formed in the semiconductor chip not shown are electrically coupled to the wire bonding areas AR1 to AR3 in the belt-like wiring BLW(G) exposed from the opening OP1 with the wires W1 to W3.

Figure 60:
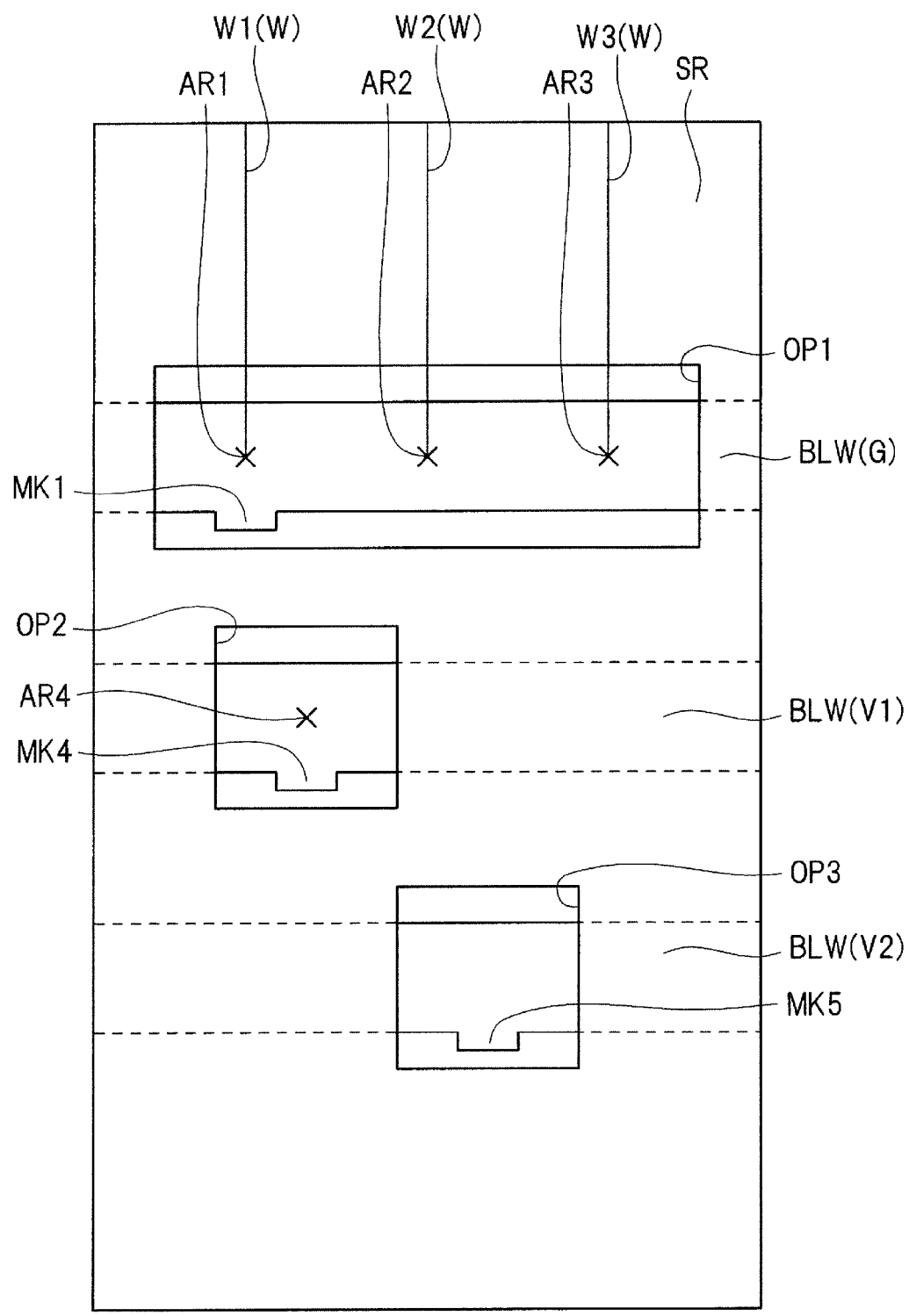
FIG. 60 is a view showing the wire bonding step, which is subsequent to FIG. 59.

Subsequently, in the target semiconductor device of FIG. 60, by detecting the mark MK4 formed in the belt-like wiring BLW(V1) based on camera recognition, fine adjustment is performed from the wire bonding area adjusted in the alignment step to specify the wire bonding area AR4 reflecting the finished state of the target semiconductor device. That is, based on the position of the mark MK4 detected based on camera recognition, the wire bonding area AR4 is specified. Here, the wire bonding area AR4 specified based on camera recognition is indicated by the solid-line cross mark.

Figure 61:
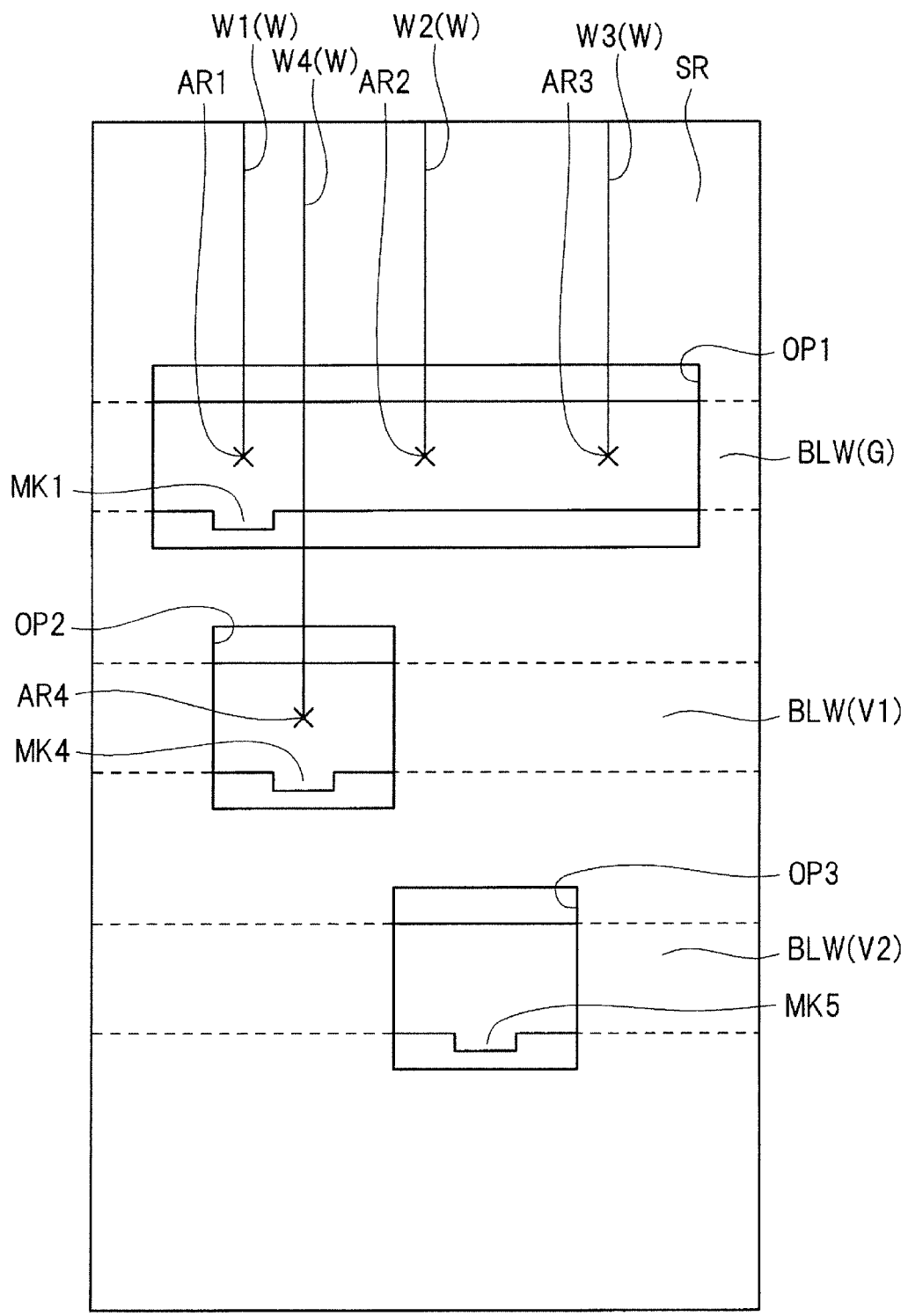
FIG. 61 is a view showing the wire bonding step, which is subsequent to FIG. 60.

Next, as shown in FIG. 61, the fourth pad formed in the semiconductor chip not shown is electrically coupled to the wire bonding area AR4 of the belt-like wiring BLW(V1) exposed from the opening OP2 with the wire W4.

Figure 62:
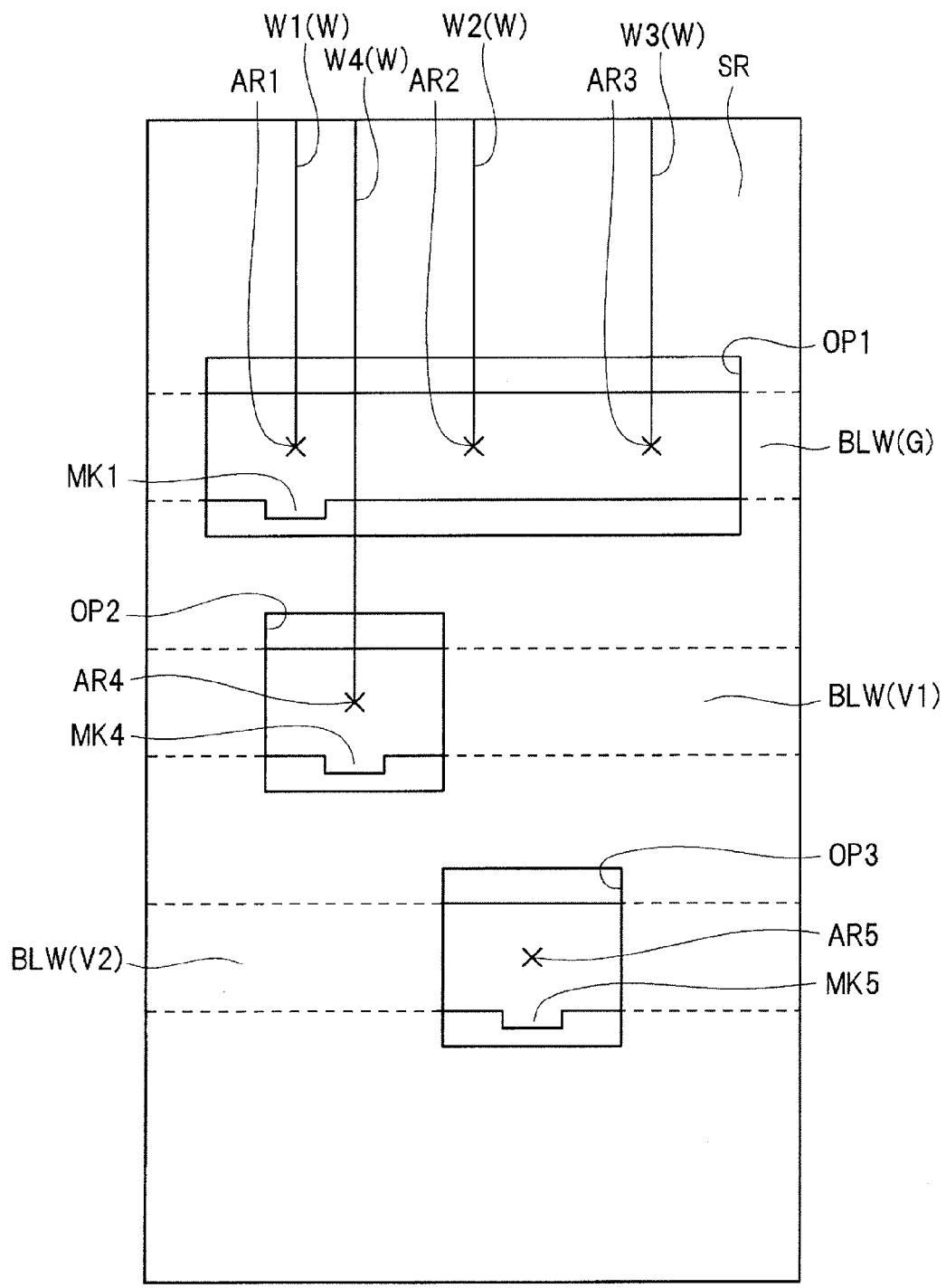
FIG. 62 is a view showing the wire bonding step, which is subsequent to FIG. 61.

Next, in the target semiconductor device of FIG. 62, by detecting the mark MK5 formed in the belt-like wiring BLW(V2) based on camera recognition, fine adjustment is performed from the wire bonding area adjusted in the alignment step to specify the wire bonding area AR5 reflecting the finished state of the target semiconductor device. That is, based on the position of the mark MK5 detected based on camera recognition, the wire bonding area AR5 is specified. Here, the wire bonding area AR5 specified based on camera recognition is indicated by the solid-line cross mark.

Figure 63:
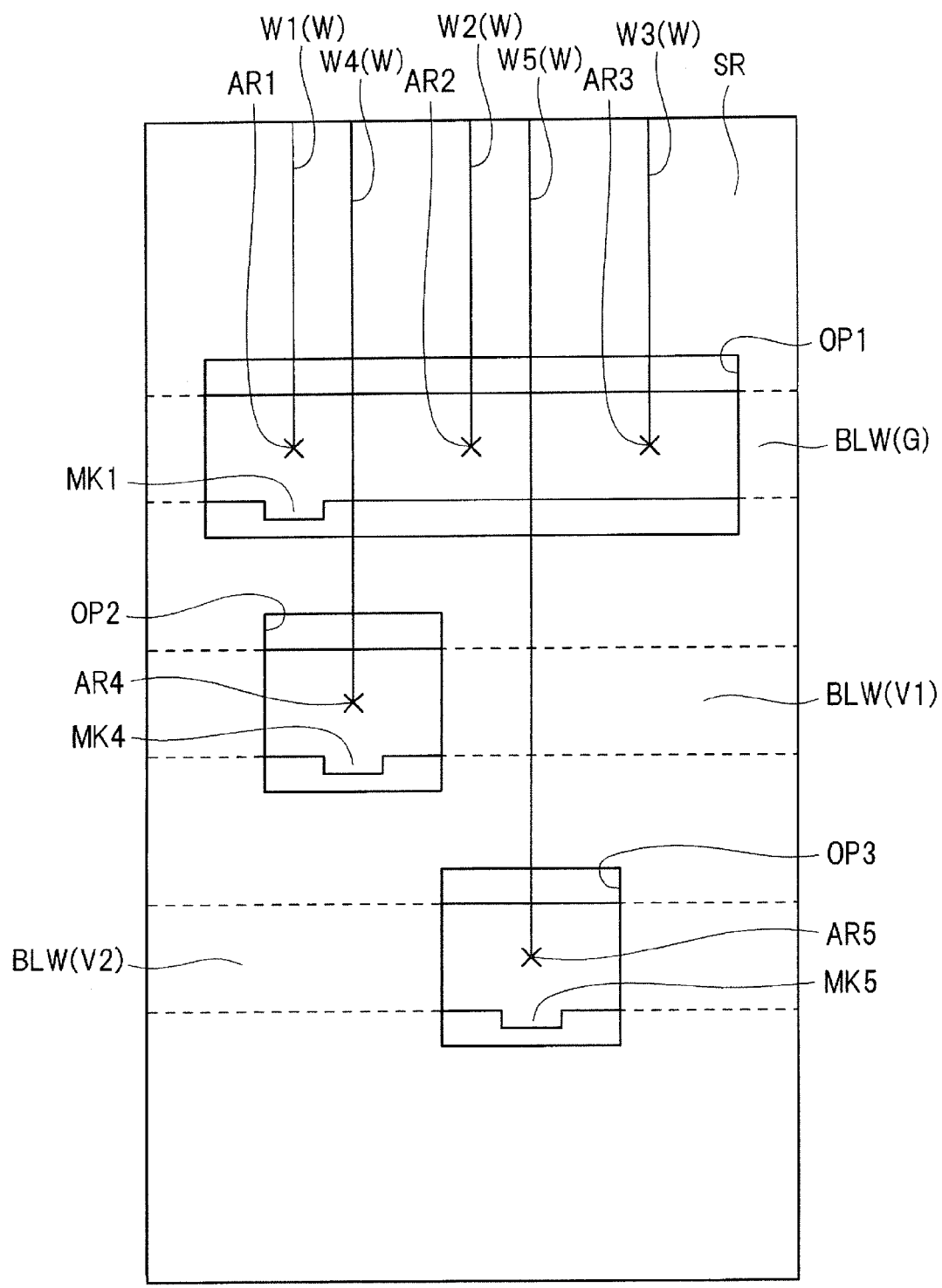
FIG. 63 is a view showing the wire bonding step, which is subsequent to FIG. 62.

Then, as shown in FIG. 63, the fifth pad formed in the semiconductor chip not shown is electrically coupled to the wire bonding area AR5 in the belt-like wiring BLW(V2) exposed from the opening OP3 with the wire W5. In this manner, the wire bonding steps can be performed.

<Advantage of Wire Bonding Step 1>

As described above, the technical idea of Embodiment 2 can be implemented with Wire Bonding Steps 1 and 2. In particular, Wire Bonding Step 1 in Embodiment 2 has an advantage over Wire Bonding Step 2. A description will be given below of the advantage of Wire Bonding Step 1.

If attention will be focused on, e.g., Wire Bonding Step 2, Wire Bonding Step 2 is configured as follows. First, as shown in FIG. 57, the wire bonding areas of the belt-like wiring BLW(G) are specified based on camera recognition, and then wire bonding is performed on the belt-like wiring BLW(G). Then, the wire bonding areas of the belt-like wiring BLW(V1) are specified based on camera recognition, and wire bonding is performed on the belt-like wiring BLW(V1). Thereafter, the wire bonding areas of the belt-like wiring BLW(V2) are specified, and wire bonding is performed on the belt-like wiring BLW(V2).

In this case, for example, after wire bonding is performed on the belt-like wiring BLW(G), the specification of the wire bonding areas of the belt-like wiring BLW(V1) is performed based on camera recognition. However, at this time, defective formation of the opening OP2 or the like may be found. A this time, since wire bonding has been performed on the belt-like wiring BLW(G), the wire already in use will be wasted. In particular, since wires are mostly formed of costly gold, manufacturing cost may rise.

By contrast, in the wire bonding step 1, as shown in, e.g., FIG. 52, before wire bonding is performed, camera recognition is performed on each of the belt-like wiring BLW(G), the belt-like wiring BLW(V1), and the belt-like wiring BLW(V2) to specify the wire bonding areas. In this case, even when the semiconductor device is found to be defective at this stage, the situation is that wire bonding has not been performed yet. This allows the advantage of no waste wire to be obtained, and therefore it can be said that Wire Bonding Step 1 is more excellent than Wire Bonding Step 2 in terms of manufacturing cost.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, in each of the foregoing embodiments, the description has been given of the example in which the technical idea in the embodiments is applied to the step of visual alignment and the step of specifying the wire bonding area based on camera recognition. However, the technical idea in the embodiment is not limited thereto. It is also possible to provide a configuration in which, e.g., instead of the step of visual alignment, an alignment step based on camera recognition is performed.

What is claimed is:

1. A semiconductor device, comprising:
   a wiring board including a first surface, a first wiring formed over the first surface, and an insulating film formed over the first surface;
   a semiconductor chip mounted over the first surface of the wiring board; and
   a first wire electrically coupling a first pad of the semiconductor chip to the first wiring,
   wherein a part of the first wiring is exposed from a first opening of the insulating film,
   wherein, in plan view, the first opening of the insulating film has a plurality of sides,
   wherein, in plan view, a first side of the plurality of sides and a second side of the plurality of sides facing the first side are extended along a first direction,
   wherein, in plan view, a third side of the plurality of sides and a fourth side of the plurality of sides facing the third side are extended along a second direction intersecting with the first direction,
   wherein, in plan view, the part of the first wiring is extended from the first side of the first opening to the second side of the first opening along the second direction,
   wherein, in plan view, the part of the first wiring has a first area and a second area, wherein, the first area has a first part, and a second part being adjacent to the first part and also intersecting with the second side of the first opening in plan view, wherein, in plan view, the second area is protruded from the first part of the first area of the first wiring toward the third side of the first opening, wherein, in plan view, the part of the first wiring has a fifth side which is parallel to the fourth side of the first opening and extending from the first side of the first opening to the second side of the first opening, wherein, in plan view, the second part of the first area has a sixth side which is parallel to the third side of the first opening and extending from the second area of the part of the first wiring to the second side of the first opening, wherein, in plan view, the third side of the first opening and the sixth side of the second part are facing to each other, wherein, in plan view, the fourth side of the first opening and the fifth side of the part of first wiring are facing to each other, and wherein the first wire is coupled to the first part of the first area of the part of the first wiring.

2. The semiconductor device according to claim 1, wherein, in plan view, a size of the second area is smaller than a size of the first area.

3. The semiconductor device according to claim 1, wherein, in plan view, the first area is located closer to the semiconductor chip than the second area, and wherein, in plan view, the fourth side is located closer to the semiconductor chip than the third side.

4. The semiconductor device according to claim 1, wherein the semiconductor chip further includes a second pad, wherein the second pad of the semiconductor chip is electrically coupled to the first wiring via a second wire, and wherein the second wire is coupled to the second part of the first area.

5. The semiconductor device according to claim 4, wherein the semiconductor chip, the first wire and the second wire are sealed with a sealing body.

6. The semiconductor device according to claim 5, wherein the wiring board further includes a second wiring formed over the first surface, wherein the semiconductor chip includes a main surface on which the first pad, the second pad and a third pad are formed, wherein, in plan view, the main surface includes a seventh side, and a eighth side intersecting with the seventh side, wherein, in plan view, the first wiring is arranged next to the seventh side of the main surface of the semiconductor chip, wherein, in plan view, the second wiring is arranged next to the eighth side of the main surface of the semiconductor chip, wherein the third pad is electrically coupled to the second wiring via a third wire, wherein a part of the second wiring is exposed from a second opening of the insulating film, wherein, in plan view, the second opening has a plurality of sides, wherein, in plan view, a ninth side of the plurality of sides and a tenth side of the plurality of sides facing to the ninth side are extended along the second direction, wherein, in plan view, an eleventh side of the plurality of sides and a twelfth side of the plurality of sides facing to the eleventh side are extended along the first direction, wherein, in plan view, the part of the second wiring is extended from the ninth side of the second opening to the tenth side of the second opening along the first direction, wherein, in plan view, the part of the second wiring has a third area and a fourth area, wherein, in plan view, the third area has a third part, and a fourth part being adjacent to the third part and also intersecting with the tenth side of the second opening in plan view, wherein, in plan view, the fourth area is protruded from the third area of the second wiring toward the eleventh side of the second opening at the third part of the third area, wherein, in plan view, the part of the second wiring has a thirteenth side which is parallel to the twelfth side of the second opening and extending from the ninth side of the second opening to the tenth side of the second opening, wherein, in plan view, the fourth part of the third area has a fourteenth side which is parallel to the eleventh side of the second opening and extending from the fourth area to the tenth side, wherein, in plan view, the eleventh side of the second opening and the fourteenth side of the second wiring are facing to each other, wherein, in plan view, the twelfth side of the second opening and the thirteenth side of the second wiring are facing to each other, and wherein the third wire is coupled to the third part of the third area.

7. The semiconductor device according to claim 6, wherein the second wiring is electrically coupled to the first wiring.

8. The semiconductor device according to claim 1, wherein the second part of the first area is an area to which a second wire is to be coupled.

9. The semiconductor device according to claim 6, wherein the fourth part of the third area is an area to which a fourth wire is to be coupled.

10. A semiconductor device, comprising:
a wiring board including a first surface, a first wiring formed over the first surface, and an insulating film formed over the first surface;
a semiconductor chip mounted over the first surface of the wiring board; and
a first wire electrically coupling a first pad of the semiconductor chip to the first wiring,
wherein a part of the first wiring is exposed from a first opening of the insulating film,
wherein, in plan view, the first opening of the insulating film has a plurality of sides,
wherein, in plan view, a first side of the plurality of sides and a second side of the plurality of sides facing to the first side are extended along a first direction,
wherein, in plan view, a third side of the plurality of sides and a fourth side of the plurality of sides facing to the third side extended along a second direction intersecting with the first direction,
wherein, in plan view, the part of the first wiring is extended from the first side of the first opening to the second side of the first opening along the second direction, wherein, in plan view, the part of the first wiring has a first area and a second area, wherein, the first area has a first part and a second part being adjacent to the first part and also interesting with the second side of the first opening in plan view, wherein, in plan view, the first area has a fifth side located between the third side of the first opening and the fourth side of the first opening, and a sixth side opposite to the fifth side and also located between the fifth side of the first wiring and the third side of the first opening, wherein, in plan view, the fifth side and the sixth side are extended along the second direction, wherein, in plan view, the second area is protruded from the sixth side of the first area toward the third side of the first opening at the first part of the part of the first wiring, but not protruded from the sixth side of the first area toward the third side of the first opening at the second part of the part of the first wiring and also not protruded from the fifth side of the first area toward the fourth side of the first opening, and wherein the first wire is coupled to the first part of the first area.

11. The semiconductor device according to claim 10, wherein, in plan view, a size of the second area is smaller than a size of the first area.

12. The semiconductor device according to claim 10,
wherein, in plan view, the first area is located closer to the semiconductor chip than the second area, and
wherein, in plan view, the fourth side is located closer to the semiconductor chip than the third side.

13. The semiconductor device according to claim 10,
wherein the semiconductor chip further includes a second pad,
wherein the second pad of the semiconductor chip is electrically coupled to the first wiring via a second wire, and
wherein the second wire is coupled to the second part of the first area.

14. The semiconductor device according to claim 13, wherein the semiconductor chip, the first wire and the second wire are sealed with a sealing body.

15. The semiconductor device according to claim 14,
wherein the wiring board further includes a second wiring formed over the first surface,
wherein the semiconductor chip includes a main surface on which the first pad, the second pad and a third pad are formed,
wherein, in plan view, the main surface includes a seventh side, and a eighth side intersecting with the seventh side,
wherein, in plan view, the first wiring is arranged next to the seventh side of the main surface of the semiconductor chip, wherein, in plan view, the second wiring is arranged next to the eighth side of the main surface of the semiconductor chip, wherein the third pad is electrically coupled to the second wiring via a third wire, wherein a part of the second wiring is exposed from a second opening of the insulating film, wherein, in plan view, the second opening has a plurality of sides, wherein, in plan view, a ninth side of the plurality of sides and a tenth side of the plurality of sides facing to the ninth side are extended along the second direction, wherein, in plan view, an eleventh side of the plurality of sides and a twelfth side of the plurality of sides facing to the eleventh side are extended along the first direction, wherein, in plan view, the part of the second wiring is extended from the ninth side to the tenth side along the first direction, wherein, in plan view, the part of the second wiring has a third area and fourth area, wherein, the third area has a third part, and a fourth part being adjacent to the third part and also intersecting with the tenth side in plan view, wherein, in plan view, the third area has a thirteenth side located between the eleventh side of the second opening and twelfth side of the second opening, and a fourteenth side opposite to the thirteenth side and also located between the thirteenth side of the second wiring and the eleventh side of the second opening, wherein, in plan view, the thirteenth side and the fourteenth side are extended along the first direction, wherein, in plan view, the fourth area is protruded from the fourteenth side of the third area toward the eleventh side of the second opening at the third part of the second wiring, but not protruded from the fourteenth side of the third area toward the eleventh side of the second opening at the fourth part of the second wiring and also not protruded from the thirteenth side of the third area toward the twelfth side of the second opening, and wherein the third wire is coupled to the third part of the third area.

16. The semiconductor device according to claim 15, wherein the second wiring is electrically coupled to the first wiring.

17. The semiconductor device according to claim 10, wherein the second part of the first area is an area to which a second wire is to be coupled.

18. The semiconductor device according to claim 15, wherein the fourth part of the third area is an area to which a fourth wire is to be coupled.

* * * * *